(12) United States Patent
Rothberg et al.

(10) Patent No.: US 9,817,093 B2
(45) Date of Patent: Nov. 14, 2017

(54) LOW FIELD MAGNETIC RESONANCE IMAGING METHODS AND APPARATUS

(71) Applicant: Hyperfine Research, Inc., Guilford, CT (US)

(72) Inventors: Jonathan M. Rothberg, Guilford, CT (US); Matthew Scot Rosen, Somerville, MA (US); Gregory L. Charvat, Guilford, CT (US); William J. Mileski, Ledyard, CT (US); Todd Rearick, Cheshire, CT (US); Michael Stephen Poole, Guilford, CT (US); Keith G. Fife, Palo Alto, CA (US)

(73) Assignee: Hyperfine Research, Inc., Guilford, CT (US)

( * ) Notice: Subject to any disclaimer, the term of this patent is extended or adjusted under 35 U.S.C. 154(b) by 0 days.

(21) Appl. No.: 14/845,652

(22) Filed: Sep. 4, 2015

(65) Prior Publication Data

US 2016/0069968 A1     Mar. 10, 2016

Related U.S. Application Data

(60) Provisional application No. 62/174,666, filed on Jun. 12, 2015, provisional application No. 62/111,320, (Continued)

(51) Int. Cl.
*G01V 3/00* (2006.01)
*G01R 33/38* (2006.01)
(Continued)

(52) U.S. Cl.
CPC ......... *G01R 33/3804* (2013.01); *G01R 33/36* (2013.01); *G01R 33/3614* (2013.01);
(Continued)

(58) Field of Classification Search
CPC ....................................................... G01R 33/38
(Continued)

(56) References Cited

U.S. PATENT DOCUMENTS 3,622,869 A * 11/1971 Golay ..................... H01F 7/20
324/320
3,735,306 A    5/1973 Kabler et al.
(Continued)

FOREIGN PATENT DOCUMENTS

| WO | WO 2009/042131 A1 | 4/2009 |
| WO | WO 2013/016639 A1 | 1/2013 |
| WO | WO 2014/013257 A1 | 1/2014 |

OTHER PUBLICATIONS

International Search Report and Written Opinion dated Dec. 10, 2015 in connection with International Application No. PCT/US2015/048470.
(Continued)

*Primary Examiner* — Louis Arana
(74) *Attorney, Agent, or Firm* — Wolf, Greenfield & Sacks, P.C.

(57) ABSTRACT

According to some aspects, a laminate panel is provided. The laminate panel comprises at least one laminate layer including at least one non-conductive layer and at least one conductive layer patterned to form at least a portion of a $B_0$ coil configured to contribute to a $B_0$ field suitable for use in low-field magnetic resonance imaging (MRI).

40 Claims, 34 Drawing Sheets

Related U.S. Application Data filed on Feb. 3, 2015, provisional application No. 62/110,049, filed on Jan. 30, 2015, provisional application No. 62/046,814, filed on Sep. 5, 2014.

(51) Int. Cl.

| | | |
|---|---|---|
| *G01R 33/36* | (2006.01) | |
| *G01R 33/385* | (2006.01) | |
| *G01R 33/44* | (2006.01) | |
| *G01R 33/58* | (2006.01) | |
| *G01R 33/48* | (2006.01) | |
| *H01F 7/02* | (2006.01) | |
| *H01F 7/06* | (2006.01) | |
| *G01R 33/381* | (2006.01) | |
| *G01R 33/383* | (2006.01) | |
| *G01R 33/3875* | (2006.01) | |
| *G01R 33/54* | (2006.01) | |
| *G01R 33/56* | (2006.01) | |
| *G01R 33/34* | (2006.01) | |
| *G01R 33/422* | (2006.01) | |

(52) U.S. Cl.
CPC ........... *G01R 33/38* (2013.01); *G01R 33/381* (2013.01); *G01R 33/3802* (2013.01); *G01R 33/383* (2013.01); *G01R 33/385* (2013.01); *G01R 33/3806* (2013.01); *G01R 33/3852* (2013.01); *G01R 33/3854* (2013.01); *G01R 33/3856* (2013.01); *G01R 33/3858* (2013.01); *G01R 33/3875* (2013.01); *G01R 33/445* (2013.01); *G01R 33/48* (2013.01); *G01R 33/543* (2013.01); *G01R 33/546* (2013.01); *G01R 33/56* (2013.01); *G01R 33/5608* (2013.01); *G01R 33/58* (2013.01); *H01F 7/02* (2013.01); *H01F 7/06* (2013.01); *G01R 33/34007* (2013.01); *G01R 33/422* (2013.01)

(58) Field of Classification Search
USPC ......................................... 324/319, 320, 322
See application file for complete search history.

(56) References Cited

U.S. PATENT DOCUMENTS

| | | |
|---|---|---|
| 4,621,299 A | 11/1986 | Hill |
| 4,638,252 A | 1/1987 | Bradshaw |
| 4,675,609 A | 6/1987 | Danby et al. |
| 4,770,182 A | 9/1988 | Damadian et al. |
| 5,252,924 A | 10/1993 | Sakurai et al. |
| 5,490,509 A | 2/1996 | Carlson et al. |
| 6,157,278 A | 12/2000 | Katznelson et al. |
| 6,235,409 B1 | 5/2001 | Serafin et al. |
| 6,267,830 B1 | 7/2001 | Groll |
| 6,294,972 B1 | 9/2001 | Jesmanowicz et al. |
| 8,451,004 B2 | 5/2013 | Walsh |
| 2002/0050895 A1 | 5/2002 | Zuk et al. |
| 2007/0216413 A1 | 9/2007 | Legall et al. |
| 2007/0244385 A1 | 10/2007 | Satragno et al. |
| 2008/0084209 A1 | 4/2008 | Seeber et al. |
| 2009/0138058 A1 | 5/2009 | Cooke et al. |
| 2010/0160817 A1 | 6/2010 | Parihar et al. |
| 2010/0219833 A1 | 9/2010 | McGinley et al. |
| 2010/0302701 A1 | 12/2010 | Olliges |
| 2011/0007445 A1 | 1/2011 | Blakes |
| 2011/0025332 A1* | 2/2011 | Abele ................ G01R 33/3804 324/318 |
| 2011/0037467 A1 | 2/2011 | Tsuda |
| 2012/0032767 A1 | 2/2012 | Iwasaki et al. |
| 2012/0092009 A1 | 4/2012 | Zhang et al. |
| 2012/0268117 A1 | 10/2012 | Romano et al. |
| 2013/0116544 A1 | 5/2013 | Rey et al. |
| 2013/0214612 A1 | 8/2013 | Bae |
| 2014/0155732 A1 | 6/2014 | Patz et al. |
| 2016/0069972 A1 | 3/2016 | Poole et al. |
| 2016/0069975 A1 | 3/2016 | Rothberg et al. |
| 2016/0169992 A1 | 6/2016 | Rothberg et al. |
| 2016/0223631 A1 | 8/2016 | Poole et al. |
| 2016/0231399 A1 | 8/2016 | Rothberg et al. |
| 2016/0231402 A1 | 8/2016 | Rothberg et al. |
| 2016/0231403 A1 | 8/2016 | Rothberg et al. |
| 2016/0231404 A1 | 8/2016 | Rothberg et al. |

OTHER PUBLICATIONS

International Search Report and Written Opinion for International Application No. PCT/US2015/048484 dated Dec. 4, 2015.
International Search Report and Written Opinion for International Application No. PCT/US2015/048515 dated Dec. 8, 2015.
U.S. Appl. No. 14/846,158, filed Sep. 4, 2015, Rothberg et al.
U.S. Appl. No. 15/132,617, filed Apr. 19, 2016, Rothberg et al.
U.S. Appl. No. 15/132,671, filed Apr. 19, 2016, Rothberg et al.
U.S. Appl. No. 15/132,703, filed Apr. 19, 2016, Rothberg et al.
U.S. Appl. No. 15/132,742, filed Apr. 19, 2016, Rothberg et al.
U.S. Appl. No. 14/846,255, filed Sep. 4, 2015, Poole et al.
U.S. Appl. No. 15/091,971, filed Apr. 6, 2016, Poole et al.
PCT/US2015/048484, dated Dec. 4, 2015, International Search Report and Written Opinion.
PCT/US2015/048515, dated Dec. 8, 2015, International Search Report and Written Opinion.

* cited by examiner

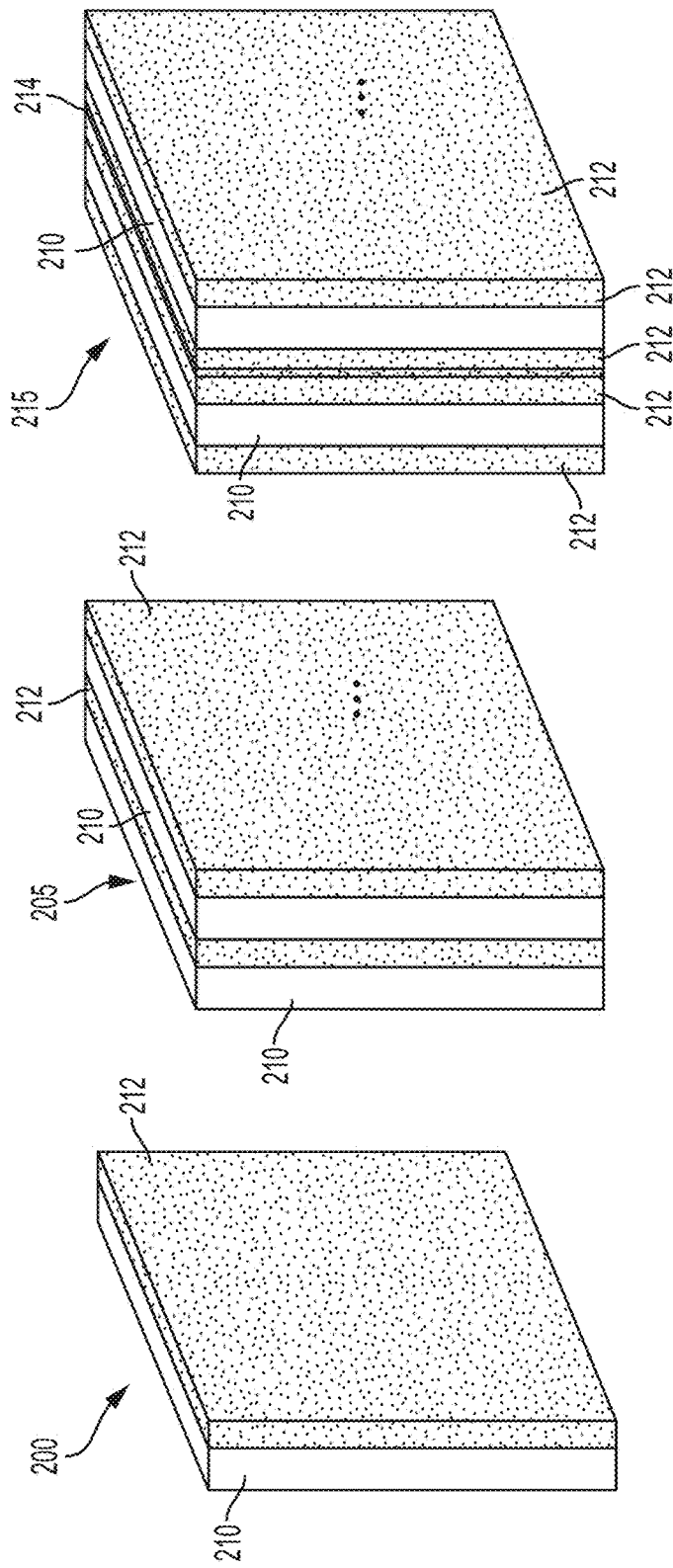

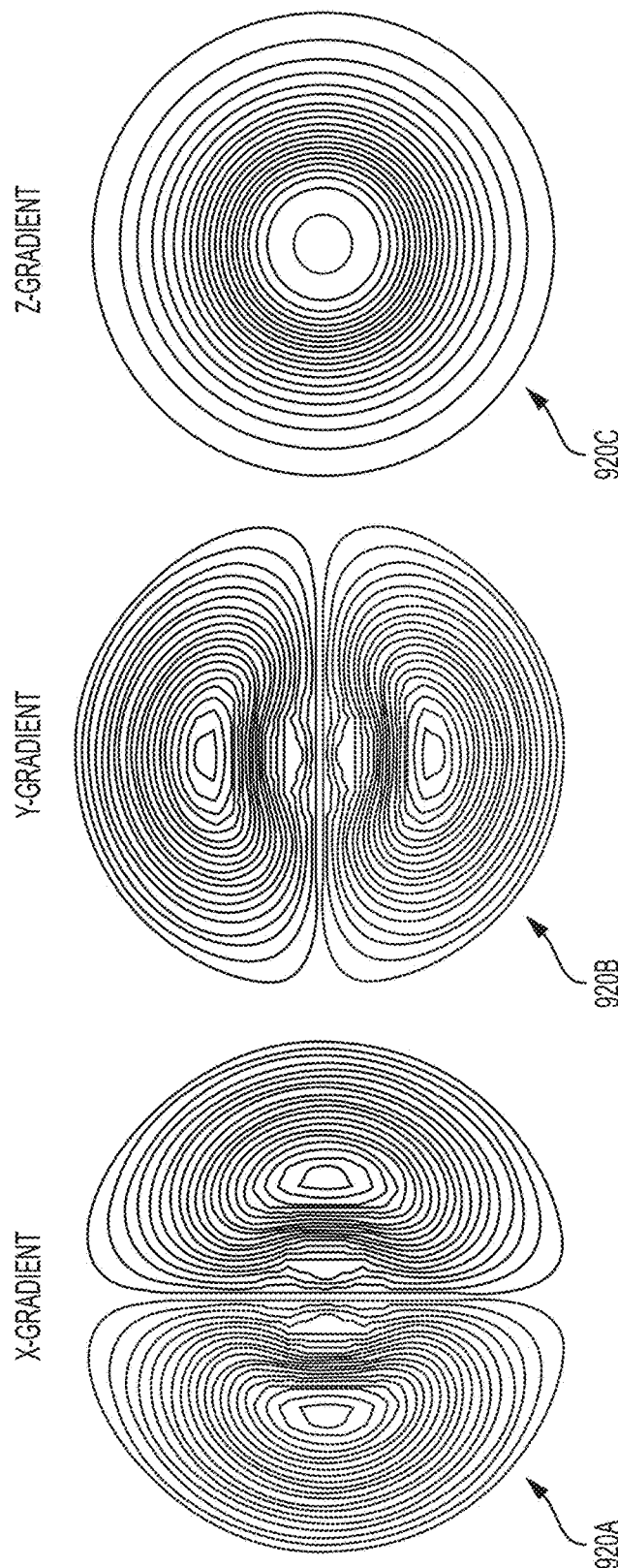

LOW FIELD MAGNETIC RESONANCE IMAGING METHODS AND APPARATUS

RELATED APPLICATIONS

This application claims priority under 35 U.S.C. §119(e) to U.S. Provisional Patent Application Ser. No. 62/046,814, filed Sep. 5, 2014 and entitled "Low Field Magnetic Resonance Imaging Methods and Apparatus," U.S. Provisional Patent Application Ser. No. 62/111,320, filed Feb. 3, 2015 and entitled "Thermal Management Methods and Apparatus," U.S. Provisional Patent Application Ser. No. 62/110,049, filed Jan. 30, 2015 and entitled "Noise Suppression Methods and Apparatus," and U.S. Provisional Patent Application Ser. No. 62/174,666, filed Jun. 12, 2015 and entitled "Automatic Configuration of a Low Field Magnetic Resonance Imaging System," each of which is herein incorporated by reference in its entirety.

BACKGROUND

Magnetic resonance imaging (MRI) provides an important imaging modality for numerous applications and is widely utilized in clinical and research settings to produce images of the inside of the human body. As a generality, MRI is based on detecting magnetic resonance (MR) signals, which are electromagnetic waves emitted by atoms in response to state changes resulting from applied electromagnetic fields. For example, nuclear magnetic resonance (NMR) techniques involve detecting MR signals emitted from the nuclei of excited atoms upon the re-alignment or relaxation of the nuclear spin of atoms in an object being imaged (e.g., atoms in the tissue of the human body). Detected MR signals may be processed to produce images, which in the context of medical applications, allows for the investigation of internal structures and/or biological processes within the body for diagnostic, therapeutic and/or research purposes.

MRI provides an attractive imaging modality for biological imaging due to the ability to produce non-invasive images having relatively high resolution and contrast without the safety concerns of other modalities (e.g., without needing to expose the subject to ionizing radiation, e.g., x-rays, or introducing radioactive material to the body). Additionally, MRI is particularly well suited to provide soft tissue contrast, which can be exploited to image subject matter that other imaging modalities are incapable of satisfactorily imaging. Moreover, MR techniques are capable of capturing information about structures and/or biological processes that other modalities are incapable of acquiring. However, there are a number of drawbacks to conventional MRI techniques that, for a given imaging application, may include the relatively high cost of the equipment, limited availability (e.g., difficulty and expense in gaining access to clinical MRI scanners), the length of the image acquisition process, etc.

The trend in clinical MRI has been to increase the field strength of MRI scanners to improve one or more of scan time, image resolution, and image contrast, which in turn drives up costs of MRI imaging. The vast majority of installed MRI scanners operate using at least at 1.5 or 3 tesla (T), which refers to the field strength of the main magnetic field B0 of the scanner. A rough cost estimate for a clinical MRI scanner is on the order of one million dollars per tesla, which does not even factor in the substantial operation, service, and maintenance costs involved in operating such MRI scanners.

Additionally, conventional high-field MRI systems typically require large superconducting magnets and associated electronics to generate a strong uniform static magnetic field (B0) in which a subject (e.g., a patient) is imaged. Superconducting magnets further require cryogenic equipment to keep the conductors in a superconducting state. The size of such systems is considerable with a typical MRI installment including multiple rooms for the magnetic components, electronics, thermal management system, and control console areas, including a specially shielded room to isolate the magnetic components of the MRI system. The size and expense of MRI systems generally limits their usage to facilities, such as hospitals and academic research centers, which have sufficient space and resources to purchase and maintain them. The high cost and substantial space requirements of high-field MRI systems results in limited availability of MRI scanners. As such, there are frequently clinical situations in which an MRI scan would be beneficial, but is impractical or impossible due to the above-described limitations and as discussed in further detail below.

SUMMARY

The inventors have appreciated that laminate techniques may be utilized to produce a laminate panel having one or more magnetic components, or portions thereof, fabricated therein. Such a laminate panel can be used alone, in combination with one or more additional laminate panels and/or in combination with other magnetic components to facilitate providing magnetic field(s) for use in magnetic resonance imaging (MRI). Some embodiments include a laminate panel comprising at least one laminate layer including at least one non-conductive layer and at least one conductive layer patterned to form at least a portion of a $B_0$ coil configured to contribute to a $B_0$ field suitable for use in low-field MRI.

Some embodiments include a hybrid magnetic component comprising at least one $B_0$ coil formed by a wound conductor and configured to contribute to a $B_0$ field suitable for use in low-field magnetic resonance imaging, and at least one laminate panel comprising a plurality of laminate layers having patterned thereon at least one $B_0$ coil, or a portion thereof, and/or at least one gradient coil or a portion thereof.

Some embodiments include a method of manufacturing a laminate panel of a low-field magnetic resonance imaging system, the method comprising providing at least one non-conductive layer, providing at least one conductive layer, attaching the at least one non-conductive layer and the at least one conductive layer to form at least one laminate layer, and patterning at least one conductive layer to form at least a portion of a $B_0$ coil configured to contribute to a $B_0$ field suitable for use in low-field magnetic resonance imaging (MRI).

Some embodiments include a low-field magnetic resonance imaging (MRI) system, comprising a first laminate panel having at least one first magnetic component formed thereon, a second laminate panel having at least one second magnetic component formed thereon, and at least one power source configured to provide power to operate the at least one first magnetic component and the at least one second magnetic component, wherein the at least one first magnetic component and the at least one second magnetic component, when operated, generate at least one magnetic field suitable for low-field MRI.

BRIEF DESCRIPTION OF THE DRAWINGS

Various aspects and embodiments of the disclosed technology will be described with reference to the following figures. It should be appreciated that the figures are not necessarily drawn to scale.

FIGS. 2A-2C are schematic illustrations of single-layer and a multi-layer laminate techniques for producing a laminate panel, in accordance with some embodiments;

FIG. 9A-9C illustrate exemplary configurations for an x-gradient, a y-gradient coil and a z-gradient coil, respectively, in accordance with some embodiments;

DETAILED DESCRIPTION

Figure 1:
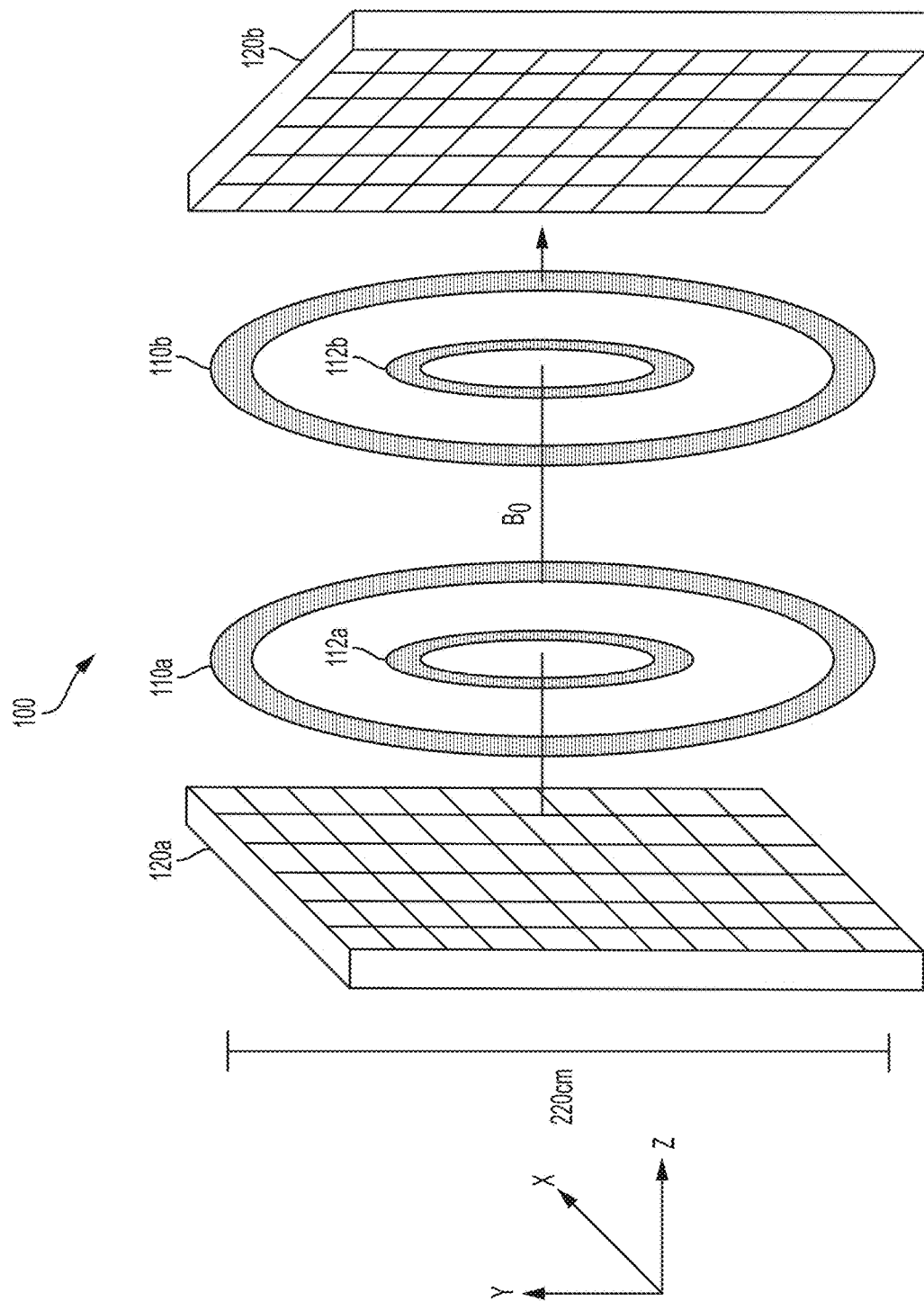
FIG. 1 is a schematic illustration of a low-field MRI system using a bi-planar magnet configuration.

The MRI scanner market is overwhelmingly dominated by high-field systems, and is exclusively so for medical or clinical MRI applications. As discussed above, the general trend in medical imaging has been to produce MRI scanners with increasingly greater field strengths, with the vast majority of clinical MRI scanners operating at 1.5 T or 3 T, with higher field strengths of 7 T and 9 T used in research settings. As used herein, "high-field" refers generally to MRI systems presently in use in a clinical setting and, more particularly, to MRI systems operating with a main magnetic field (i.e., a $B_0$ field) at or above 1.5 T, though clinical systems operating between 0.5 T and 1.5 T are generally also considered "high-field." By contrast, "low-field" refers generally to MRI systems operating with a $B_0$ field of less than or equal to approximately 0.2 T.

The appeal of high-field MRI systems include improved resolution and/or reduced scan times compared to lower field systems, motivating the push for higher and higher field strengths for clinical and medical MRI applications. However, as discussed above, increasing the field strength of MRI systems yields increasingly more expensive and complex MRI scanners, thus limiting availability and preventing their use as a general purpose and/or generally available imaging solution. As discussed above, contributing factors to the high cost of high-field MRI are expensive superconducting wires and the cryogenic cooling systems needed to keep the wires in a superconducting state. For example, the B0 magnet for high field MRI systems frequently employ superconducting wire that is not only itself expensive, but requires expensive and complicated cryogenic equipment to maintain the superconducting state.

Low-field MR has been explored in limited contexts for non-imaging research purposes and narrow and specific contrast-enhanced imaging applications, but is conventionally regarded as being unsuitable for producing clinically-useful images. For example, the resolution, contrast, and/or image acquisition time is generally not regarded as being suitable for clinical purposes such as, but not limited to, tissue differentiation, blood flow or perfusion imaging, diffusion-weighted (DW) or diffusion tensor (DT) imaging, functional MRI (fMRI), etc.

The inventors have developed techniques for producing improved quality, portable and/or lower-cost low-field MRI systems that can improve the wide-scale deployability of MRI technology in a variety of environments beyond the large MRI installments at hospitals and research facilities. Some aspects of the inventors' contribution derive from their recognition that a significant factor contributing to the cost and complexity of both high-field and low-field MRI is the magnetics components needed to produce MR signals that are useable for imaging applications.

Briefly, MRI involves placing an object (e.g., all or a portion of a patient) to be imaged in a static, homogenous magnetic field $B_0$ to align atomic spins of atoms in the direction of the $B_0$ field. For high-field MRI systems, superconducting magnets made from coils of superconducting wire are generally required to achieve the homogeneity of $B_0$ at field strengths employed in high-field MRI. Not only are the superconducting magnets themselves costly, but they generally require cryogenic cooling during operation, increasing the cost and complexity of high-field MRI scanners. In addition to the $B_0$ magnetic component, gradient coils are provided to spatially encode MR signals from the object, and transmit and receive coils are provided to generate a magnetic field $B_1$ at a frequency related to the field strength of the magnetic field $B_0$ to cause atomic spins to change orientation and to detect MR signals emitted from the object upon realignment of the atomic spins with the magnetic field $B_0$, respectively. At high-field strengths and the associated high frequencies, these magnetic components are also relatively complex and expensive.

The inventor(s) have appreciated that low-field MRI systems do not require expensive superconducting magnets and/or the associated cryogenic cooling systems, and the reduced field strengths may facilitate reduction in the complexity and/or expense of other magnetic components in the system. To this end, some embodiments are directed to low-field MRI systems having substantially less complex and expensive magnetic components, as discussed in further detail below. However, producing such magnetic components and manufacturing a system suitable for performing low-field MRI using conventional techniques for doing so, while significantly less complex and expensive than high-field MRI, still may present technical challenges that increase complexity and expense. For example, constructing $B_0$ magnets using conventional techniques typically requires winding significant amounts of high-grade copper wire about a frame according to precise design specifications to produce coils capable of generating a magnetic field of satisfactory homogeneity at a desired field strength, a process which is relatively time consuming, expensive, susceptible to production deviation, and that generally does not scale well. Further issues arise with alignment of the $B_0$ magnets and alignment with other magnetic components, as discussed in further detail below.

The inventor(s) have recognized that laminate techniques, similar in some respects to those utilized in producing printed circuit boards, may be employed to fabricate one or more (or a portion of one or more) magnetic components of a low-field MRI scanner. According to some embodiments, one or more magnetic components (or portion thereof) for use in low-field MRI is provided as a laminate panel comprising one or more non-conductive layers and one or more conductive layers patterned to form the one or more magnetic components or portion thereof. The term "laminate" refers herein to a plurality of superposed layers, typically involving at least one or more non-conductive layers and one or more conductive layers. Unless otherwise specified, the term "laminate" is generic to the types of materials used and indicates the affixing of multiple layers together, but does not specify any particular type of material or arrangement of materials used to produce the layers. The term "panel" generally describes a structure resulting from a laminate of multiple laminate layers and can be of any shape or size, and can include any number of layers.

According to some embodiments, one or more $B_0$ coils, one or more gradient coils, one or more transmit/receive coils, and/or one or more shim coils, or any desired portions or combinations thereof may be fabricated on a single laminate panel or distributed between multiple laminate panels, as discussed in further detail below. Utilizing laminate techniques may facilitate a cost-effective, scalable, flexible, repeatable and/or customizable approach to producing low-field MRI magnetics. Furthermore, the inventors have appreciated that the precision achievable using laminate techniques allows for the design and manufacture of geometries, configurations and arrangements that are not possible using conventional techniques for manufacturing or producing the magnetics of an MRI system.

Following below are more detailed descriptions of various concepts related to, and embodiments of, methods and apparatus for low field magnetic resonance applications including low-field MRI. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

As discussed above, the inventor(s) have developed low-field MRI systems that address one or more of the problems associated with high-field MRI systems. For example, exemplary low-field MRI systems may be implemented without using superconducting magnets and consequently without the associated cryogenic cooling apparatus, thereby significantly reducing the cost, complexity and size of the resulting MRI system. To produce a $B_0$ field having a magnetic field strength and magnetic field homogeneity suitable for high-field MRI, a solenoid coil formed of superconducting material is used wherein the $B_0$ field generated is in the direction of the axis through the center of the solenoid. As a result, imaging a patient requires placing the patient inside the solenoid coil. While the solenoid coil is particularly well-suited for generating a homogenous field at high field strengths, this geometry not only increases the size of equipment, but requires that a patient be inserted into a cylindrical bore to be imaged. Thus, this geometry may be unsuitable for patients with claustrophobia and may be incapable of accommodating large patients. Thus, the solenoid coil geometry generally required to produce a suitable $B_0$ magnet for high-field MRI has further limitations that prevent high-field MRI from being a practical and available general purpose imager.

The inventors have appreciated that characteristics of low-field MRI permit alternate coil geometries not suitable for high-field MRI to be used to generate a $B_0$ field suitable for low-field MRI. FIG. 1 schematically illustrates a portion of a low-field MRI system 100 including a bi-planar magnet geometry that may be utilized to generate a $B_0$ field suitable for low-field MRI imaging, in accordance with some embodiments. The bi-planar magnet comprises two outer coils 110a and 110b and two inner coils 112a and 112b. When appropriate current is applied to the coils, a magnetic field is generated in the direction indicated by the arrow to produce a $B_0$ field having a field of view between the coils that, when designed and constructed appropriately, may be suitable for low-field MRI.

It should be appreciated that the bi-planar geometry illustrated in FIG. 1 is generally unsuitable for high-field MRI due to the difficulty in obtaining a $B_0$ field of sufficient homogeneity for high-field MRI. The bi-planar $B_0$ magnet illustrated in FIG. 1 provides a generally open geometry, facilitating its use with patients who suffer from claustrophobia that may refuse to be imaged with conventional high-field solenoid coil geometries. Furthermore, the bi-planar design may facilitate its use with larger patients as a result of its open design and, in some instances, a generally larger field of view possible at low-field strengths and homogeneities.

However, while the bi-planar $B_0$ magnet illustrated in FIG. 1 provides a much less complex and lower cost $B_0$ magnet then what is possible for high-field MRI, production of coils 110a, 110b, 112a and 112b is typically a relatively time-consuming and sensitive process that generally involves the repeated winding of copper wire around a support frame to produce a number of turns in accordance with a specific design for a given set of coils. To produce a suitable $B_0$ field for low-field MRI, a generally high-quality conductor (e.g., thick copper wire with high grade insulation) is often used to support the relatively large current required to generate the desired $B_0$ field. Care must be taken to ensure that each turn of the conductor is wound precisely and properly aligned to generate a $B_0$ field having a desired homogeneity. As indicated in FIG. 1, an exemplary diameter of the outer coils in a bi-planar magnet may be 220 cm with a typical number of turns being on the order of 50 turns or more, thereby requiring a substantial amount of conductor material (e.g., more than a kilometer of generally high grade wire for each side of the bi-planar magnet) that must be precisely wound in alignment over numerous turns.

Additionally, each coil in a pair (e.g., coils 110a, 110b and coils 112a, 112b) should be manufactured to be substantially identical to its corresponding coil in the pair to avoid degrading the homogeneity of the resulting $B_0$ field once the coils are energized. Moreover, the coils on each side (e.g., coils 110a, 112a and coils 110b, 112b) of the bi-planar magnet must also be carefully positioned and aligned to reduce inhomogeneity in the resulting $B_0$ field. Accordingly, manufacturing and installing such coils to produce a sufficiently homogeneous $B_0$ field for low-field MRI using conventional construction techniques tends to be relatively costly, time intensive and prone to error.

As discussed above, the inventor(s) have recognized that laminate techniques may be utilized to fabricate a $B_0$ magnet or portion thereof for use in low-field MRI in place of (or in combination with) the conventional manufacturing techniques described above. In particular, the inventors have appreciated and understood that the low-field characteristics of the $B_0$ magnetic component allows for fabrication of the $B_0$ magnetic component, or a portion thereof, using techniques previously unavailable for producing a $B_0$ magnet for MRI. For example, among other reasons, the inventors have appreciated that the lower power requirements and/or reduced thermal output of low-field MRI allows for production of magnetic components using laminate techniques, which were not available in the high-field context.

According to some embodiments, a laminate panel comprises at least one conductive layer patterned to form one or more $B_0$ coils, or a portion of one or more $B_0$ coils, capable of producing or contributing to a $B_0$ magnetic field suitable for low-field MRI. As used herein, a $B_0$ coil refers herein to any coil that provides or contributes to a $B_0$ magnetic field and may include one or more main $B_0$ coils, or portions thereof, one or more shim coils, or portions thereof, one or more correction coils, or portions thereof, etc.

A laminate panel may comprise a plurality of concentric coils to form one "side" of the pair of bi-planar $B_0$ coils illustrated FIG. 1. A second laminate panel may be similarly constructed to incorporate $B_0$ coils for the other "side" of the field of view in the bi-planar design. In this manner, magnetic components used to generate a $B_0$ field for a low-field MRI system may be constructed using laminate panel techniques.

As discussed in further detail below, using laminate techniques to fabricate one or more $B_0$ coils (or a portion thereof) can address one or more of the drawbacks discussed above in manufacturing a $B_0$ magnet for use in low field MRI. For example, $B_0$ field homogeneity is quite sensitive to relatively small changes in the parameters of the respective coils. In particular, small variations in the coil windings, position and alignment of the various coils, etc., result in field inhomogeneity of the $B_0$ field produced. As a result, it may therefore be difficult to produce a $B_0$ magnet capable of generating a $B_0$ field with field homogeneity suitable for performing low field MRI in a generally repeatable and low cost process. In particular, reproducing such a $B_0$ magnet may be difficult as conventional manufacturing techniques do not lend themselves to repeatable, reliable production and therefore do not scale well, limiting the ability to produce numerous satisfactory $B_0$ magnets in a time and/or cost efficient manner. Laminate techniques are capable of producing magnetic components much more precisely and accurately than what is feasible using conventional techniques, facilitating a flexible, repeatable, and highly scalable technique for producing magnetic components, as discussed in further detail below.

FIG. 1 also schematically illustrates a pair of planar gradient coil sets 120a, 120b to generate magnetic fields to facilitate phase and frequency encoding for the portion of the low-field MRI system illustrated. As discussed above, MRI systems encode received MR signals by systematically varying the $B_0$ field in a known manner using gradient coils to encode the spatial location of received MR signals as a function of frequency or phase. For example, gradient coils may be configured to vary frequency or phase as a linear function of spatial location along a particular direction, although more complex spatial encoding profiles may also be provided by using nonlinear gradient coils. For example, a first gradient coil may be configured to selectively vary the $B_0$ field in a first (X) direction to perform frequency encoding in that direction, a second gradient coil may be configured to selectively vary the $B_0$ field in a second (Y) direction substantially orthogonal to the first direction to perform phase encoding, and a third gradient coil may be configured to selectively vary the $B_0$ field in a third (Z) direction substantially orthogonal to the first and second directions to enable slice selection for volumetric imaging applications.

Gradient coils are designed to operate with a specific $B_0$ magnetic component (e.g., one or more $B_0$ coils as shown in FIG. 1) and, to operate satisfactorily, typically require relatively precise manufacture and subsequent alignment with the $B_0$ magnetic component. The inventors have recognized that using laminate techniques to fabricate one or more gradient coils (or portions thereof) may facilitate a simpler more cost effective approach to manufacturing magnetics components of a low field MRI system.

According to some embodiments, a laminate panel comprises at least one conductive layer patterned to form one or more gradient coils, or a portion of one or more gradient coils, capable of producing or contributing to magnetic fields suitable for providing spatial encoding of detected MR signals when operated in a low-field MRI apparatus. For example, the laminate panel may comprise one or more conductive layers patterned to form one or more X-gradient coils (or portions thereof), one or more Y-gradient coils (or portions thereof) and/or one or more Z-gradient coils (or portions thereof). The laminate panel forming one or more gradient coils (or portions thereof) may be separate from a corresponding $B_0$ magnetic component, or may be formed in one or more layers of a same laminate panel. With respect to the latter, the one or more gradient coils may be formed by conductive layers shared with (but electrically isolated from) the one or more $B_0$ coils (or portions thereof) or may be formed in one or more conductive layers separate from the one or more $B_0$ coils (or portions thereof). Integration of one or more gradient coils (or portions thereof) with one or more $B_0$ coils (or portions thereof) in a laminate panel may facilitate a simpler more flexible approach to designing and manufacturing magnetic components for low-field MRI, further aspects of which are discussed below.

As discussed above, MRI systems stimulate and detect emitted MR signals using transmit and receive coils, respectively (often referred to as radio frequency (RF) coils). The configuration of the transmit/receive coils varies with implementation and may include a single coil for both transmitting and receiving, separate coils for transmitting and receiving, multiple coils for transmitting and/or receiving, or any combination to achieve single channel or parallel MRI systems. Thus, the transmit/receive magnetic component is often referred to as Tx/Rx or Tx/Rx coils to generically refer to the various configurations for the transmit and receive component of an MRI system.

The inventors have recognized that laminate techniques may also be used to fabricate one or more transmit/receive coils in a low field MRI system. According to some embodiments, a laminate panel comprises at least one conductive layer patterned to form one or more transmit and/or receive coils, or a portion of one or more transmit and/or receive coils, configured to stimulate an MR response by producing a $B_1$ excitation field (transmit) and/or receive an emitted MR signal (receive) when operated in conjunction with magnetic components configured to produce a $B_0$ field and/or corresponding gradient fields for spatially encoding received MR signals. Such a laminate panel may incorporate single transmit and/or receive coils (or portions thereof) or multiple transmit and/or receive coils (or portions thereof) for performing single channel or parallel MRI, respectively, and may be formed in a separate laminate panel or integrated in a laminate panel containing one or more $B_0$ coils (or portions thereof) and/or one or more gradient coils (or portions thereof), as discussed in further detail below.

A low field MRI system may further include additional magnetic components such as one or more shim coils arranged to generate magnetic fields in support of the system to, for example, increase the strength and/or homogeneity of the $B_0$ field, counteract deleterious field effects such as those created by operation of the gradient coils, loading effects of the object being imaged, or to otherwise support the magnetics of the low field MRI system. When a shim coil is operated to contribute to the $B_0$ field of an MRI system (e.g., to contribute to the field strength and/or to improve homogeneity), the shim coil functions as a $B_0$ coil of the system and should be understood as such. In some implementations, one or more shim coils may be operated independently of other $B_0$ coils of the system, as discussed in further detail below.

Furthermore, a low field MRI system may further include shielding component(s) arranged to suppress unwanted electromagnetic radiation in the environment and/or between components. The inventor(s) have recognized that laminate techniques may be utilized to fabricate such components, for example, one or more shim coils (or portions thereof) and/or one or more shielding components, either by forming such components in separate laminate panel(s) or integrating such components in a laminate panel containing any one or combination of other magnetic components (or portions thereof) of a low field MRI system, as discussed in further detail below.

As discussed above, laminate techniques for producing panels, plates, or "boards" containing one or more magnetic components of a low field MRI system may resemble, in principle, techniques conventionally used to fabricate printed circuit boards (PCBs) and certain limited printed electronics, though different in scale, power and thermal requirements, etc. Such laminate techniques generally involve forming non-conductive and conductive layers of material and patterning the conductive and/or non-conductive layer(s) (e.g., by selectively removing and/or adding material) to produce a desired conducting pattern or "circuit." Such techniques are conventionally used to produce single-layer and multi-layer PCBs, for example, to provide electrical interconnection between discrete components mounted on the surface of the PCB, and have also been used to a limited extent to produce certain electronic components.

As discussed above, due to the high field strengths, significant power requirements, complex cryogenic cooling systems, etc., of high field MRI systems, laminate techniques do not present a viable solution in the high field context and have not been previously contemplated for use in producing magnetic components for MRI. However, the inventor(s) have recognized that, in the low field context, laminate techniques may be used to fabricate one or more magnetic components of a low field MRI system, examples of which are discussed in further detail below.

As also discussed above, producing a $B_0$ magnet using conventional techniques (e.g., one or more wound coils) can be a time consuming process and may be susceptible to alignment errors and/or inhomogeneity due to manufacturing deviation, etc. However, the inventors have appreciated that such conventional techniques for producing magnetic components may be advantageously used in conjunction with laminate techniques described herein. For example, one or more $B_0$ coils manufactured using conventional techniques may be supplemented with one or more $B_0$ coils fabricated using laminate techniques. Some examples of "hybrid" magnets are discussed in further detail below.

FIG. 2A schematically illustrates a laminate panel 200 that includes a single non-conductive layer 210 and a single conductive layer 212 formed on the non-conductive layer. The non-conductive layer 210 (also referred to herein as a substrate) may be formed from any suitable material. For example, substrate 210 may be formed from any one or combination of suitable core materials, composites, adhesives and/or laminates may be utilized to form non-conductive layers and facilitate producing a laminate panel, including, but not limited to, FR4, ceramic, plastic, glass, polymide, epoxy, pre-impregnated composite fibers (pre-preg), multifunctional epoxy laminates such as 92 ML, or any other material(s) or combinations thereof having suitable properties. Substrate 210 may be a single layer or constructed of multiple layers of non-conductive material, each layer of which may be made from a same or different non-conductive material. Layering the substrate may allow for construction of a substrate that utilizes beneficial properties of different materials. Substrate 210 may be constructed to any desired dimensions, having length, width and thickness suitable for a given design.

Likewise, conductive layer 212 may be formed from any suitable conducting material. For example, conductive layer 212 may be a thin or thick film of copper or other suitable conductive material, a thick or extremely thick conductive layer (e.g., "extreme copper"), conductive plate, or any other type of conductive layer capable of being formed as a laminate on non-conductive substrate 210 by any suitable technique or process (e.g., via dip coating, electroplating, printing, molding, bonding, vacuum impregnating, pressing, dry adhesive, or any other suitable technique(s)). According to some embodiments, aluminum may be used as a conductor to take advantage of associated cost and weight reductions, as discussed in further detail below.

To produce desired "circuitry," conductive layer(s) 212 may be patterned to form electrical conductors for desired portions of one or more magnetic components of a low-field MRI apparatus using any one or combination of various subtractive, additive and/or semi-additive processes. Subtractive processes selectively remove the conductive material (e.g., copper) from the conductive layer leaving a desired conductive pattern providing a desired conducting circuit or portion of a circuit using, for example, any of various lithographic processes including, but not limited to, chemical etching, photoengraving, etc. Such processes are performed by providing a resist material in the desired pattern (often referred to as a mask) and introducing the conductive layer to the corresponding etchant to remove the conductive material in locations not treated with the resist material. Another subtractive process involves milling away unwanted portions of the conductive layer leaving the desired conductive pattern. The subtractive processes described herein and/or any other suitable process may be used alone or in any combination to fabricate the desired conductive pattern.

Additive processes may involve electroplating the desired conductive pattern on the substrate or "printing" the pattern using a conductive ink. For example, electroplating may involve exposing photosensitive film masked in a desired pattern. The exposed pattern may then be introduced to a chemical bath to allow the pattern to be capable of metal ion bonding and then plated with a conductor (e.g., with copper) that bonds with the pattern sensitized in the chemical bath to form the desired conductive pattern. Additive processes have the advantage that less conductive material is needed to form the desired conductive pattern than subtractive techniques. Other processes combine both subtractive and additive techniques to form the desired conductive pattern.

According to some embodiments, one or more magnetic components fabricated using laminate techniques may require conductive layers to be fabricated at relatively large thicknesses, often referred to as "heavy copper," (e.g., 5 $oz/ft^2$-19 $oz/ft^2$) or "extreme copper," (e.g., 20 $oz/ft^2$-200 $oz/ft^2$), though the techniques apply regardless of the choice of conductor material. Examples of suitable techniques for patterning heavy or extreme copper include, but are not limited to, any one or combination of cupric chloride etch, ferric chloride etch, mechanical milling, plasma etch, laser etch, electro-discharge-machining (EDM), plating up, etc. It should be appreciated that any single technique or combination of techniques described herein may be utilized, or any other technique suitable for patterning a conductive layer on a non-conductive substrate and/or for producing a laminate panel may be used, as aspects of forming one or more magnetic components (or portions thereof) of a low field MRI system in a laminate panel are not limited to any particular technique or combination of techniques for doing so.

FIG. 2B schematically illustrates a laminate panel 205 that includes a plurality of non-conductive layers 210 and a plurality of conductive layers 212 formed between the non-conductive layers. Connections between the conductive layers 212 may be achieved by forming holes filled with a conductive material (e.g., plated through-holes) in the intervening non-conductive layers called "vias," as described in more detail below. Although only two non-conductive layers and two conductive layers are explicitly illustrated in FIG. 2B, as indicated by the ellipses, any number of non-conductive layers and conductive layers may be used to achieve a laminate panel according to a desired design, some examples of which are described in further detail below.

Additionally, it should be appreciated that multiple conductive layers may be provided for each non-conductive layer, for example, a non-conductive layer having a conductive layer laminated to both sides. FIG. 2C illustrates a multi-layer panel formed by attaching together two laminate layers, each having a non-conductive layer 210 with a conductive layer laminated to both sides of the respective non-conductive layer. The multi-layer laminates may be attached using one or more adhesive layers 214. Adhesive layer(s) 214 may be any suitable adhesive or combination of materials such as pre-preg, dry adhesive, epoxy and/or any other suitable layer or combination of layers that, when activated (e.g., via heat and/or pressure) bonds the multi-layer laminates together. It should be appreciated that any configuration of conductive and non-conductive layering, adhesives, etc., using any one or combination of lamination techniques may be used to produce a desired laminate panel.

Figure 3A:
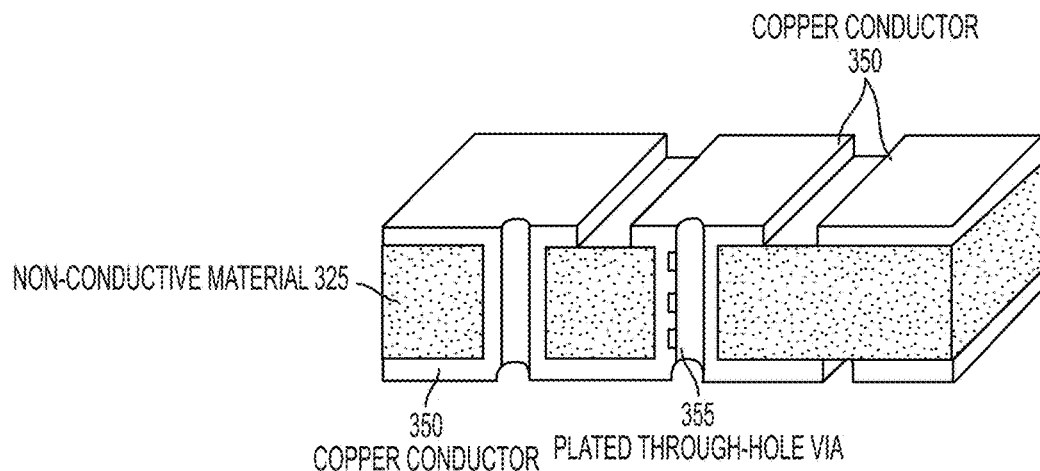
FIG. 3A illustrates an example portion of a laminate layer using copper as the material for the conductive traces patterned thereon.

As discussed above, layers of a laminate panel may be electrically connected using a desired arrangement of vias formed through appropriate layers in the laminate panel. FIG. 3A illustrates a cross-section of a portion of an exemplary laminate layer on which conductive traces are formed by patterning copper conductors 350 on non-conductive material 325 and connected using vias between layers. The copper conductors 350 may be patterned in any desired geometry and configured to form desired circuitry corresponding to one or more magnetic components (or portions thereof) of a low-field MRI system and/or any supporting electronics, control electronics, etc. Copper conductors on different layers may be electrically connected using vias such as plated through-hole vias 355. The plated through-holes may be formed by drilling holes through one or more layers of a laminate panel and using a suitable plating technique to form a conductive path through the non-conductive material to connect electrical conductors on different layers. It should be appreciated that vias may be formed through an entire laminate panel, or may be formed through a subset of layers of a laminate panel, including to connect adjacent layers or multiple adjacent layers. A laminate layer of a laminate panel may contain multiple vias arranged to connect to different layers of the laminate panel. For example, a layer having multiple components or portions of multiple components can be electrically isolated from each other and independently connected to conductors patterned on other layers as appropriate. The conductors patterned on layers of a laminate panel may be connected in any way desired, and one or more layers may not include vias at all and therefore remain electrically isolated from other layers of the laminate panel.

Figure 3B:
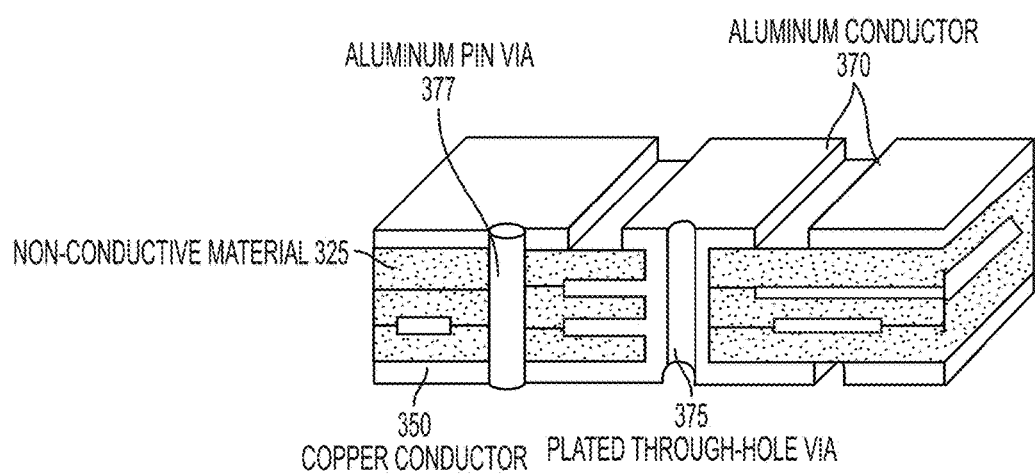
FIG. 3B illustrates an example portion of a laminate layer using aluminum as the material for the conductive traces patterned thereon.

The inventors have appreciated that though copper has properties that make it an attractive choice for an electrical conductor, aluminum may also be used, either as an alternative or in combination with other conductors such as copper to pattern one or more magnetic components (or portions thereof) on layers of a laminate panel. Aluminum weighs less and is less expensive than copper, thus facilitating the ability to fabricate a lighter weight, reduced cost laminate panel, according to some embodiments. FIG. 3B illustrates a cross-section of a portion of a laminate layer on which a conductive pattern is formed using aluminum conductors 370. Aluminum conductors 370 may be formed using the same laminate techniques described herein. Aluminum has a lower conductivity as compared to copper such that aluminum conductors 370 generally need to be formed with greater thickness than copper conductors 350 to obtain the same conductivity (e.g., an 80 mil aluminum layer may be needed in place of a 50 mil copper layer to achieve similar performance).

FIG. 3B further illustrates another method of providing vias between layers of a laminate panel using press-in pins. In particular, aluminum pin via 377 may be inserted through a hole drilled between layers of a laminate panel. It should be appreciated that pin vias may be used to connect adjacent layers or multiple adjacent layers, including providing pin vias through an entire laminate panel. Similarly, pin vias may be used in any number and configuration desired to electrically connect the conductors patterned on the various layers of a given laminate panel. Though pin via 377 is shown in FIG. 3B in connection with the use of an aluminum conductor, it should be appreciated that pin vias may be utilized and formed from any suitable conductor. It should be further appreciated that a laminate panel may be fabricated using a combination of conductors such that one or more components or portions thereof are formed using a first conductor (e.g., copper) and one or more components or portions thereof are formed using a second conductor (e.g., aluminum). Also, though copper and aluminum are illustrated in FIGS. 3A and 3B, any suitable conductor may be used to pattern desired magnetic and/or electrical components of a low-field MRI system, as the techniques described herein are not limited for use with any particular conductor or combination of conductors.

Figure 4:
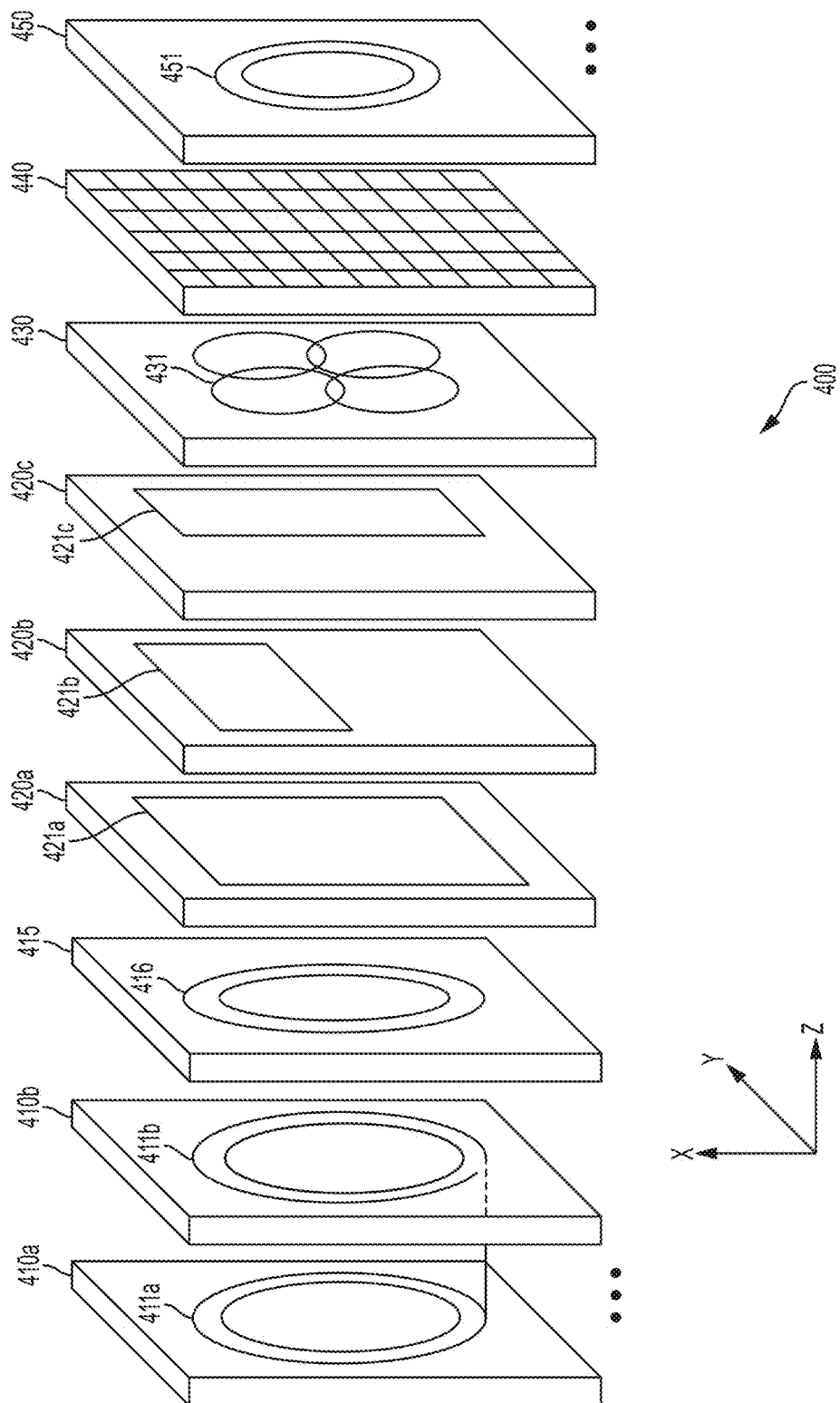
FIG. 4 shows an exploded view of example magnetic components of a low-field MRI system formed on layers of a multi-layer laminate panel, in accordance with some embodiments.

It should be appreciated that laminate techniques are relatively precise and accurate, with certain processes capable of yielding precision and accuracy at the mil, micron or even sub-micron level. As such, using laminate techniques to fabricate one or more magnetic components (or portions thereof) may reduce or eliminate much of the complexity and difficulty in manufacturing, aligning and installing magnetic components involved when using conventional techniques. Thus, using any suitable one or combination of subtractive, additive and/or semi-additive approaches, conductive layer(s) 212 may be patterned to form one or more magnetic components of a low field MRI system (e.g., one or more coils of a $B_0$ magnetic component, or desired portions thereof, one or more gradient coils, one or more transmit/receive coils, one or more shim coils, one or more shielding layers, etc.) to provide a simpler, more flexible, reliable and scalable mode of producing magnetic components for MRI, some specific examples of which are illustrated in FIG. 4. Multiple low-field MRI components may be integrated on a single panel or distributed between multiple panels to facilitate manufacture of the components according to a desired configuration, as discussed in further detail below.

FIG. 4 illustrates a schematic view of an exemplary multi-layer laminate panel 400 for use with a low-field MRI system, in accordance with some embodiments. It should be appreciated that laminate panel 400 is depicted as such to illustrate some examples of components that may be fabricated via laminate techniques. However, it should be appreciated that a laminate panel need not include all of the components illustrated in FIG. 4, and any one or more of the illustrated components may be omitted as desired. That is, a laminate panel may include any one or combination of the exemplary layers illustrated in FIG. 4 to form any one or combination of components (or portions thereof) in the laminate panel. In addition, a laminate panel may include other layers not illustrated in FIG. 4 (e.g., one or more layers for thermal management, one or more interconnect layers, one or more layers having control electronics or other electronic components, etc.).

The illustrated components (or any desired subset) may be formed in one or multiple layers, and separate components may be formed on layers shared with other components, or formed on separate layers independent from other components. To simplify illustration of a multi-layer panel (and the nearly limitless combination of layers and configurations thereof), the magnetic components illustrated in FIG. 4 are shown schematically without limitation on geometry of the magnetic components, or the number of layers on which they may be fabricated. As such, the exemplary layers illustrated in FIG. 4 and described herein should be understood to represent either a single laminate layer composed of at least one non-conductive layer and at least one conductive layer, or multiple such laminate layers, each composed of one or more non-conductive layers and one or more conductive layers. Accordingly, unless otherwise specified, a layer refers to one or more laminate layers.

It should be further appreciated that the illustrations in FIG. 4 showing the various components that may be fabricated within panel 400 are used to generically represent the respective component and are not intended to depict any particular geometry or configuration. The components illustrated in FIG. 4 may be patterned according to any desired geometry and configuration, as the techniques described herein for integrating one or more magnetic components within a laminate panel are not limited for use with any particular geometry, configuration or arrangement. Some examples of suitable geometries that may be utilized are discussed without limitation in further detail below.

As shown, exemplary laminate panel 400 includes a plurality of $B_0$ layers (410a, 410b) having one or more $B_0$ coils (411a, 411b) formed thereon. The $B_0$ coils are configured to generate at least a portion of a $B_0$ field for the low-field MRI system when an appropriate current is applied to the coil(s). In some embodiments, each $B_0$ layer includes one or more turns of a conductive trace patterned on the conductive layer to generate a portion of a desired $B_0$ field. As shown, layer 410a has patterned thereon a coil 411a, which may be patterned according to any desired geometry. For example, coil 411a may be patterned according to a generally circular geometry have one or more turns of conductive traces. Coil 411a may be electrically connected to coil 411b patterned on layer 410b (e.g., by a via between the layers), which also may be of any desired geometry (e.g., a generally circular coil having one or more turn of a conductor).

It should be appreciated that any suitable number of layers having $B_0$ coils formed thereon may be interposed between and electrically connected to layers 410a and 410b (e.g., 1, 10, 20, 50 or more layers, etc), each having one or more respective coils formed thereon that, when energized with a suitable current, provides at least a portion of a $B_0$ field configured for use in low-field MRI. It should be appreciated that each layer may have a single coil or multiple coils, and each coil may be patterned to have any number of turns formed thereon to achieve the magnetic and/or electric properties of a desired coil design.

The inventors have recognized and appreciated that using laminate techniques to design and manufacture MRI components enables the fabrication of $B_0$ coils having arbitrary geometries and configurations not practicable or possible using conventional techniques for manufacturing $B_0$ coils for low-field MRI systems, allowing for coil designs of virtually any geometry, configuration and/or arrangement. According to some embodiments, at least some $B_0$ layers on which one or more coils, or portions thereof, are formed may be patterned using different coil geometries than other layers to achieve a desired $B_0$ field. Some $B_0$ layers may have formed thereon one or more coils that can be independently controlled to tune the $B_0$ field for different applications and environments, or to adjust the $B_0$ field to calibrate or otherwise achieve a $B_0$ field of desired strength and/or homogeneity, as discussed in further detail below.

The selection of a particular coil geometry or combination of coil geometries and the arrangement and distribution of the coils within a laminate panel may depend, at least in part, on a desired $B_0$ field to be generated for use with low-field MRI applications. Additionally, one or more laminate layers having the same or different $B_0$ coil design may be connected by one or more vias connecting the conductive traces on the multiple layers. In some embodiments, the locations of the vias may be selected to minimize their effect on the homogeneity of the resultant $B_0$ field and/or to generally optimize one or more electrical properties of the energized coil. Non-limiting examples of $B_0$ coil designs that may be used to form, at least in part, a $B_0$ magnet for use in low-field MRI, are described in further detail below.

Because laminate techniques are capable of patterning electrical conductors with such high precision and accuracy, a $B_0$ magnet (or any portion thereof) may be fabricated in laminate panel form reliably and with high fidelity in accordance with the design specifications for a particular $B_0$ magnet to achieve a $B_0$ field of desired strength and homogeneity. Additionally, the ability to distribute one or more $B_0$ coils forming a $B_0$ magnet (or a portion thereof) over multiple layers of a laminate panel allows for optimizing the parameters of the $B_0$ magnet to generate a desired $B_0$ field in a manner not possible using conventional techniques for producing a $B_0$ magnet. Simulations may be used to select among numerous geometries, configurations and/or arrangements (e.g., the position, geometry or other properties of electrical conductors on each layer contributing the $B_0$ field may be generally optimized) to produce a desired $B_0$ field. The resulting design may then be precisely and accurately fabricated using suitable laminate techniques.

According to some embodiments, one or more laminate layers may include passive magnetic component(s), such as one or more layers patterned with magnetic materials, to facilitate the generation of a desired $B_0$ field with reduced power requirements, or to produce a higher $B_0$ field using the same power requirements as needed without the use of magnetic materials. For example, laminate panel 400 may include one or more laminate layers 415 patterned with ferrous, or other magnetic materials, arranged to form a magnetic component 416 that contributes to the magnetic field generated by one or more $B_0$ coils to achieve a desired $B_0$ field. Because such magnetic materials produce or tailor a magnetic field without needing a power source to provide current to produce a magnetic field, a desired $B_0$ field may be produced with reduced power requirements. Additionally, because magnetic materials can be used to produce a higher $B_0$ field without a corresponding increase in power requirements, magnetic materials may facilitate the construction of a low-field MRI system having a higher $B_0$ field, potentially exceeding 0.2 T (e.g., between 0.2 T and 0.5 T).

Magnetic component(s) 416 formed on one or more layers 415 may include any one or combination of materials having relatively high magnetic permeability (p) to assist in producing or tailoring a $B_0$ field of desired field strength and/or homogeneity. Magnetic component(s) 416 may be formed by one or more patterned layers, provided as a sheet, or other otherwise manufactured and incorporated within one or more laminate layers to produce a desired magnetic field. As discussed above, the use of passive magnetic components can reduce the power requirements needed to produce a given $B_0$ field. That is, because a portion of a desired $B_0$ can be produced passively (e.g., without requiring a power source to operate the components), the burden on the active magnetic components (e.g., the one or more a desired $B_0$ coils) can be reduced. As a result, one or more $B_0$ coils can be operated with reduced current to produce, in combination with magnetic component(s) 16, a $B_0$ field having a desired field strength and/or homogeneity. Reducing the power requirements of the active magnetic components simplifies the cost and complexity of the power electronics driving the magnetic components, results in a corresponding reduction in the thermal output of the laminate panel, and also may otherwise ease the constraints on the active magnetic components in generating a $B_0$ field of desired strength and/or homogeneity.

As discussed above, a laminate panel may further comprise at least one conductive layer patterned to form one or more gradient coils, or a portion of one or more gradient coils, capable of producing or contributing to magnetic fields suitable for providing spatial encoding of detected MR signals when operated in a low-field MRI system. In the example illustrated in FIG. 4, laminate panel 400 includes a plurality of laminate layers (420a, 420b, 420c) on which gradient coils (421a, 421b, 421c) are formed. Layer(s) 420a includes a conductive trace patterned to form all or a portion of a Z-gradient coil 421a, layer(s) 420b includes a conductive trace patterned to form all or a portion of a Y-gradient coil 421b, and layer(s) 420c includes a conductive trace patterned to form all or a portion of an X-gradient coil 421c. As discussed above, the depiction of gradient coils 421a, 421b and 421c in FIG. 4 is meant to generically represent gradient coils of any suitable geometry using any number and configuration of layers to provide the one or more desired gradient coils.

As one non-limiting example wherein gradient coils are at least partially formed in a laminate panel (e.g., laminate panel 400), a Z-gradient coil may be formed, at least in part, in one or more layers using a generally circular geometry and an X-gradient coil and a Y-gradient coil may be formed, at least in part, in one or more layers using a generally rectangular geometry such as via one or more conductors patterned as a grid (e.g., similar to the geometry schematically illustrated in FIG. 1). The conductors for the gradient coils may be distributed across one or multiple layers in any combination as desired to produce integrated gradient coils, either with or without other magnetic components of a low field MRI system, and either sharing layers with other magnetic components and/or patterned on separate layers of a laminate panel.

In some embodiments of a laminate panel with both $B_0$ coils and gradient coils for thereon, at least one layer of the laminate panel may include both $B_0$ coils (or a portion thereof) and gradient coils (or a portion thereof) that may be selectively controlled to provide desired magnetic field characteristics for low-field imaging applications. In some embodiments, at least a portion of the same conductive trace on a layer of a laminate panel may function as a $B_0$ coil or as a gradient coil depending on how the coil is operated. According to some embodiments, a gradient coil may be distributed over multiple layers and according to some embodiments, multiple gradient coils (or portions thereof) may be formed in a single layer (e.g., one or more of X, Y and/or Z gradient coils), as the techniques described herein are not limited to any particular manner of distributing magnetic component(s) over multiple layers of a laminate panel or multiple laminate panels. It should be appreciated that one or more gradient coils fabricated using laminate techniques may be utilized in connection with one or more other magnetic components fabricated using laminate techniques (e.g., by integrating the one or more gradient coils in a shared or separate laminate panel), or may be utilized in connection with one or more other magnetic components fabricated using conventional techniques as part of a low field MRI system.

As also discussed above, a laminate panel may further comprise at least one conductive layer patterned to form one or more transmit and/or receive coils, or a portion of one or more transmit and/or receive coils, configured to stimulate MR response by producing a $B_1$ excitation field (transmit) and/or to receive emitted MR signals (receive) when operated in conjunction with the coils configured to produce a $B_0$ field and corresponding gradient fields. Such a laminate panel may incorporate single transmit and/or receive coils (or portions thereof) or multiple transmit and/or receive coils (or portions thereof) for performing single channel or parallel MRI. In the example illustrated in FIG. 4, laminate panel 400 includes layer(s) 430 on which all or a portion of a transmit/receive coil 431 is formed.

Any suitable geometry may be used to pattern the transmit/receive coil or set of transmit/receive coils. For example, in some embodiments, a spiral-shape conductor may be patterned in one or more layers to form one or more transmit/receive coil (or portions thereof). According to some embodiments, a substantially rectangular geometry may be utilized to fabricate one or more transmit and/or receive coils using laminate techniques. According to some embodiments in which different coils are used for transmit and receive, transmit and receive coils may be formed in one or more layers using different respective geometries. In some embodiments, multiple layers and/or multiple laminate panels may be used to collectively form a transmit/receive coil and/or set of transmit/receive coils for use in a low field MRI system. It should be appreciated that one or more transmit/receive coils fabricated using laminate techniques may be utilized in connection with one or more other magnetic components fabricated using laminate techniques (e.g., by integrating the one or more other magnetic components in a shared or separate laminate panel), or may be utilized in connection with one or more other magnetic components fabricated using conventional techniques as part of a low field MRI system.

A laminate panel may further comprise at least one conductive layer patterned to form one or more electromagnetic shields arranged to prevent electromagnetic energy from the environment and/or generated from components of the MRI system from disturbing the magnetic fields generated by the MRI magnetics and/or for otherwise shielding the apparatus from electromagnetic interference. In the example illustrated in FIG. 4, laminate panel 400 includes layer(s) 440 used to provide electromagnetic shielding. Although only a single shielding layer is shown, it should be appreciated that any suitable number of shielding layers may be used in any different number of locations, and the patterned conductive layer(s) forming one or more shields may be formed in separate layers or formed on layers on which other components are formed (e.g., patterned in electrical isolation on unused portions of one or more laminate layers on which other magnetic components or portions of other magnetic portions are formed. Shielding layer(s) 440 may be formed by patterning a conductor mesh in one or more layers of laminate panel 400, though it should be appreciated that shielding may be provided using any suitable conductor pattern to form any desired geometry, which geometry may be selected based on where the respective shielding is provided and/or characteristics of the electromagnetic interference the particular shielding is employed to suppress or eliminate.

Electromagnetic shielding may be configured to provide active shielding or passive shielding, and embodiments are not limited in this respect. In some embodiments, shielding formed on multiple layers of a laminate panel are connected using one or more vias. Accordingly, at least some shielding for a low field MRI system may be integrated into one or more laminate panels in which one or more magnetic components are fabricated, either on one or more separate layers or on one or more layers on which another magnetic component (or portion thereof) is formed. Electromagnetic shielding may include static or dynamic shielding of magnetic fields, electric fields, or both.

Shim coils arranged to facilitate the production of desired magnetic fields may also be patterned on one or more layers of a laminate panel. According to some embodiments, a laminate panel may comprise at least one conductive layer patterned to form one or more shim coils, or a portion of one or more shim coils, arranged to produce or contribute to magnetic field(s) and adapted to improve the homogeneity of the $B_0$ field generated by one or more $B_0$ coils, to otherwise improve the $B_0$ field within a given field of view and/or to counteract other magnetic fields that negatively impact the $B_0$ field. In the example illustrated in FIG. 4, laminate panel 400 includes layer(s) 450 on which one or more shim coils 452 (or portions thereof) are formed. For embodiments that include a laminate panel with at least one $B_0$ coil and at least one shim coil, the at least one shim coil may be formed by conductive layers shared with (but electrically isolated from) the at least one $B_0$ coil (or portions thereof) or may be formed in one or more conductive layers separate from the at least one $B_0$ coil (or portions thereof). As with the other magnetic components discussed, shim coils fabricated using laminate techniques may be utilized with other components fabricated using laminate techniques (e.g., by integrating the shim coils in a shared or separate laminate panel) or utilized with other components manufactured using conventional techniques as part of a low field MRI system.

As discussed above, multiple low-field MRI components (or portions thereof) may be formed on a single layer (i.e., a single laminate layer) of a laminate panel. That is, multiple magnetic components or portions of multiple magnetic components may be patterned on the same conductive layer of a single laminate layer. For example, the conductive layer of a single laminate layer may be patterned to form one or more $B_0$ coils (either forming or contributing to a complete $B_0$ magnet) and one or more gradient coils or portion of one or more gradient coils.

As a further example, a single laminate layer of a laminate panel may be patterned to form all or a portion of a gradient coil and all or a portion of a transmit/receive coil. The gradient coil and the transmit/receive coil (or portions thereof) may share at least some conductive elements formed on the laminate layer, or the gradient coil and the transmit/receive coil (or portions thereof) may be formed separately on the same laminate layer (e.g., electrically isolated from one another). As another example, a single laminate layer of a laminate panel may be patterned to form all or a portion of one or more $B_0$ coils and all or a portion of one or more shim coils used to tune the homogeneity of the $B_0$ field for the low-field MRI system. The shim coil(s) and the $B_0$ coil(s) (or portions thereof) may share at least some conductive elements formed on the laminate layer or the shim coil(s) and the $B_0$ coil (or portions thereof) may be formed separately on the same laminate layer (i.e., electrically isolated from one another). It should be appreciated that any combination of components (or portions thereof) may be similarly fabricated in one or more shared laminate layers as desired according to a specific design, as the aspects are not limited in this respect.

The inventors have recognized and appreciated that some conductors formed on laminate panels in accordance with some embodiments may be configured to perform multiple functions typically characteristic of functions performed by separate MRI components. By repurposing the same conductors to perform different functions and/or by sharing laminate layers of a laminate panel between multiple components or portions of multiple components, the dimensions and costs associated with manufacturing a laminate panel may be reduced.

It should be appreciated that the order of the laminate layers of laminate panel 400 shown in FIG. 4 is provided merely for illustration, and any suitable ordering of layers may be used. That is, when multiple magnetic components (or portions thereof) are integrated into a laminate panel, any ordering of the laminate layers may be used to achieve a desired sequence of the integrated magnetic components. In some embodiments, the configuration of the layers and components formed thereon may be selected based, at least in part, on design considerations for optimizing one or more system and/or imaging parameters including, but not limited to, power consumption, gradient linearity, $B_0$ field homogeneity, gradient strength, RF strength, thermal considerations, etc. For example, in some embodiments, one or more layers comprising all or a portion of one or more $B_0$ coils may be located as the innermost layer(s) of the laminate panel to reduce power consumption of the low-field MRI system. In some embodiments, one or more outer layers of the laminate panel may be patterned to provide electromagnetic shielding. Accordingly, any ordering of layers of a laminate panel may be used, as the techniques described herein are not limited for use with any particular configuration in this respect.

As discussed above, though laminate panel 400 is shown as having fabricated therein all or portions of $B_0$ coils, gradient coils, transmit/receive coils, shim coils, and electromagnetic shielding to illustrate exemplary components that may be fabricated using laminate techniques, a laminate panel may include any one or combination of components, or desired portions thereof. In some embodiments, at least some of the exemplary components are provided separate from laminate panel(s) (e.g., using conventional manufacturing techniques for those components). For example, some embodiments include laminate panel(s) having one or more $B_0$ coils formed thereon, with other components of the low-field MRI system being provided separate from the laminate panel(s). Other embodiments include laminate panels having one or more gradient coils formed thereon, with other components of the low-field MRI system being provided separate from the laminate panels. For example, in such embodiments, the main magnetic field $B_0$ for the low-field MRI system may be manufactured using conventional techniques (e.g., as described above in connection with the bi-planar $B_0$ coil architecture in FIG. 1), and the transmit/receive coil may be provided by a helmet-based and/or surface-based coil placed around or near the object to be imaged. In other embodiments, laminate panels may have formed thereon both one or more $B_0$ coils and one or more gradient coils (or portions thereof), with other components of the low-field MRI system being produced separate from the laminate panel(s).

Accordingly, it should be appreciated that laminate panels manufactured in accordance with techniques described herein may include any suitable number of layers on which any one or combination of low-field MRI components (or portions thereof) are formed, and such laminate panel(s) may be utilized in connection with any number of other laminate panel(s) or any one or combination of other components produced using other techniques, as the aspects are not limited in this respect. According to some embodiments, a hybrid approach may be used wherein one or more magnetic components are implemented with a portion being fabricated using laminate techniques and a portion produced using conventional techniques.

Figure 5:
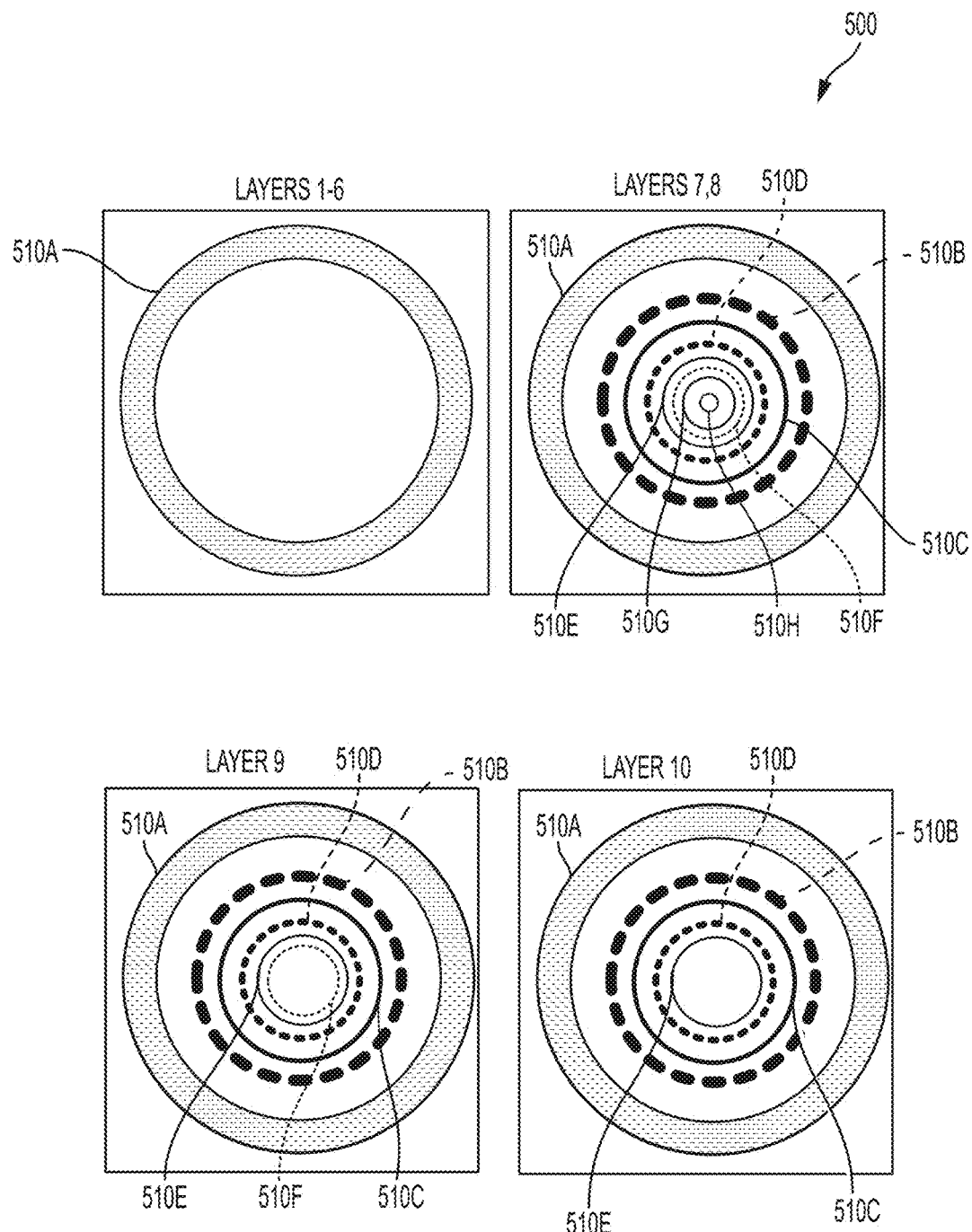
FIG. 5 illustrates exemplary layers of a laminate panel integrating a $B_0$ magnet, in accordance with some embodiments.
Figure 5:
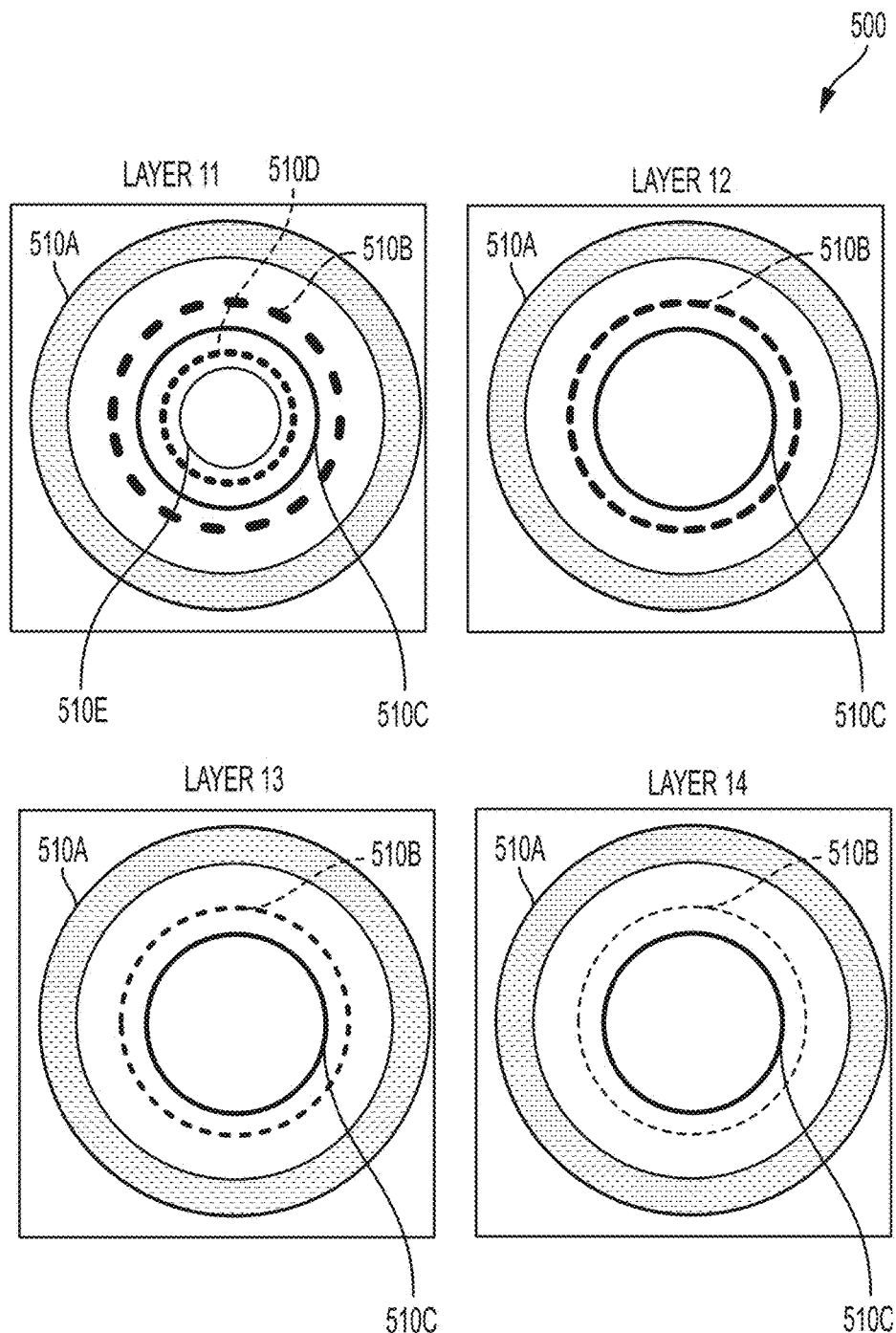

As discussed above, magnetic components may be fabricated, in part or in full, by distributing portions of the magnetic component(s) over a plurality of layers of a laminate panel in any number of different configurations. FIG. 5 illustrates a multi-layer laminate panel 500 having a $B_0$ coil fabricated therein, in accordance with some embodiments. FIG. 5 shows some examples of how portions of a $B_0$ coil may be distributed across multiple layers of a laminate panel to produce, when energized, a magnetic field contributing to a $B_0$ field suitable for performing low-field MRI. While the example layers schematically illustrate portions of a $B_0$ coil fabricated therein, each layer may (but need not) include other components, including other magnetic components (e.g., one or more gradient coils, transmit/receive coils, shim coils, etc.), as discussed in further detail below.

Exemplary laminate panel 5 comprises fourteen laminate layers over which portions of a $B_0$ magnet are distributed by patterning the respective conductive layers accordingly. In FIG. 5, the conductive patterns provided on example layers are illustrated by a generally circular coil, the width of which denotes in a representative manner the number of turns forming the respective coil. The coils are represented with solid and dashed lines to indicate that, when energized, current through coils represented with solid lines flows in the opposite direction as current through coils represented with dashed lines (e.g., clockwise versus counter-clockwise, or vice versa). Example laminate panel 500 comprises coils 510A, 510B, 510C, 510D, 510E, 510E, 510F and 510G fabricated thereon and distributed, by way of example only, in the manner described below.

Each of the exemplary layers 1-14 in FIG. 5 have fabricated thereon a coil 510A comprising a plurality of turns, for example, twenty turns of conductive traces each. That is, as shown in the depicted layers, each of the fourteen layers may be patterned to form a respective outer coil having twenty turns of conductive traces. Each coil 510A may be connected to coil 510A in the subsequent layer using a one or more vias between the layers (e.g., plated through-holes, pins, or other suitable conductive vias). Alternatively, one or more of the outer coils 510A may be electrically isolated from other coils 510A and may, for example, be configured to be independently energized (e.g., one or more of coils 510A may be utilized as a shim coil). Each of the first six layers (e.g., Layers 1-6 illustrated in FIG. 5) consist of outer coil 510A with respect to the integrated $B_0$ coil, though other components (including other magnetic components) may be fabricated thereon in addition.

Each of layers 7-14 also have fabricated thereon a respective coil 510B, which as denoted by the dashed lines, may conduct current in an opposite direction as coils 510A when operated. In example laminate panel 500, each coil 510B includes a number of turns less than the number of turns in coils 510A formed on respective layers. As indicated by the decreasing line width used to represent coils 510B, the number of turns of conductive traces forming the respective coil may also decrease (or otherwise vary) across the layers on which the coils are distributed. For example, coils 510B in layers 7 and 8 may comprise 11 turns of conductive traces each, coils 510B fabricated in respective layers 9-11 may be formed with 10 turns, coil 510B fabricated in layer 12 may be formed with 9 turns, and coils 510B fabricated in respective layers 13 and 14 may be formed with 8 turns. It should be appreciated that the turn configuration is exemplary, and that the number of turns and how the number of turns vary (or remain constant) are not limited in any respect.

Each of layers 7-14 also have fabricated thereon a respective coil 510C, which as denoted by the solid lines representing the coils, may conduct current in the same direction as coils 510A when operated. In example laminate panel 500, each coil 510C includes a number of turns less than the number of turns forming coils 510B in the respective layer, which number may vary or remain the same across laminate layers on which coils 510C are patterned. For example, coils 510C fabricated in respective layers 7-10 may be formed with 6 turns, coil 510C fabricated in layer 11 may be formed with 5 turns, and coils 510C fabricated in respective layers 12-14 may be formed with 4 turns. However, this arrangement is merely exemplary and the number of turns and how they vary (or remain constant) are not limited by this example arrangement.

Each of layers 7-11 also have fabricated thereon a respective coil 510D and a respective coil 510E, each of layers 7-9 have fabricated thereon a respective coil 510F, and each of layers 7 and 9 have fabricated thereon a respective coil 510G and a respective coil 510H. In the example illustrated in FIG. 5, successive coils alternate the direction in which they conduct current when operated, and each successive coil includes a number of turns of conductors less than the preceding coil. However, this configuration is merely exemplary and the direction in which current is conducted, the number of turns in each coil, and the number of coils on each layer of a laminate panel may be selected as desired to produce or contribute to a $B_0$ field for low field MRI.

As discussed in connection with coil 510A, the conductors forming the exemplary coils illustrated in FIG. 5 may be connected together intra-layer (as discussed in further detail below) and/or connected inter-layer using conductive vias between the layers. Furthermore, one or more of the coils illustrated in FIG. 5 may be patterned in isolation and capable of being independently energized. In this manner, such coils may be used as shim coils that can be operated as needed to improve the homogeneity of the resulting $B_0$ field in a given environment or under given loading conditions (e.g., during calibration of the low-field MRI system).

Figure 6B:
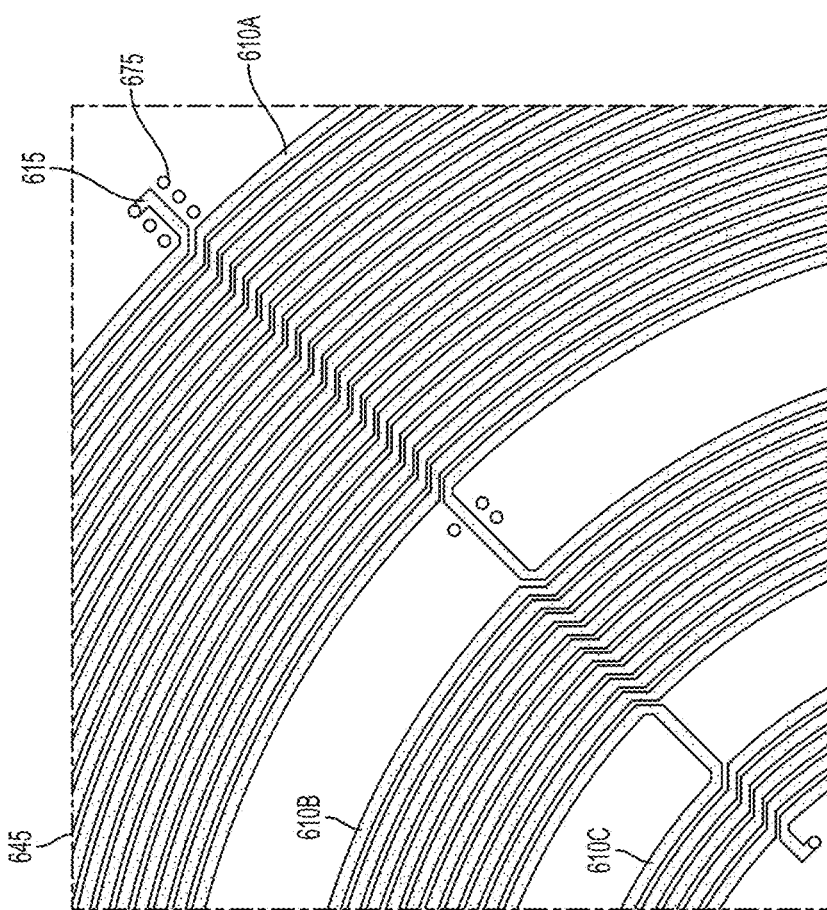
FIGS. 6A and 6B illustrate an exemplary techniques for patterning multiple coils on a laminate layer of a laminate panel, in accordance with some embodiments.
Figure 6A:
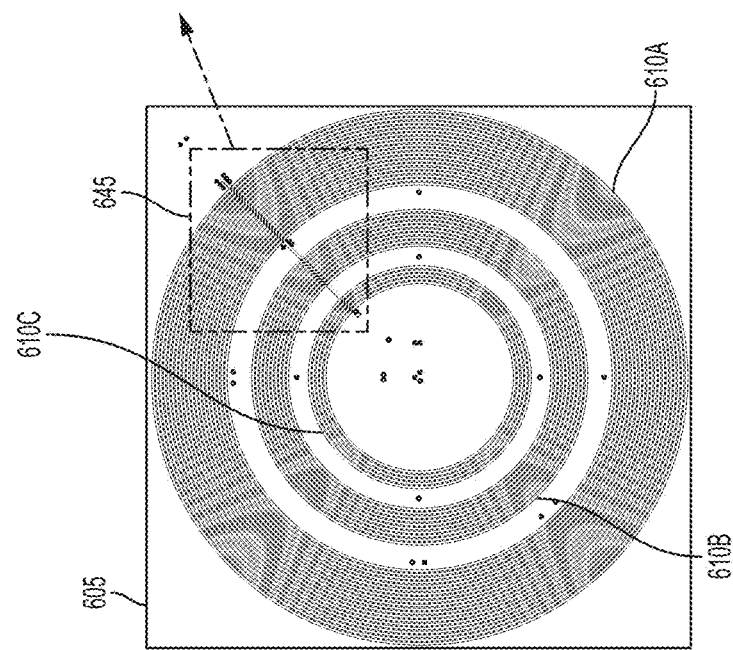

As discussed above, coils provided in a same laminate layer may be configured such that, when operated, current flows in different directions in different respective coils. For example, one or more coils patterned on a given laminate layer may conduct current in the opposite direction of one or more other coils patterned in the same laminate layer. FIG. 6A illustrates an exemplary layer 605 of a laminate panel on which a $B_0$ coil is patterned (e.g., layer 605 may be similar to layer 12 illustrated in FIG. 5). Layer 605 comprises coils 610A, 610B and 610C, each having a plurality of turns of a conductive trace (e.g., 20 turns, 10 turns and 5 turns, respectively). FIG. 6B illustrates region 645 indicated in FIG. 6A enlarged to show further detail regarding the conductive trace or track patterned on layer 605.

As illustrated in FIG. 6B, coils 610A, 610B and 610C are formed by a single conductive trace 615 patterned such that when electrical current is provided to conductive trace 615, current is conducted in alternating counter-clockwise and clockwise directions with respect to coils 610A, 610B and 610C. In particular, coil 610A conducts current in a counter-clockwise direction, coil 610B conducts current in a clockwise direction and coil 610C conducts current in a counter-clockwise direction. It should be appreciated that conductive trace 615 may be patterned to implement any desired configuration with respect to the direction in which current is conducted. For example, layers on which multiple coils are fabricated may be patterned such that current is conducted in the same direction through each coil, or the direction of current conduction may be changed through one or more desired coils, as techniques described herein are not limited for use with any particular configuration of conductors or direction of current flow.

FIGS. 6A and 6B also illustrate exemplary vias, of which via 675 is labeled in 6B. These vias connect conductive traces patterned on one laminate layer with conductive traces patterned on one or more other laminate layers (e.g., as illustrated by exemplary vias shown in FIGS. 3A and 3B described above). Vias may be provided to connect conductive traces in adjacent laminate layers and/or may be provided through multiple layers to connect conductive traces patterned on any number of desired laminate layers. Accordingly, the conductive traces patterned on different layers of a laminate panel may be connected in any manner to produce desired circuitry for magnetic components (or other electronic components) fabricated within a laminate panel.

While the exemplary coils illustrated above in connection with FIGS. 5 and 6 are substantially circular and have substantially uniform concentric turns, other geometries and configurations can be utilized, as the techniques described herein are not limited for use with any particular geometry or configuration. For example, FIGS. 7 and 8 schematically illustrate non-limiting examples of $B_0$ coil designs that may be realized using the laminate techniques described herein. Unlike $B_0$ coil designs that can be practically realized for low-field MRI systems using conventional production techniques, which typically involve winding a square or circular conductor around a rigid support structure, other designs may be realized by virtue of the flexibility and precision of laminate processes. For example, conductive traces for a $B_0$ coil formed using laminate techniques may be fabricated and patterned, generally speaking, according to any desired dimensions and according to any desired geometry. As such, the conductive paths can be fabricated having relative dimensions generally not feasible using conventional wire conductors, and can be patterned according to geometries that are not practical, if even possible, using conventional manufacturing techniques. As such, laminate techniques may facilitate the manufacture of more optimal coil designs, not only for the $B_0$ magnet, but for other magnet components as well (e.g., gradient coils, transmit/receive coils, shim coils, etc.).

Moreover, because laminate techniques allow a coil to be distributed over multiple (and in some designs relatively numerous) layers, the dimensions, position, geometry, etc. of the portion of the coil in each given layer may be selected to generally optimize the resulting magnetic field. For example, the inventors have developed simulations to vary one or more parameters of the conductive pattern on each layer to determine a generally optimal solution regarding any one or combination of conductor dimension, position, geometry, number of turns, and/or any other parameter(s) of the conductive pattern on each layer that impacts the resulting magnetic field. Different MRI applications may have different optimal solutions such that laminate techniques may be utilized to design and implement low-field MRI systems tailored for particular MRI applications.

Figure 7C:
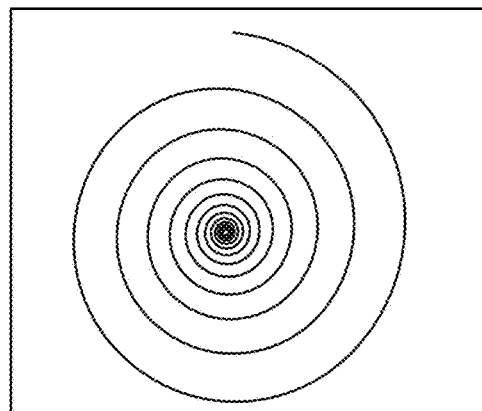
FIGS. 7A-7C show spiral designs for a $B_0$ coil formed on at least one layer of a multilayer laminate panel in accordance with some embodiments.
Figure 7B:
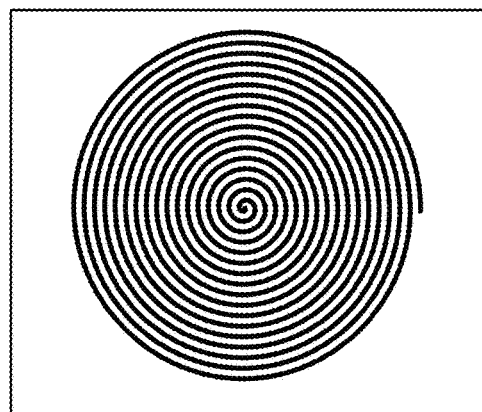
Figure 7A:
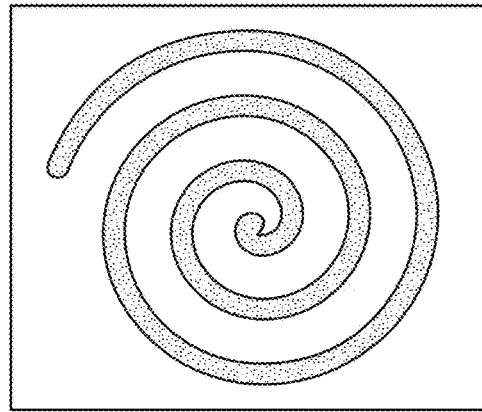

FIGS. 7A-7C illustrate spiral $B_0$ coil designs comprising a plurality of turns, which may for example, be patterned on a single layer of a laminate panel or distributed over multiple laminate layers and connected using appropriately placed vias. FIG. 7A illustrates a relatively wide spiral trace of conductive material patterned on one or more laminate layers. FIG. 7B shows a spiral $B_0$ coil design wherein the width of the conductive path is thinner than the conductive path illustrated in FIG. 7B, but the number of turns is greater. FIG. 7C shows a spiral $B_0$ coil design having a non-uniform density of turns of the spiral (i.e., the spiral geometry becomes tighter as it moves inward). Using one or more variable density spiral $B_0$ coils may reduce the amount of power required to produce a desired strength $B_0$ field compared to a given circular coil designs. Manufacture of such variable spiral density $B_0$ coils are typically impractical or not feasible using conventional wire-wrapping techniques. It should be appreciated that other spiral-based $B_0$ coil designs are also possible and the geometries and configurations illustrated herein are merely exemplary of possible coil designs.

Figure 8C:
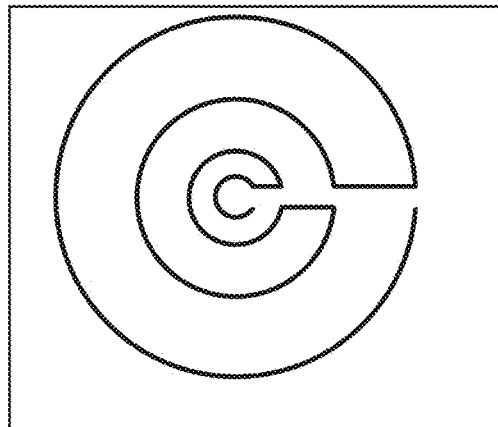
FIGS. 8A-8C show circular designs for a $B_0$ coil formed on at least one layer of a multilayer laminate panel, in accordance with some embodiments.
Figure 8B:
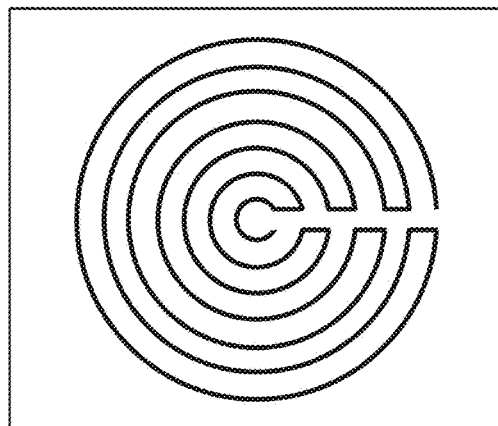
Figure 8A:
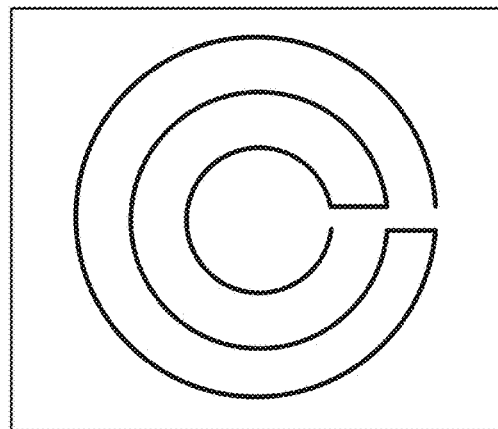

FIGS. 8A-8C illustrate concentric ring $B_0$ coil designs comprising a plurality of turns that may be patterned on a single laminate layer of a laminate panel or distributed over multiple laminate layers using appropriately placed vias. FIG. 8A illustrates a plurality of connected circular traces of conductor material formed on one or more laminate layers and having a uniform density with respect to the turns of the conductor. FIG. 8B shows a $B_0$ coil design where both the number and density of the turns of the $B_0$ coil formed on the laminate layer are increased compared to the design of FIG. 8A, while maintaining a uniform density of the turns. FIG. 8C shows a $B_0$ coil design having a non-uniform density of turns of the concentric coils. It should be appreciated that other circular-based $B_0$ coil designs are also possible, for example, the exemplary $B_0$ coil configurations described above in connection with FIGS. 5, 6 and 10, and embodiments are not limited in this respect.

As discussed in connection with FIG. 4, laminate techniques may be used to produce gradient coils integrated within a laminate panel, either in part or in full and/or alone or in combination with one or more other magnetic components. Gradient coils may be patterned according to any desired geometry suitable for a particular implementation. FIGS. 9A-9C illustrate exemplary x-gradient, y-gradient and z-gradient coils in accordance with some embodiments. For example, FIG. 9A illustrates an example of an x-gradient coil 920A that may be patterned on a single laminate layer or distributed over multiple laminate layers of a laminate panel. X-gradient coil 920A may, for example, be configured to perform frequency encoding. Similarly, y-gradient coil 920B may be patterned on a single or multiple laminate layers and, for example, be configured to provide phase encoding, and z-gradient coil 920C may be patterned on one or more laminate layers and, for example, be configured to provide localization of image slices. However, the gradient coils may be arranged and configured to perform any suitable spatial encoding. It should be appreciated that patterns illustrated in FIG. 9A-9C are merely exemplary and any configuration or geometry may be used to implement gradient coils for a low field MRI, as the techniques described herein are not limited to any particular design or configuration for implementing gradient coils.

Figure 10:
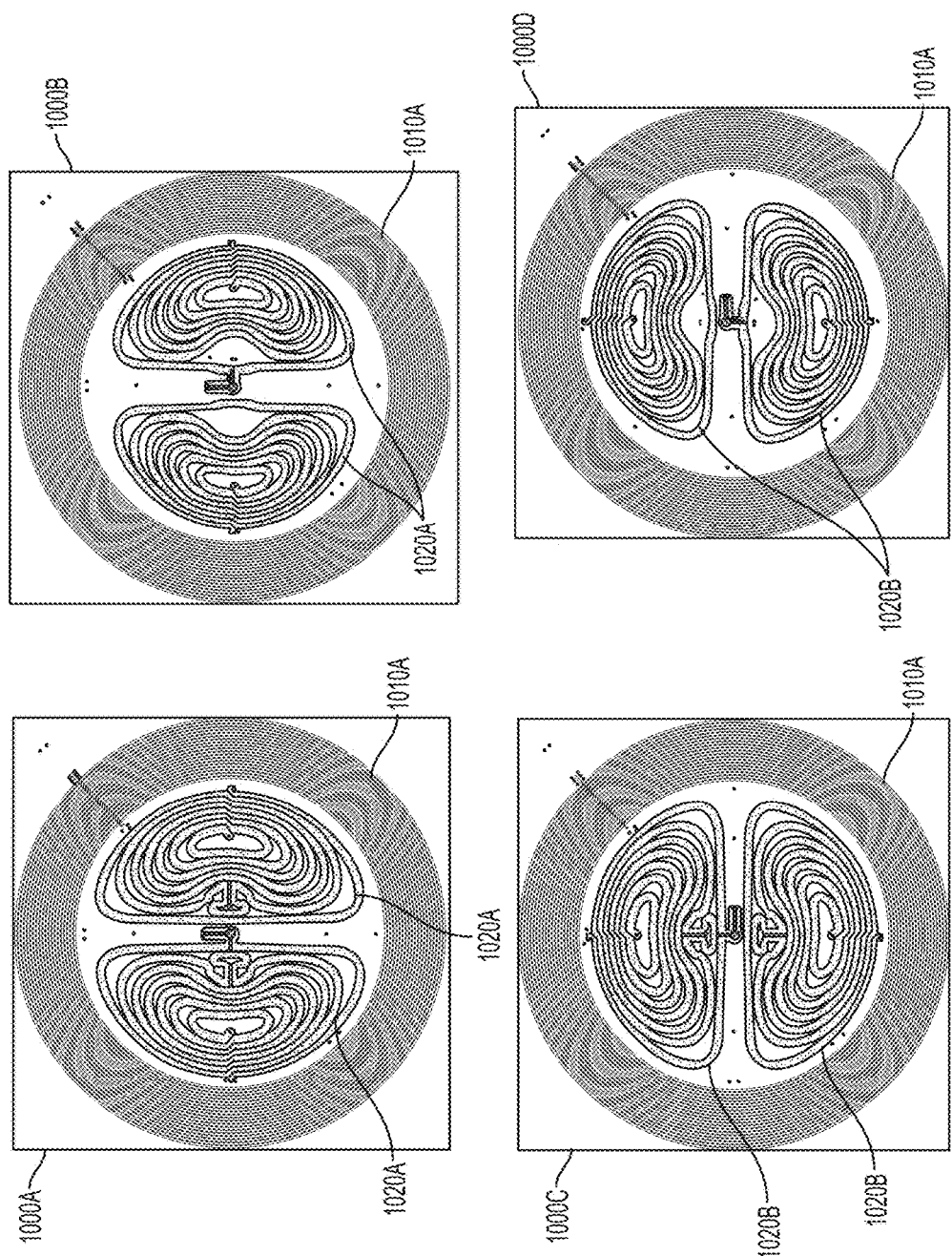
FIG. 10 illustrates exemplary layers of a laminate panel integrating a $B_0$ magnet and gradient coils, in accordance with some embodiments.
Figure 10:
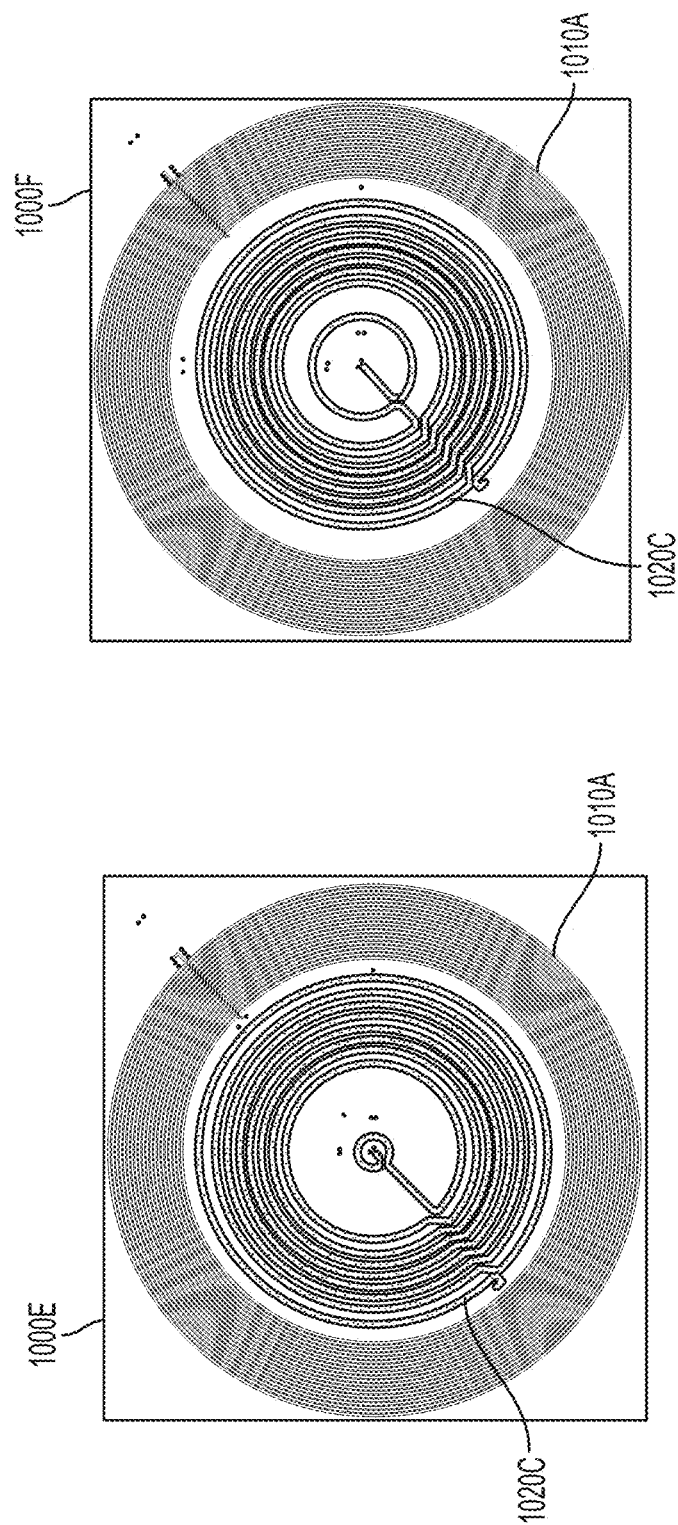

FIG. 10 illustrates an example wherein gradients coils are fabricated on at least some of the same layers as coils that form, at least in part, a $B_0$ magnet. In particular, FIG. 10 illustrates six laminate layers of a laminate panel wherein x-gradient coils 1020A, y-gradient coils 1020B, and z-gradient coils 1020C are patterned in the same layers as portions of a $B_0$ magnet (e.g., layers having patterned thereon one or more $B_0$ coils or portions thereof). With respect to the $B_0$ magnet, coils 1010A may be similar to coils 510A illustrated in FIG. 5. The inventors have appreciated that regions of a laminate layer in the center of such $B_0$ coils may be utilized to pattern one or more gradient coils, or portions thereof. For example, x-gradient coils 1020A may be patterned on layers 1000A and 1000B, y-gradient coils 1020B may be patterned on layers 1000C and 1000D, and z-gradient coils 1020C may be patterned on layers 1000E and 1000F along with $B_0$ coils 1020A patterned on respective layers of the laminate panel. It should be appreciated that gradient coils may be integrated in a same laminate panel with $B_0$ coils for a low-field MRI $B_0$ magnet in other ways, including patterning gradient coils, in whole or in part, on at least some separate laminate layers of the laminate panel, as integrating multiple magnetic components in a laminate panel is not limited to any particular manner of doing so. By sharing layers between magnetic components, the number of layers may be reduced, thus reducing the cost of manufacturing a laminate panel.

Figure 11A:
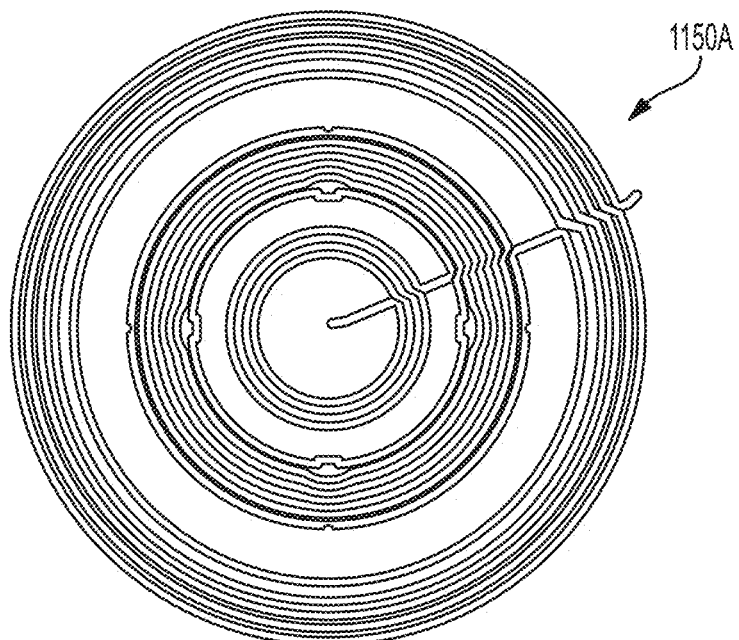
FIGS. 11A and 11B illustrate exemplary shim coils that may be fabricated using lamination techniques discussed herein, in accordance with some embodiments.
Figure 11B:
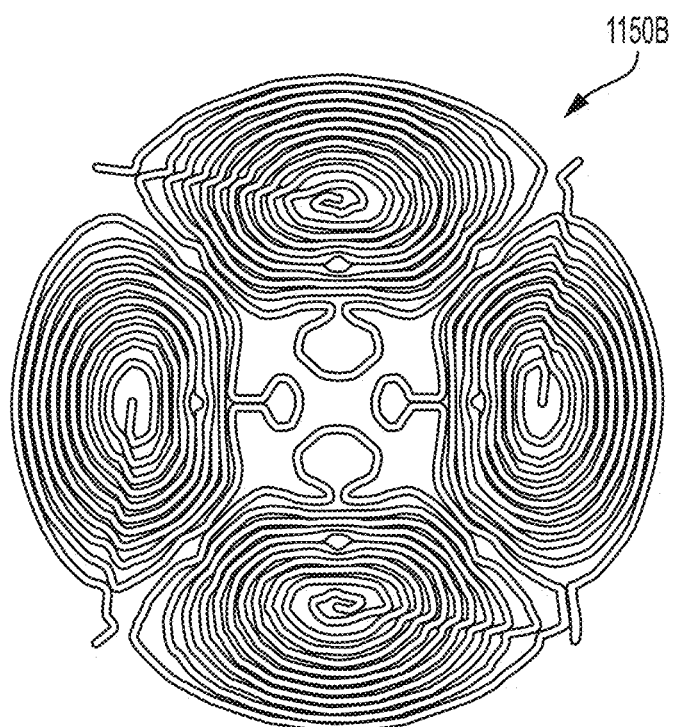

As also discussed above in connection with FIG. 4, one or more shim coils may be fabricated within a laminate panel along with one or more other magnetic components of a low field MRI system. FIGS. 11A and 11B illustrate example shim coils that may be patterned on one or more layers of a laminate panel to produce a magnetic field to contribute to or assist in providing a $B_0$ field of desired strength and homogeneity. As one non-limiting example, shim coil 1150A may be patterned in one or more laminate layers to produce, when energized, a corresponding magnetic field. Coil 1150A may be configured to be independently energized by, for example, electrically isolating coil 1150A from other active components provided within the same laminate panel or the same laminate layer so that coil 1150A can be powered separately. Coil 1150B illustrated in FIG. 11B shows a different exemplary geometry for providing a shim coil integrated within a laminate panel. Similar to shim coil 1150A, shim coil 1150B may be configured to be independently operated.

It should be appreciated that shim coils may be provided in any manner and configuration to contribute magnetic fields that facilitate the production of a $B_0$ field of desired strength and homogeneity. For example, coil 1150A and/or coil 1150B may be patterned on a single layer or distributed across multiple layers, and each coil may be patterned on a layer alone or may share one or more layers with one or more other components, or portions thereof. Moreover, any number of shim coils having any desired geometry may be fabricated within a laminate panel, as the aspects are not limited in this respect. According to some embodiments, one or more shim coils are fabricated within a laminate panel separate from other magnetic components of a low field MRI system. According to some embodiments, shim coils may be provided in different geometries and/or locations such that different combinations of shims coils may be selectively activated in response to a given environment in which the system is being operated. The ability to dynamically choose a combination of shim coils to operate may facilitate the production of low field MRI systems capable of being deployed in a transportable or cartable fashion. As discussed above, shim coils that contribute to a $B_0$ field (e.g., to improve homogeneity), when operated, are $B_0$ coils since they in fact do contribute to the $B_0$ field of the MRI system.

According to some embodiments, one or more passive shims are utilized to produce a magnetic field to contribute to a $B_0$ field of desired strength and homogeneity. As discussed above in connection with FIG. 3, magnetic materials may be utilized to produce magnetic fields without requiring a source of power to do so. Accordingly, one or more layers patterned with magnetic materials may be provided as passive shims to assist in producing the desired $B_0$ field. As with other components described herein, passive shims may be provided in any number, arrangement and geometry, and may be patterned on a single or multiple layers, either alone or on layers shared with one or more other components, as the aspect relating to providing passive shims are not limited to any particular configuration, geometry or arrangement. Passive shims may be provided using separate shim elements comprised of magnetic materials of any desired geometry. Such shim elements may be incorporated into a laminate panel by affixing the elements to the panel (e.g., using an adhesive or by other means of attachment) at desired locations and/or such shim elements may be arranged separate from the laminate panel at desired locations, as the aspects are not limited to any particular manner of incorporating one or more passive shims into a low-field MRI system.

As discussed in the foregoing, laminate techniques may be used to produce magnetic component(s) in any number of different combinations and configurations. For example, the inventors have further recognized and appreciated that laminate panel techniques may also be used to implement a low-field MRI system according to solenoid $B_0$ coil designs, wherein the $B_0$ field generated is oriented along the axis through the center of a solenoid coil, a design frequently used to implement high-field MRI systems. In particular, according to some embodiments, one or more solenoid-based coils may be formed on a plurality of connected laminate panels arranged to create a field of view through the center of the one or more solenoid-based coils in which an object to be imaged may be positioned.

Figure 12:
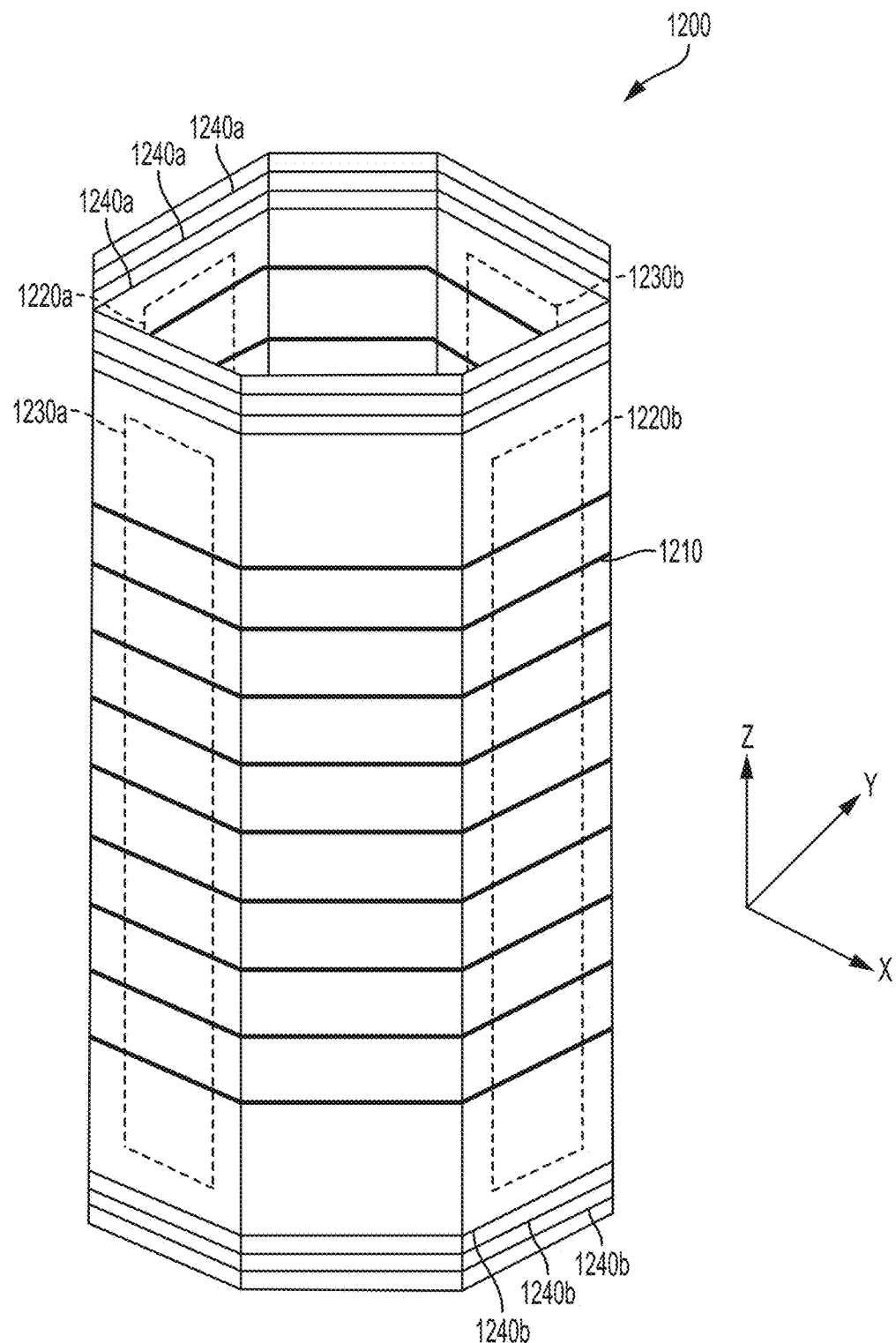
FIG. 12 shows a solenoid-based coil configuration for laminate panels formed using techniques described herein, in accordance with some embodiments.

FIG. 12 illustrates a magnetic apparatus 1200 comprising a plurality of laminate panels having magnetic components fabricated thereon, including a solenoid $B_0$ magnet for use in a low-field MRI, in accordance with some embodiments. As shown, magnet apparatus 1200 comprises eight connected laminate panels forming an octagonal tube in which an object to be imaged may be placed. The solenoid magnet includes a $B_0$ coil 1210 formed by connecting a plurality of conductive segments patterned on each of the laminate panels. The laminate panels may be connected in any suitable way to ensure a stable connection between the conductive segments formed on adjacent laminate panels (e.g., one or more conductive adhesives, portions capable of being snapped together or otherwise attached, or any other suitable connectors may be used to make appropriate electrical or mechanical connection between adjacent laminate panels). When connected and energized with a suitable current, conductive segments patterned on the laminate panels form a solenoid $B_0$ coil 1210 that generates a $B_0$ field in the longitudinal (Z) direction of magnetic apparatus 1200. It should be appreciated that the windings of $B_0$ coil 1210 are schematic to illustrate how a solenoid coil can be implemented via a plurality of laminate panels.

In the example in FIG. 12, magnetic apparatus 1200 also includes x-gradient coils 1220a, 1220b formed on opposing laminate panels and configured to generate a gradient magnetic field in the x-direction and y-gradient coils 1230a, 1230b formed on opposing laminate panels and configured to generate a gradient magnetic field in the y-direction. Additionally, magnetic apparatus 1200 also includes z-gradient coils 1240a, 1240b having a solenoid geometry similar to $B_0$ coil 1210, but formed at the ends of magnetic apparatus 1200 and configured to, for example, enable slice selection in the z-direction. The geometry and configuration of the gradient coils is exemplary and gradient fields may be generated using other patterns of conductors, as the aspects are not limited in this respect.

It should be appreciated that the laminate panels illustrated in FIG. 12 represent laminate panels having any desired number of layers. That is, each laminate panel may include a single layer or each laminate panel may comprise multiple layers, with each of the multiple layers having formed thereon all or a portion of one or more low-field MRI components, as the desired magnetic components may be fabricated according to any desired configuration. For example, $B_0$ coil 1210 may be formed by not only connecting conductive segments on multiple laminate panels as shown in FIG. 12, but by also connecting conductive segments formed in multiple layers of each laminate panel.

Because the laminate techniques described herein for manufacturing components of a low-field MRI system are highly configurable, any desired geometry and/or size of conductive segments may be used to provide a magnetic apparatus according to a desired design, and the configuration and arrangement illustrated in FIG. 12 is provided merely to illustrate an example in accordance with some embodiments. For example, laminate panels can be formed to any size and shape and connected together to create a desired geometry. As such, a laminate panel system may be produced that conforms to desired portions of the body and that have patterned thereon any one or combination of magnetic components and/or electronic components. According to some embodiments, the techniques described in connection with FIG. 12 may be used to construct a laminate-based system for imaging desired anatomy, wherein any desired combination of magnetic components may be fabricated on a series of connected laminate panels having a geometry formed around and configured to accommodate the desired anatomy. For example, a series of connected laminate panels may be constructed to image the head, as discussed in further detail in connection with FIGS. 22A-22C described below.

Figure 13:
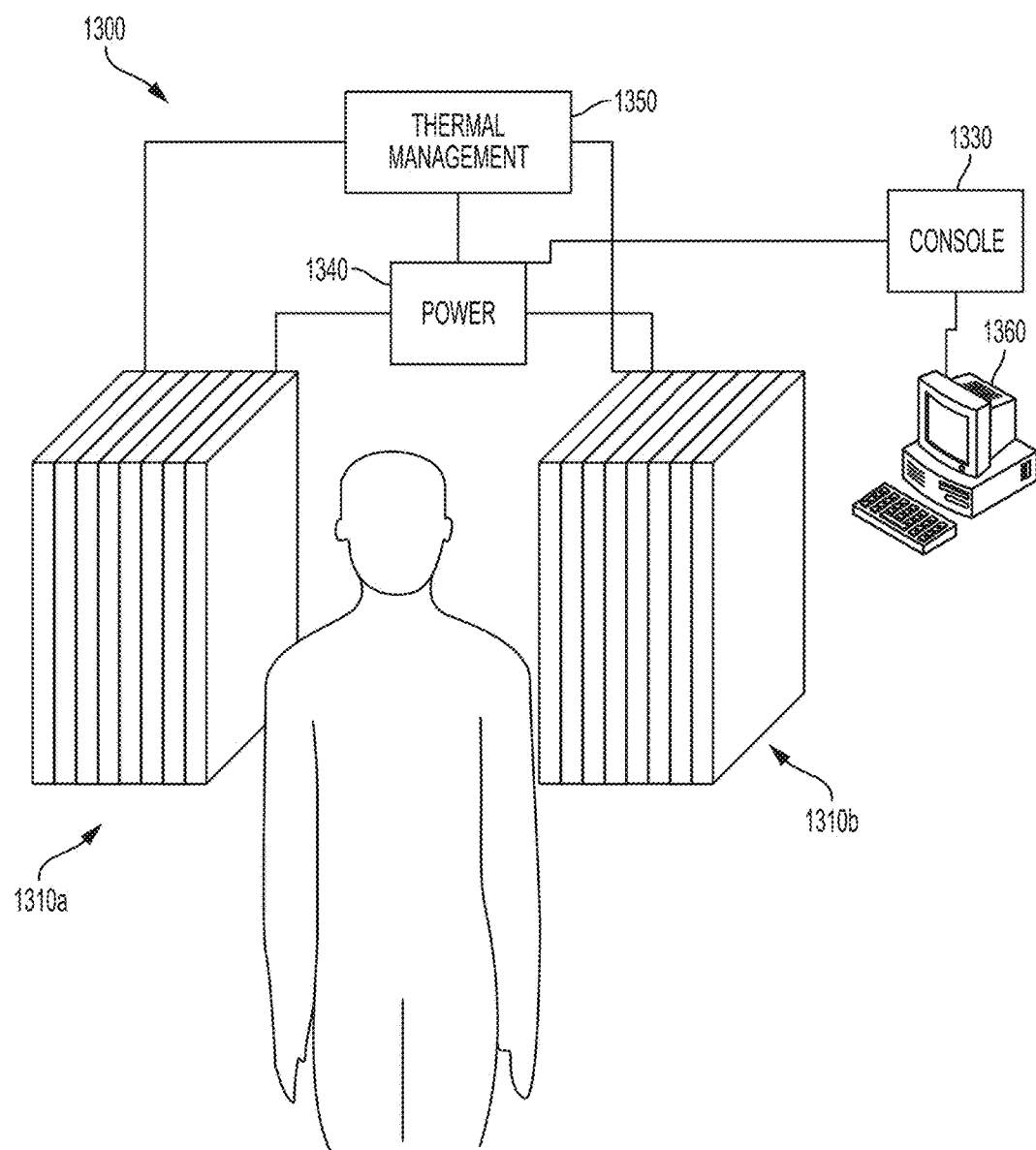
FIG. 13 shows a block diagram of exemplary components of a low-field MRI system, in accordance with some embodiments.

As discussed in the foregoing, laminate techniques may be utilized in numerous ways to produce one or more magnetic components of a low-field MRI system. An exemplary low-field MRI system utilizing laminate panels produced using laminate techniques described herein is illustrated in FIG. 13. In particular, FIG. 13 schematically illustrates components of a low-field MRI system 1300 in which laminate panels 1310a, 1310b having one or more magnetic components of the low-field MRI system fabricated thereon are utilized. It should be appreciated that the bi-planar arrangement of magnetic components illustrated in FIG. 13 is similar to that shown in FIG. 1, but with one or more magnetic components provided via laminate panels 1310a, 1310b using laminate techniques rather than producing the magnetic components using conventional techniques. For example, one or more magnetic components produced using conventional techniques such as $B_0$ coils 110a, 110b and/or gradient coils 120a, 120b in FIG. 1 have been replaced with integrated magnetics in laminate panels 1310a, 1310b.

In the exemplary system illustrated in FIG. 13, laminate panel 1310a may integrate one or more $B_0$ coils and/or one or more gradient coils to form one "side" of a bi-planar coil arrangement, and laminate panel 1310b may similarly integrate one or more $B_0$ coils and/or one or more gradient coils to form the other "side" of the bi-planar arrangement. As such, a bi-planar $B_0$ magnet may be produced using laminate techniques that, when operated, generates a $B_0$ field between the panels suitable for performing low-field MRI. Gradient coils for spatially encoding emitted MR signals may also be integrated within laminate panels 1310a, 1310b using laminate techniques. It should be appreciated from the foregoing that other magnetic and/or electronic components may be fabricated within laminate panels 1310a, 1310b including, but not limited to, one or more transmit/receive coils, one or more shim coils, shielding, power electronics, thermal dissipation components, etc.

As discussed above, providing integrated magnetics in laminate panel form may avoid one or more drawbacks of conventional manufacturing techniques including, but not limited to, relatively difficult and sensitive coil winding and alignment, post-production alignment of magnetic components, portability, limitations on post-production configuration and calibration, etc. Furthermore, providing one or more magnetic components integrated in laminate panel form may also provide flexibility, reliability and/or scalability advantages that may simplify the design, manufacture and installation of low field MRI systems. Integrated magnetics using laminate techniques may offer further benefits including, but not limited to, flexibility of design with respect to geometry and configuration, the ability to customize magnetics for particular applications, reduced cost, increased portability and/or compactness of a low field MRI system.

It should be appreciated from the foregoing discussion that laminate panels (e.g., laminate panels 1310a, 1310b) may integrate any one or combination of $B_0$ coils, gradient coils, transmit/receive coils, shim coils, and electromagnetic shielding, and are not limited for use with any particular one or combination of magnetic components (or portions thereof). Any one or more magnetic components that are not integrated therein, may be provided using any other available techniques (e.g., one or more magnetic components may be provided using conventional techniques for producing the respective magnetic component).

Figure 14A:
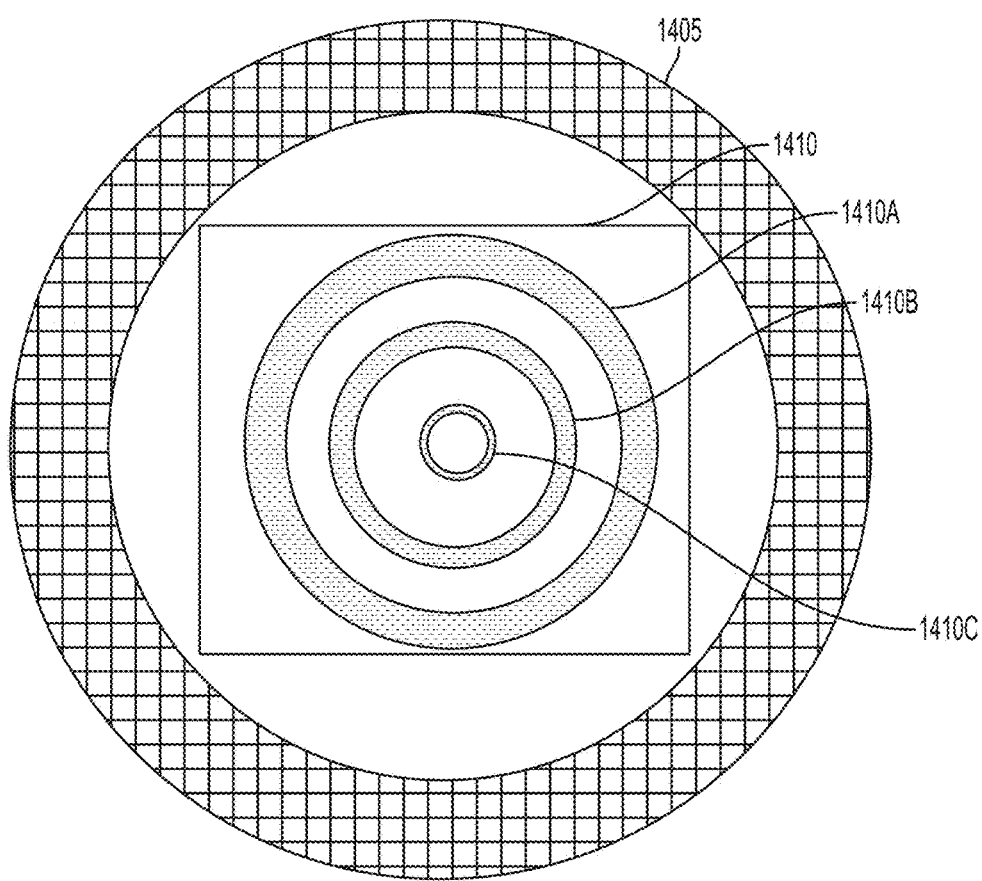
FIGS. 14A-14D illustrate hybrid designs for a $B_0$ magnet in accordance with some embodiments.

According to some embodiments, a magnetic component may be produced using a hybrid technique, wherein a portion of the magnetic component is fabricated in laminate panel form and a portion of the magnetic component is manufactured using a different technique. For example, FIG. 14A illustrates a hybrid design for a $B_0$ coil, in accordance with some embodiments. The hybrid design includes a coil 1405 and a laminate panel 1410 having integrated therein coils 1410A, 1410B and 1410C. Coil 1405 may be a wound coil as discussed above in connection with FIG. 1, or may be one or more stacked metal plates that, when energized, produces a magnetic field that contributes to a $B_0$ field suitable for low field MRI. A coil formed by a wound conductor refers to a coil produced by winding a conductor, such as wire, to form an electromagnet, and is contrasted by coils produced using laminate techniques that instead pattern the conductor to form the coil. Similarly, coils 1410A, 1410B and 1410C patterned on layers of laminate panel 1410, when energized, produce a magnetic field that contributes to a $B_0$ field suitable for low field MRI. The example hybrid design illustrated in FIG. 14A may represent one side of a bi-planar design or a component or facet in any of the geometries described herein. As such, a $B_0$ magnet may be constructed using laminate and non-laminate techniques to produce a desired $B_0$ field suitable for performing low-field MRI.

It should be appreciated that laminate panel 1410 is illustrated schematically to be representative of any desired laminate panel having any number of coils distributed over any number of laminate layers. For example, laminate panel 1410 may include one or more B0 coils (e.g., B0 correction or shim coils), one or more gradient coils and/or one or more Tx/Rx coils, as the aspects are not limited in this respect. It should be further appreciated that laminate panel 1410 need not be sized as shown in FIG. 14A relative to coil 1405 and may be of any size and positioned in any manner relative to coil 1405, as the hybrid design illustrated in FIG. 14A is merely an example of how a laminate panel may be used in conjunction with one or more coils formed using non-laminate techniques (e.g., a wound copper coil, copper plate coil, etc.) to generate a desired $B_0$ field, desired gradient field and/or desired RF field.

Figure 14B:
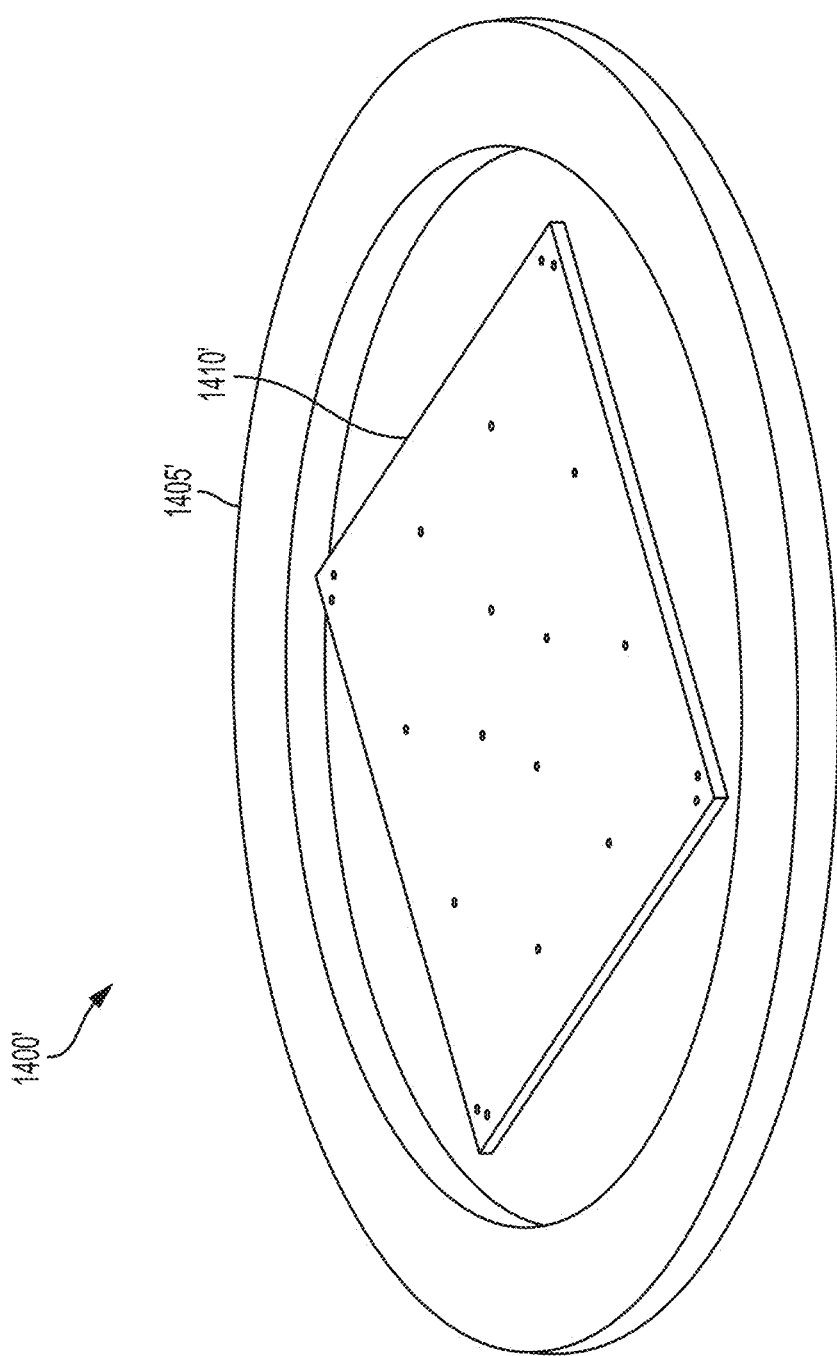

FIG. 14B illustrates a portion of a hybrid magnet, in accordance with some embodiments. Hybrid magnet 1400' comprises a coil 1405' configured to produce a magnetic field that contributes to a $B_0$ field of a desired field strength and/or homogeneity. Coil 1405' may be a coil formed by a conductor (e.g., a wound copper conductor, copper plate, etc.) provided using a number of turns (e.g., approximately 10, 50, 100, 150, 200, 250, 500 or more turns) suitable for a particular design and/or desired field strength, inductance, resistance, power requirements, etc. Coil 1405' may be constructed to any desired size. For example, an exemplary coil 1405' may have an inner diameter ranging from 10 to 50 inches and an outer diameter ranging from 15 to 80 inches. It should be appreciated that these ranges are for illustration only and coil 1405' may be constructed to be larger or smaller than the above provided exemplary ranges. Coil 1405' may be wound using ribbon wire, circular wire, square wire or any other suitable conductor and may be of any suitable gauge. The conductor may be copper, aluminum or any suitable material, as the aspects are not limited in this respect.

Hybrid magnet 1400' also includes laminate panel 1410' having a plurality of laminate layers with one or more magnetic components patterned respectively thereon. For example, according to some embodiments, laminate panel 1410' comprises a plurality of layers, each having a B0 coil (e.g., a supplemental, correction or shim coil) or portion thereof patterned thereon that can be operated, in some cases selectively, to contribute a respective magnetic field to achieve a $B_0$ field of desired strength and/or homogeneity. Additionally or alternately, laminate panel 1410' may comprise a plurality of layers, each having a gradient coil or portion thereof patterned thereon to produce a gradient magnetic field in the x, y and/or z direction. According to some embodiments, laminate panel 1410' comprises one or more layers patterned with an X-gradient coil, a Y-gradient coil and a Z-gradient coil, respectively, to provide gradient fields in three dimensions. Laminate panel 1410' may also include other magnetic components (e.g., one or more radio frequency coils) patterned on one or more layers, as the aspects are not limited in this respect.

It should be appreciated that laminate panel 1410' may include any one or combination of magnetic components and/or electronic components fabricated thereon using any of the techniques described herein or using any other suitable technique. For example, laminate panel 1410' may include any of the types and combinations of magnetic components illustrated in FIGS. 4, 5, 9A-C, 10 and 11A-B and described in the accompanying description. Laminate panel 1410' may include other components as well, such as electronic components, shielding, passive elements, etc.

Laminate panel 1410' can be of any suitable geometry and dimension. In particular, an exemplary square laminate panel may have dimensions ranging from 8"×8" to 50"×50". For example, an exemplary laminate panel may have dimensions of approximately 16"×16", 22"×22" or any other suitable dimension for a given design. Exemplary non-square panels may be similarly dimensioned. Laminate panel 1410' may be fabricated with any number of layers (e.g., approximately 10, 20, 30, 50 or more layers) on which any desired magnetic component may be patterned, either in full or in part. The patterned layers may be formed from copper, aluminum or other suitable material having a thickness appropriate for the magnetic component(s) fabricated thereon and in view of the desired operating characteristics. For example, heavy copper (e.g., 5 ounce, 6 ounce, 7 ounce, 8 ounce, 10 ounce, etc.) may be used to pattern one or more magnetic components and/or extreme copper (e.g., 20 ounce, 25 ounce, 30 ounce, 50 ounce, etc.) may be used to pattern one or more magnetic components. However, other thicknesses of conducting material may be used, as the aspects are not limited in this respect. The total thickness of the laminate panel 1410' will depend, at least in part, on the number of layers utilized, exemplary thicknesses range from 0.1" to several inches.

Hybrid magnet 1400' may be a single-sided magnet or may be one side of a bi-planar magnet. In the latter case, the other side of the hybrid magnet may similarly comprise a coil 1405' and/or a laminate panel 1410' having one or more magnetic components patterned thereon. In some embodiments, the other side of the bi-planar magnet may not include a laminate panel. In this respect, the respective sides of a bi-planar coil may be identical in construction or may be different (e.g., may include the same or different components or number of components). As such, a bi-planar coil may be symmetric or asymmetric, as the aspects are not limited in this respect. A hybrid magnet may be designed to produce any desired field strength. For example, a hybrid magnet may be configured to produce a field strength of approximately 5 mT, 10 mT, 20 mT, 50 mT, 100 mT, 200 mT or more.

Figure 14C:
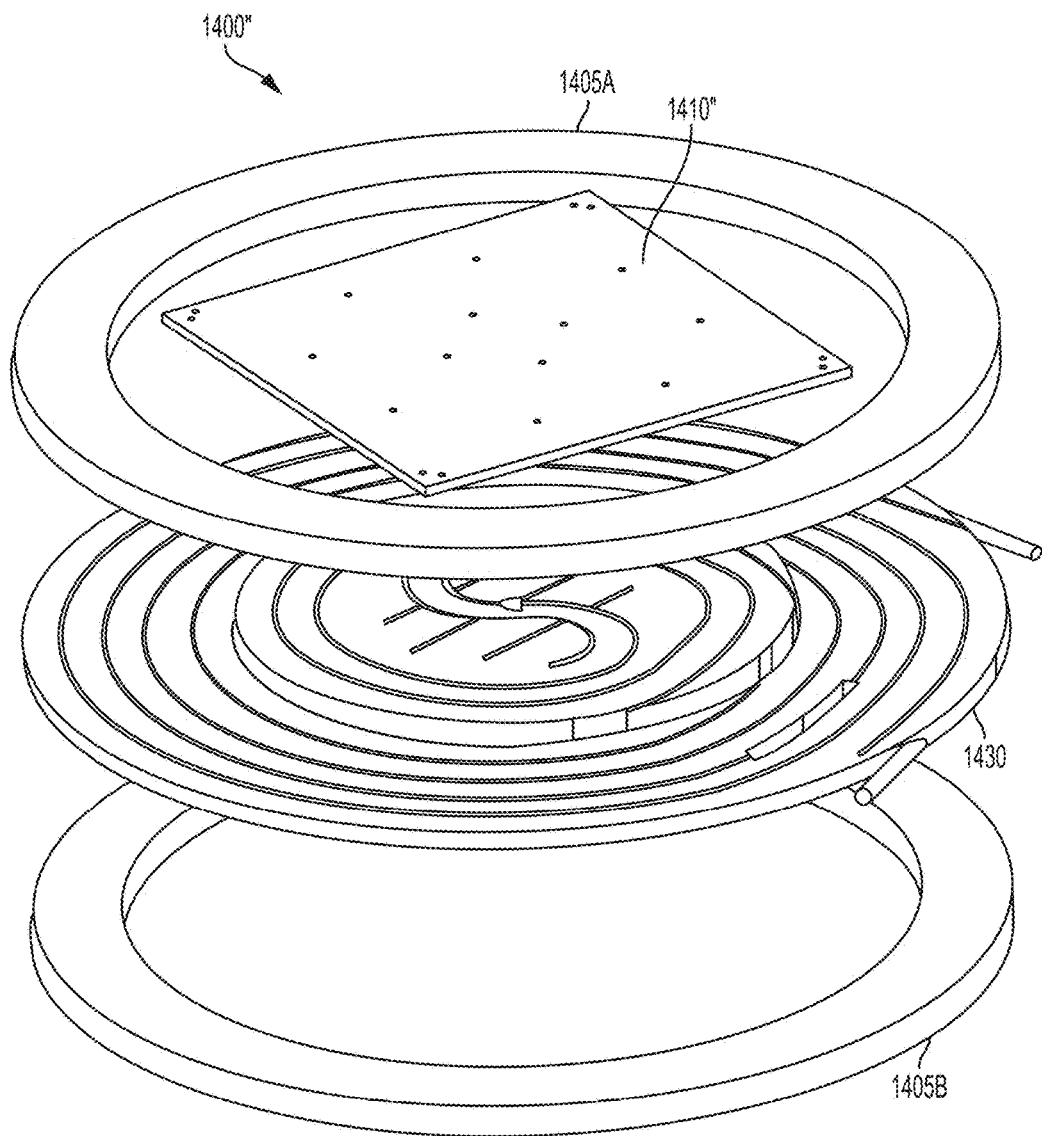

FIG. 14C illustrates a hybrid magnet, in accordance with some embodiments. Hybrid magnet 1400" includes a coil 1405A, which may be similar to or the same as coil 1405' described in connection with hybrid magnet 1400' in FIG. 14B, and laminate panel 1410" which may be similar to or the same as laminate panel 1410' described in connection with hybrid magnet 1400' in FIG. 14B. In addition, hybrid magnet 1400" includes coil 1405B, which also may be similar to or the same as coil 1405'. As a result, hybrid magnet 1400' comprises two coils 1405A and 1405B that contribute magnetic fields to facilitate producing a $B_0$ field of desired strength and/or homogeneity. As illustrated in FIG. 14C, a thermal management component 1430 is also provided between coils 1405A and 1405B to remove heat from the coils and laminate panel 1410" during operation. Various details of thermal management component 1430 are described in a concurrently filed application.

Figure 14D:
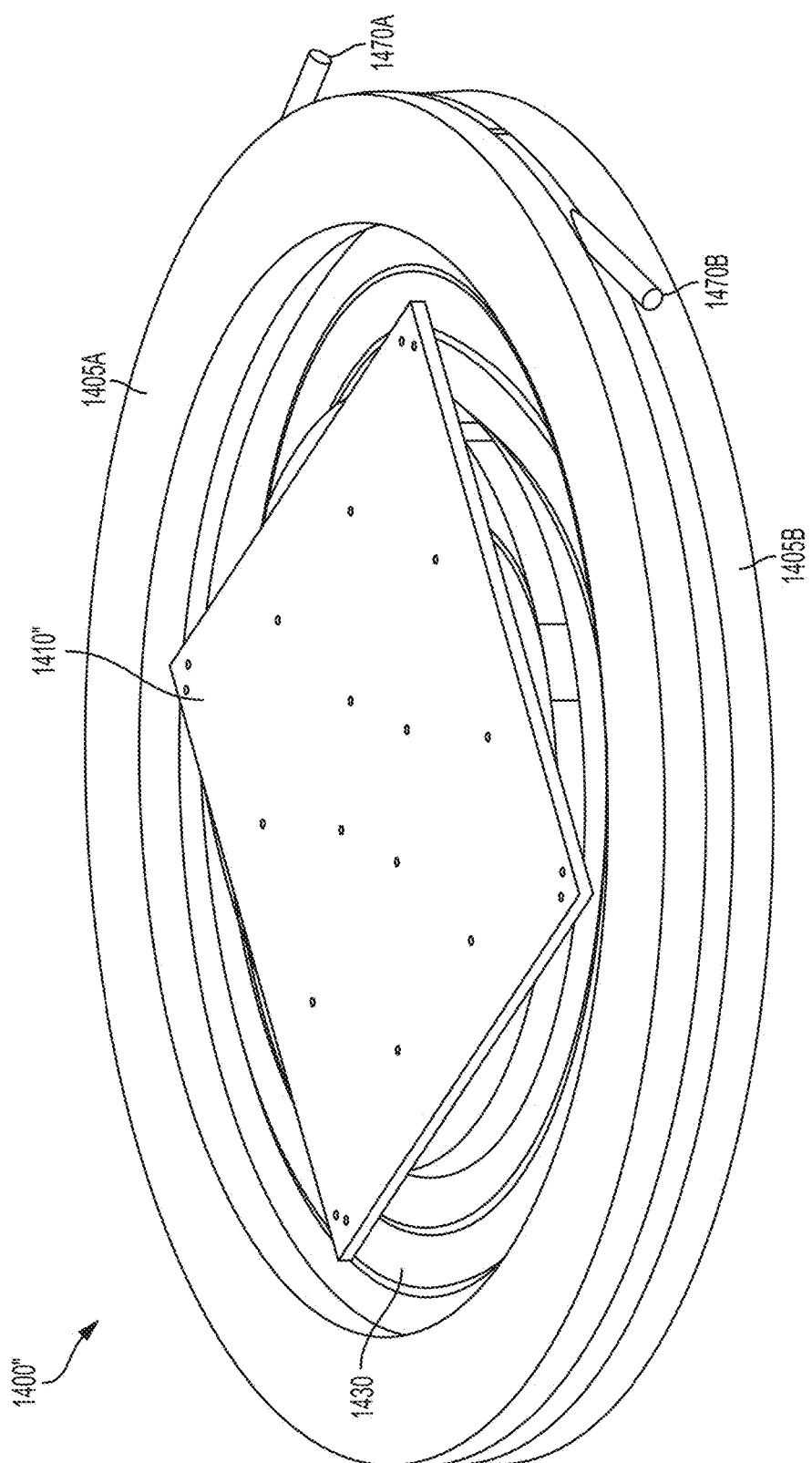

FIG. 14D illustrates hybrid magnet 1400" after the components have been affixed, attached or otherwise connected to one another. As shown, thermal management component 1430 is sandwiched between, and in thermal contact with, coil 1405A, coil 1405B and laminate panel 1410" to draw heat away from these components during operation. For example, a coolant (e.g., a cooling liquid or gas) may be circulated through thermal component 1430 via inlet 1470A and outlet 1470B to absorb heat and transfer it away from the magnetic components. As discussed above, hybrid magnet 1400" may be a single-sided magnet or may be one side of a bi-planar magnet. Some embodiments that utilize hybrid magnet 1400" in a bi-planar configuration are described in further detail below. Table 1 illustrates an exemplary construction of a bi-planar magnet, in accordance with some embodiments.

TABLE 1

| Exemplary Hybrid Magnet | |
|---|---|
| Field Strength | 20 mT |
| Current | 30.1 Amps |
| Total Power Dissipation | ~2.4 kW |
| Inductance | 251 mH |
| Wound Coils (4) | |
| Conductor | 1" × 0.016" ribbon wire |
| Turns | 155 |
| Inner Diameter | 25.610" |
| Outer Diameter | 31.5" |
| Thickness | .1" to 8" |
| Insulation | Mylar |
| Printed Circuit Board | |
| Conductor | 6 oz copper weight per layer (0.00084") |
| Shim Coils | 20 layers |
| Gradient Coils | 6 layers |
| Insulation | Arlon 92ML and FR4 dielectric cores and fill layers |
| Dimensions | 16" × 16" |
| Total Thickness | ~.380" |

It should be appreciated that the construction details listed in Table 1 are merely exemplary and provided merely as illustration. A hybrid magnet may be constructed in numerous other ways to meet the design constraints of a given application of an MRI system. It should be further appreciated that the arrangement and geometry of the coils and/or laminate panel is not limited to those depicted. Furthermore, the magnetic components implemented using conventional manufacturing techniques and those implemented using laminate panel techniques are not limited to the combinations discussed herein, as hybrid techniques may be used to produce the magnetic components of a low-field MRI system in any combination.

The inventors have further appreciated that the ability to incorporate magnetic components in laminate panels in any desired arrangement or combination allows for numerous different geometries (e.g., of different shapes and/or sizes) to be realized to facilitate developing low-field MRI apparatus tailored for particular MRI applications. Moreover, the inventors have recognized that producing magnetics using laminate panels may facilitate the manufacture of relatively low cost and/or cartable or otherwise portable low-field MRI systems. Furthermore, producing magnetics in panel form allows for manufacture of foldable and/or deformable MRI magnetic components, which facilitates both portability/cartability as well as the ability to construct MRI magnetics specific for particular MRI applications or to facilitate imaging specific portions of the body, as discussed in further detail below. Thus, producing MRI magnetics (or portions thereof) using laminate panels as described herein has the ability to fundamentally change how MRI can be used in the medical or clinical setting and revolutionize the MRI industry with far-reaching impact, greatly expanding the circumstances and situations for which MRI can be utilized.

Figure 15A:
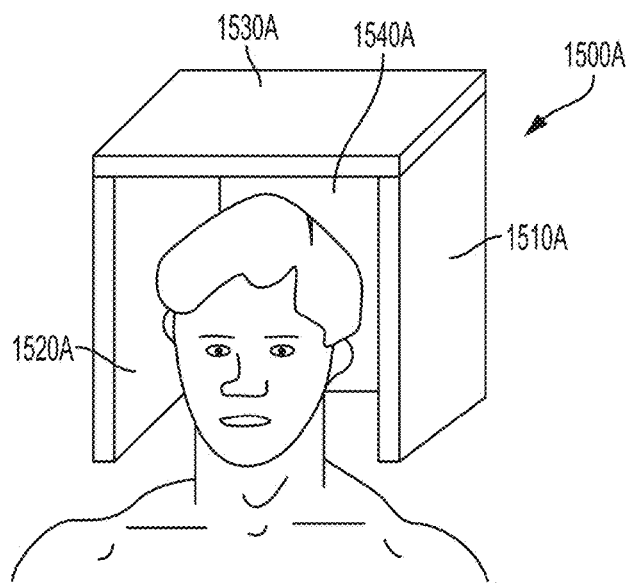
FIGS. 15A-15C illustrate exemplary configurations for laminate panels formed using techniques described herein, in accordance with some embodiments.
Figure 15B:
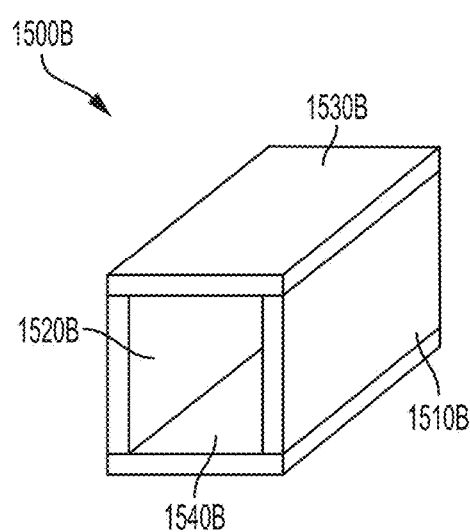
Figure 15C:
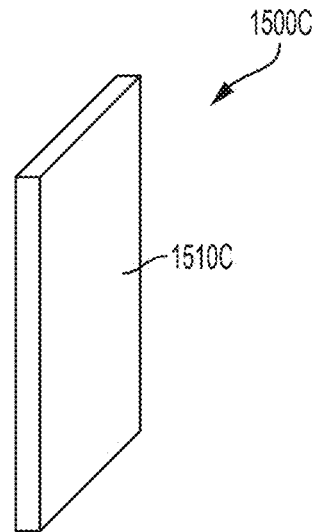

Laminate panels may be produced and arranged in a variety of geometries to facilitate the construction of a desired low-field MRI system. For example, FIG. 13 illustrates laminate panels arranged in a generally bi-planar arrangement. In some embodiments, laminate panels are arranged in different geometries, for example, to produce low-field magnetics configured for particular types of imaging and/or to image particular anatomy of interest. FIGS. 15A-C illustrate exemplary geometries in accordance with some embodiments. In FIGS. 15A-C, laminate panels are illustrated schematically and it is to be understood that the illustrated laminate panels generically represent laminate panels having any desired number of layers with any desired one or combination of magnetic components formed thereon in any desired arrangement. FIG. 15A illustrates an exemplary laminate panel geometry 1500A comprising four connected laminate panels arranged to facilitate low-field MRI of the head. The laminate panels are arranged and connected generally to accommodate the head so that desired portions of the head are within the field of view of the resulting $B_0$ field. The laminate panels may be connected, attached or affixed to one another in any suitable way including, but not limited to, by an adhesive, by one or more connectors, by one or more hinges, and/or by any combination thereof, or any other suitable method.

In geometry 1500A, one or more of the laminate panels illustrated integrate magnetics components of a low-field MRI system in any of the various combinations discussed herein. For example, in one implementation, each of laminate panels 1510A and 1520A may comprise at least one layer having formed thereon all or a portion of a $B_0$ coil used to generate a $B_0$ field for a low-field MRI system. In such an implementation, the pair of panels 1510A, 1520A may be arranged in the bi-planar geometry previously described with respect to FIG. 13, and sized to provide a field of view that accommodates the head. Laminate panels 1530A and 1540A may include one or more other components of the low-field MRI system (e.g., one or more gradient coils, transmit received coils, shim coils, etc.) or themselves may include all or a portion of a $B_0$ coil to contribute to the generation of a desired $B_0$ field. Adding additional $B_0$ coils may allow for the relaxation of the power requirements for each $B_0$ coil without compromising $B_0$ field strength or homogeneity. Alternatively, one or both of panels 1530A and 1540A may not include any low-field MRI magnetic components, but may be fabricated to include supporting electronics, such as power or control electronics, may include thermal management components, shielding and/or may be provided for structural support.

It should be appreciated that the geometry illustrated in FIG. 15A is exemplary and other arrangements are possible. For example, the panels may be dimensioned to accommodate the head such that the person being scanned faces one of the side panels (e.g., panels 1510A or 1520A). Alternatively, a further panel connected to at least one of panels 1510A, 1520A, and 1530A may be included to fully or partially enclose an object (e.g., a patient's head) to be imaged. Such a geometry provides an additional laminate panel directly opposed to panel 1540, which may be used to form one or more low-field MRI components thereon. In some embodiments, at least one of the laminate panels may comprise or have mounted thereon a visual display that enables a person being imaged to view visual images (e.g., pictures or video). Any suitable visual display including, but not limited to, a liquid crystal display, may be used for this purpose.

The general configuration illustrated in FIG. 15A can also be used in conjunction with a helmet comprising transmit/receive coils, for example, any of various form fitting helmets having generally spiral shaped coils formed on or within the helmet to provide a $B_1$ field according to a desired acquisition sequence and to detect MR signals emitted in response. The laminate panels forming magnetic components of a low-field MRI system (e.g., a $B_0$ magnet, gradient coils, etc.) may be constructed to accommodate the helmet such that the wearer of the helmet can be positioned inside the field of view of the $B_0$ field generated when the laminate panel(s) are operated. Alternatively, laminate panel(s) having magnetic components for generating a $B_0$ field and corresponding gradient fields may be integrated with a helmet having transmit/receive coils (e.g., a helmet wound with appropriate transmit/receive coils) to form the magnetics of a single generally integrated head scanner for low-field MRI.

FIG. 15B illustrates a further exemplary arrangement of panels dimensioned, for example, to accommodate other anatomy. As shown, laminate panels 1510B, 1520B, 1530B and 1540B are arranged to form an open-ended rectangular tube. The relative dimensions may be selected to allow a person to place all or a portion of an extremity or appendage (e.g., a hand, a foot, an arm, a leg, etc.) within the field of view of the magnetic field generated. It should be appreciated that the magnetic components may be fabricated in laminate panel form using any one or combination of configurations discussed herein. Furthermore, the laminate panels in FIG. 15B may be dimensioned to accommodate any desired anatomy (or other object), including increasing the size of the panels and relative dimensions to accommodate the torso or whole body of a person being imaged. It should be further appreciated that laminate panels fabricated with one or more magnetic components may be arranged in other configurations and geometries to produce, at least in part, a desired general purpose low-field MRI system, or a system configured for imaging particular objects or anatomy and/or to facilitate particular imaging applications, as discussed in further detail below.

FIG. 15C illustrates a planar configuration, in accordance with some embodiments. In particular, planar geometry 1500C illustrated in FIG. 15C may be realized by a single laminate panel 1510C having formed thereon one or more magnetic components for producing a $B_0$ field suitable for low-field imaging of objects placed proximate laminate panel 1510C. Planar geometry 1500C facilitates, for example, performing low-field MRI in circumstances wherein the object being imaged cannot be conveniently placed within or between multiple panels and/or where multiple panel geometries are otherwise inconvenient or unnecessary, or a further reduced cost solution is desirable. Laminate panel 1510C may be sized as appropriate to produce a generally hand-held device that can be held proximate an object being imaged (e.g., near a particular portion of the anatomy for which low-field MRI is desired). Alternatively, laminate panel 1510C may be sized so that a patient stands or sits next to the laminate panel to perform low-field MRI. It should be appreciated that laminate panel 1510C may be produced in any desired size and/or shape to produce a planar geometry device for particular imaging applications (e.g., tailored for imaging particular anatomy or portions of anatomy), as the aspects are not limited in this respect.

The techniques described herein may be used to produce magnetic components for a low-field magnetic resonance system configured to generate a $B_0$ field of a given field strength (e.g., a field strength of less than or equal to approximately 0.2 T, less than or equal to approximately 0.1 T, less than or equal to approximately 50 mT, less than or equal to approximately 20 mT, less than or equal to approximately 10 mT, etc). In some embodiments (e.g., embodiments that include ferromagnetic augmentation to increase field strength), the $B_0$ field of the low-field MRI system could potentially exceed 0.2 T.

As discussed above, the inventors have recognized that laminate techniques may be utilized to produce magnetics for low-field MRI systems. To describe additional aspects, further detail is provided in connection with an exemplary low-field MRI system. Briefly, referring back to FIG. 13, low-field MRI system 1300 further illustrates a number of other components that operate in conjunction with the magnetic apparatus to facilitate low-field MRI. In particular, exemplary low-field MRI system 1300 also comprises console 1330, which may include one or more processors programmed to generate MRI pulse sequences used to acquire data using low-field MRI system 1300 and/or console 1330 may be configured to perform any other suitable operation. In some embodiments, console 1330 may be configured to receive MR data detected by one or more receive coils (which may be integrated within laminate panels 1310a, 1310b, or provided in a different manner such as via a helmet worn by the user, as discussed in further detail below) and provide the received MR data to workstation 1360 for processing the data (e.g., to reconstruct one or more MRI images). Low-field MRI system 1300 also includes power management system 1340, which includes electronics to provide operating power to one or more components of the MRI system. For example, as discussed in more detail below, power management system 1340 may include one or more power supplies, gradient power amplifiers, transmit coil amplifiers, and/or any other suitable power electronics needed to provide suitable operating power to energize and operate components of the system (e.g., power supplies needed to provide appropriate current to magnetic components integrated within laminate 1310a, 1310b).

Additionally, low-field MRI system 1300 may also include thermal management system 1350 configured to facilitate the transfer of thermal energy generated by one or more components of the MRI system away from those components. In some embodiments, thermal management system 1350 may include components that are integrated with laminate panels 1310a, 1310b. For example, laminate panels 1310a, 1310b may include one or more laminate layers configured to dissipate heat, for example, using any of various heat sinks, etc. Adhesives used in the fabrication of laminate layers may be selected to have thermal absorption and/or dissipation properties to assist with management of heat generated by magnetic components. Thermal management system 1350 may include, without limitation, thermal management components to perform water-based or air-based cooling, which may be integrated with or arranged in close proximity to MRI components that generate heat including, but not limited to, $B_0$ coils, gradient coils, and/or transmit/receive coils. Components of thermal management system 1350 may include any suitable heat transfer medium including, but not limited to, air and water, to transfer heat away from components of the low-field MRI system.

Figure 16:
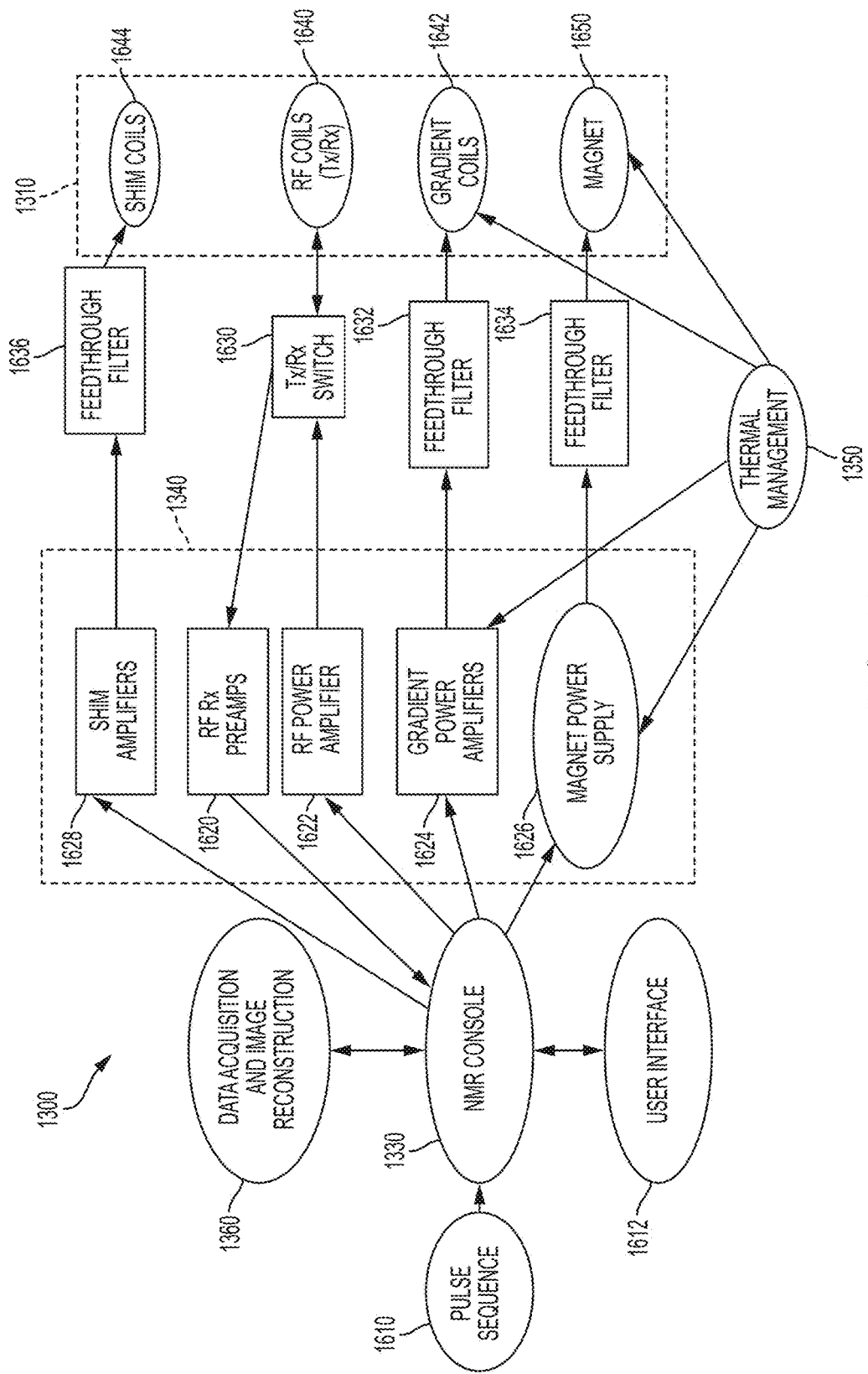
FIG. 16 is a schematic block diagram of components of a low-field MRI system, in accordance with some embodiments.

FIG. 16 shows a schematic block diagram that expands on the system diagram shown in FIG. 13 by providing more detail on exemplary components of a low-field MRI system 1300, in accordance with some embodiments. System 1300 includes MR console 1330 having control electronics to send instructions to and receive information from power management system 1340. MR console 1330 is configured to receive or programmed to implement one or more pulse sequences 1610, which are used to determine the instructions sent to power management system 1340 to operate the coils in a desired sequence. MR console 1330 also interacts with workstation 1360 programmed to perform data acquisition and/or image reconstruction based on received MR data. Console 1330 may provide information about one or more pulse sequences 1610 to workstation 1360 to facilitate a data acquisition and/or image reconstruction process. A user may interact with console 1330 via user interface 1612. Any suitable user interface may be used, and embodiments are not limited in this respect.

Power management system 1340 includes electronics to provide operating power to magnetic components 1310 of the low-field MRI system 1300 and electronics to amplify MR signals received from magnetics components 1310. The shading of the components in power management system 1340 represents whether the component has generally lower-power requirements (light shading) or generally higher-power requirements (dark shading). As shown, power management system 1340 includes radio-frequency (RF) receive (Rx) pre-amplifiers, which amplify MR signals detected by one or more RF receive coils (e.g., RF Rx coil 1640). Power management system 1340 also includes RF power amplifier 1622 configured to provide power amplification to one or more RF transmit coils (e.g., RF Tx coil 1640).

As shown, power management system 1340 also includes gradient power amplifiers 1624 configured to drive one or more gradient coils 1642. As discussed above, MRI systems often include three sets of gradient coils arranged to provide MR gradients in three substantially orthogonal directions (X, Y, Z). Accordingly, in embodiments that use three sets gradient coils 1642, gradient power amplifiers 1624 may comprise three gradient power amplifiers, each to drive a respective one of the sets of gradient coils. Any suitable gradient power amplifiers 1624 may be used. In some embodiments, gradient power amplifiers 1624 may be a unipolar, pulsed gradient amplifier, however, any suitable gradient amplifier may be used. Power management system 1340 also includes magnet power supply 1626 configured to drive one or more $B_0$ coils (e.g., $B_0$ magnet 1650) to produce the main magnetic field for the low-field MRI system. In some embodiments, magnet power supply 1626 is a unipolar, continuous wave (CW) power supply, however, any suitable power supply may be used. Power management system 1340 may also include shim amplifiers 1628 arranged to independently operate shim coils 1644.

Low-field MRI system 1300 may also include a plurality of interface components interposed between power management system 1340 and magnetics 1310 including transmit/receive (Tx/Rx) switch 1630, and feed-through filters 1632 and 1634, which may be of any suitable design and/or type. Any suitable components may be used for these interface components, and embodiments are not limited in this respect.

As shown, magnetics 1310 includes RF Tx/Rx coils 1640, gradient coils 1642, and $B_0$ magnet 1650. As discussed above, one or more of these magnetics components may be formed on one or more layers of a laminate panel using the laminate techniques described herein. Although not shown, magnetics 1310 may have incorporated therewith electromagnetic shielding configured to reduce electromagnetic interference from adversely affecting the operation of the MRI system. Any suitable shielding may be used including, but not limited to, using one or more shielding layers of a laminate panel, as described above.

Low-field MRI system 1300 also may include thermal management system 1350 configured to provide cooling for components of the system. In some embodiments, at least a portion of thermal management system 1350 may be integrated with one or more magnetics components 1310 formed on layer(s) of laminate panel(s), as discussed above. Thermal management system 1350 may include any suitable components including, but not limited to, gas-cooled (e.g., air-cooled) systems, liquid-cooled (e.g., water-cooled) systems, one or more fans, thermal adhesive or other substances used to manufacture laminate panels or other components of system 1300, etc. As shown, thermal management system 1350 is configured to manage thermal cooling of gradient coils 1642, $B_0$ magnet 1650, gradient power amplifiers 1624, and magnet power supply 1626. In some embodiments, one or more of these components may have at least a portion of thermal management system 1350 integrated with the component. Additionally, thermal management system 1350 may be configured to provide thermal management functions for components other than the illustrated components shown in FIG. 16, as thermal management system 1350 may be configured to provide thermal management as needed.

Figure 17:
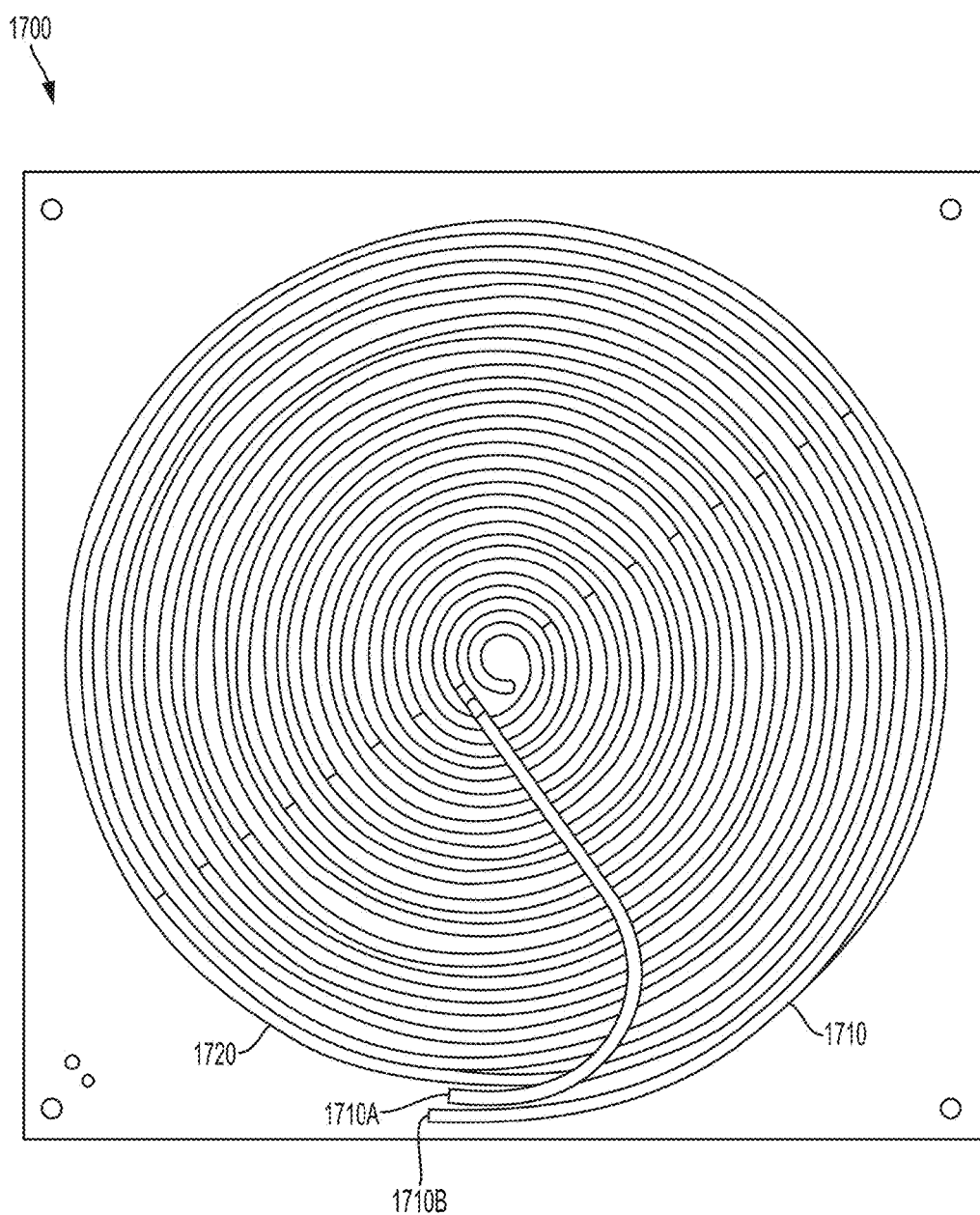
FIG. 17 illustrates a thermal management component, in accordance with some embodiments.

FIG. 17 illustrates a thermal management component, in accordance with some embodiments. Thermal management component 1700 may be suitable for transferring heat out and away from components of a low-field MRI system, for example, by dissipating heat generated by exemplary laminate panels 1310a, 1310b. Thermal management component 1700 comprises a copper tube or pipe 1710 configured in a spiral shape and affixed to a spiral shaped aluminum cold plate 1720. According to some embodiments, thermal management component 1700 is designed to be positioned to thermally couple to one or more laminate panels to transfer heat away from the laminate panel(s) during operation. According to some embodiments, copper tube 1710 is configured to connect to a source of water at either end 1710A or 1710B and deposit water via the other. Water (or any other fluid) running through copper tube 1710 absorbs heat from the one or components to which it is thermally coupled and carries it away to be deposited elsewhere.

The inventors have appreciated that the spiral shape of copper tube 1710 mitigates or eliminates eddy currents that often degrade the ability of conventional thermal management components to remove heat from a system. Due to its spiral shape, thermal management component 1700 may be particularly well-suited for removing heat from components that include time varying magnetic fields, such as those present in magnetic components of an MRI system. However, thermal management component 1700 may be utilized in connection with other types of components, as the spiral shaped geometry is not limited for use with any particular component.

It should be appreciated that thermal management component 1700 also is not limited for use with water, but can be used in conjunction with any fluid, including fluids in liquid or gas state, capable of absorbing and transporting heat. However, the ability to utilize water may facilitate deployment of a generally portable or "cartable" low-field MRI system having a thermal management component that can be connected to and utilize available water sources (e.g., any of the numerous cold water hook-ups available not only throughout medical facilities, but at small clinics, mobile facilities and elsewhere). Nevertheless, other cooling fluids such as liquid nitrogen, outgassing of solid carbon dioxide, refrigerated and compressed air, etc., may also be utilized by thermal management component 1700, as the aspects are not limited in this respect.

Figure 18:
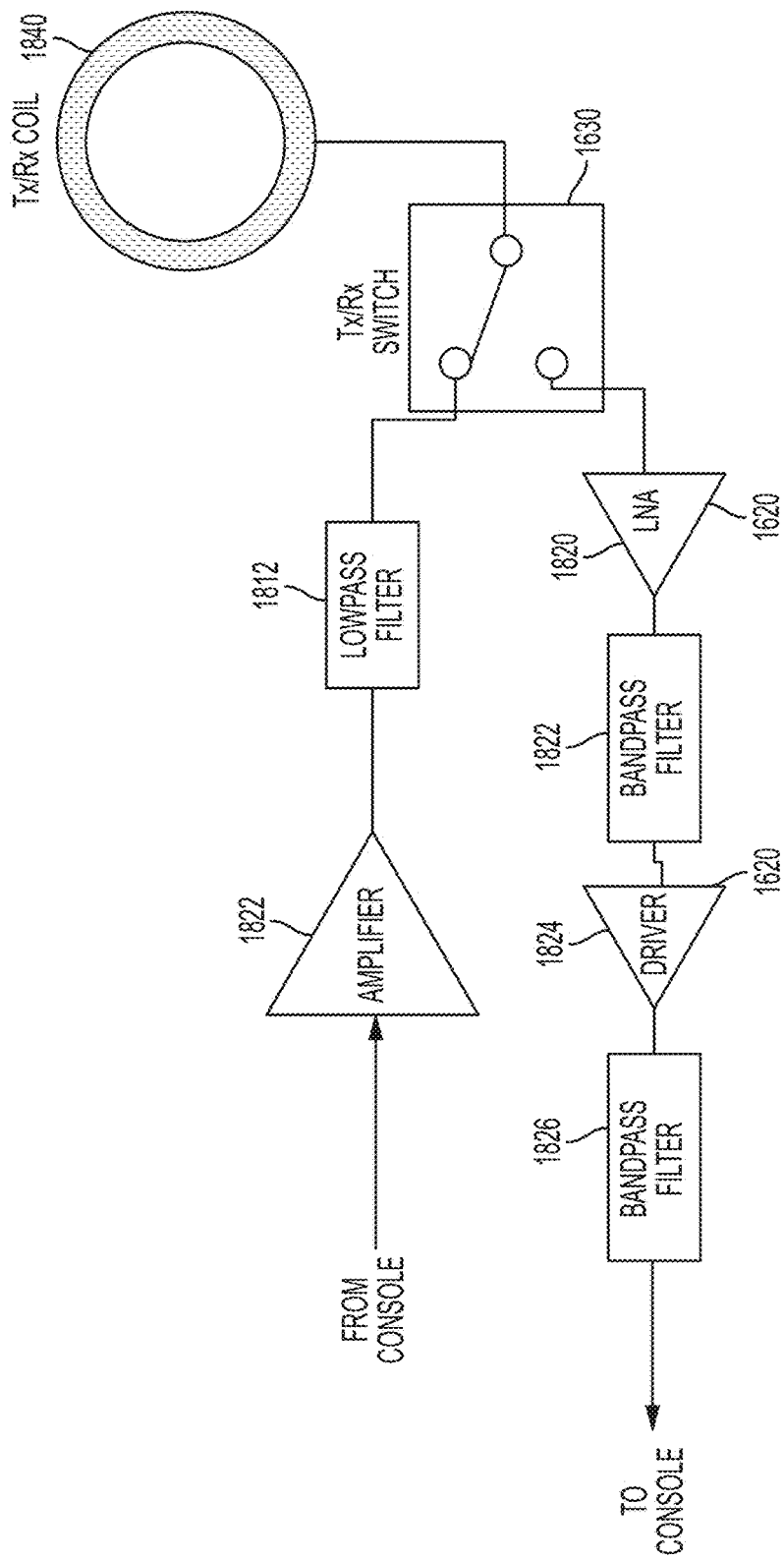
FIG. 18 is a block diagram of an RF signal chain for use with some embodiments.

FIG. 18 shows a more detailed block diagram of an RF signal chain including MR console 1330, RF Rx low noise amplifiers (LNAs) 1620, RF power amplifier 1622, Tx/Rx switch 1630, and RF Tx/Rx coils 1640 that may be used in accordance with some embodiments. In a first path shown at the top of FIG. 18, control instructions from the console are transmitted to power amplifier 1622. In some embodiments, power amplifier 1622 may be configured to have a power output of at least two watts. The output of power amplifier 1622 is sent to lowpass filter 1812. Lowpass filter 1812 may have any desired cutoff frequency (e.g., three MHz) to achieve the desired filtering. When Tx/Rx switch is set to the transmit (Tx) position, the filtered power output is provided to Tx coil 1640 to produce RF excitations.

During a receive operation, Tx/Rx switch 1630 switches to the receive (Rx) position, and RF signals detected by Rx coil 1640 are provided to low-noise amplifier (LNA) 1820, which amplifies the signals prior to filtering by bandpass filter 1822. Any suitable bandpass filter 1822 may be used. Following filtering by bandpass filter 1822, the filtered RF signals are further amplified by driver 1824, followed by additional bandpass filtering by filter 1826. The output of bandpass filter 1826 is provided to the console for further processing including, but not limited to, sending the amplified and filtered RF signals to workstation 1360 for data processing and image reconstruction. In some cases filters 1822 and 1826 may be low pass filters, high pass filters, or include a series of filters such as a low pass, high pass, and a notch, or any combination thereof. It should be appreciated that the RF signal chain illustrated in FIG. 18, and discussed above is merely one implementation of an RF signal chain that may be used with embodiments, and the techniques described herein are not limited for use with any particular RF signal chain or any particular implementation in this respect.

As discussed above, the inventors have recognized that characteristics of low-field MRI facilitate the implementation of substantially smaller installations that can be deployed in virtually any facility, and further allow for the development of portable or cartable low-field MRI systems, some embodiments of which are discussed in further detail below. Because such systems may be operating in different environments at different times, it may be advantageous to provide "in-field" and/or dynamic calibration of one or more components of the MRI system to adjust or optimize one or more magnetic fields for particular imaging application in the environment in which the MRI system is operating.

Calibration of a $B_0$ field of an MRI system can be accomplished, at least in part, by using shim coils, which can be adjusted to influence the homogeneity of the $B_0$ field produced by the main field coil. In some embodiments that include shim coils, calibration of the $B_0$ field may be performed in a similar manner by selectively activating shim coils to improve the homogeneity of the $B_0$ field. According to some embodiments, one or more sensors are used to determine system characteristics (e.g., homogeneity of a magnetic field, stability of the system) and/or characteristics of environmental noise, and the information from the sensors may be provided to the console, which can, in turn, tune the magnetic field by adjusting the operating parameters of the magnetics.

The inventors have recognized and appreciated that aspects of dynamic calibration are facilitated by the use of magnetics components manufactured in accordance with the laminate techniques described herein. In some embodiments, all or a portion of one or more magnetic components may be individually-controllable to enable tuning of magnetic fields prior to or during operation of the MRI system. For example, one or more layers of a laminate panel may have patterned thereon a plurality of shim coils that can be individually and independently controlled. The plurality of shim coils may be distributed in location and geometry such that the plurality of shim coils can be selectively operated to contribute to the $B_0$ field to achieve desired field strength and homogeneity for the particular environment and loading conditions in which the MRI system is operating. For example, in a given environment, the $B_0$ field resulting from the operation of the $B_0$ magnet may be evaluated and the plurality of shim coils selectively operated to contribute in such a way as to produce a suitable $B_0$ field in the given environment. According to some embodiments, measurement of a $B_0$ field and the subsequent selection of appropriate shim coils is performed by an automated process programmed to identify a generally optimal combination of shim coils to produce a $B_0$ field of desired strength and homogeneity in a given environment and/or under given loading conditions.

Other aspects of a low-field MRI system may also be tuned to address the characteristics of a particular environment. For example, in low field MRI, the AM frequency broadcast band (e.g., the band around 1000 kHz) may provide a source of interference for the transmit/receive coils. To address this noise source, the particular frequency bands of interest may be evaluated for activity and the magnetic components of the system tuned to operate such that detected interference is avoided to the extent possible. For example, the field strength of the $B_0$ field may be increased or decreased as appropriate so that the transmit/receive coils operate in a frequency band satisfactorily free from interference. That is, the system may be configured to detect noise and tune or configure one or more magnetic components of the MRI system to produce a desired magnetic field that reduces the impact of environmental noise. For example, the system may be configured to sweep through the electro-magnetic spectrum in a band of interest suitable for system operation to locate a portion of the spectrum having the least amount of electromagnetic noise or interference and to tune the system to operate at a frequency in this portion of the spectrum.

According to some embodiments, noise canceling may be performed by providing an auxiliary receive channel to detect ambient radio frequency interference (RFI). For example, one or more receive coils may be positioned proximate to, but outside, the field of view of the $B_0$ field to sample the RFI but not detect MR signals emitted by an object being imaged. The RFI sampled by the one or more auxiliary receive coils may be subtracted off the signal received by the one or more receive coils positioned to detect emitted MR signals. Such an arrangement has the ability to dynamically handle and suppress RFI to facilitate the provision of a generally transportable and/or cartable low field MRI system that likely to be subjected to different and/or varying levels of RFI depending on the environment in which the low field MRI system is operated.

Some embodiments may be configured to provide dynamic configuration of the MRI system by enabling the console to adjust the way that MRI sequences are used to generate images of a desired quality and resolution. Conventional MRI consoles typically operate by having a user select a pre-programmed MRI pulse sequence, which is then used to acquire MR data that is processed to reconstruct one or more images. A physician may then interpret the resulting one or more images. The inventors have recognized and appreciated that operating MRI systems using pre-programmed MRI pulse sequences may not be effective at producing an image of a desired quality. Accordingly, in some embodiments, a user may prescribe the type of image to acquire, and the console may be tasked with deciding on the initial imaging parameters, optionally updating the parameters as the scan progresses to provide the desired type of image based on analyzing the MR data received. Dynamically adjusting imaging parameters based on computational feedback facilitates the development of a "push-button" MRI system, where a user can select a desired image or application, and the MRI system can decide on a set of imaging parameters used to acquire the desired image, which may be dynamically optimized based on MR data obtained during acquisition.

According to some embodiments, a low-field MRI system may include field sensors arranged to obtain local magnetic field measurements in connection with magnetic fields generated by a low-field MRI system and/or magnetic fields in the environment. These magnetic field measurements may be used to dynamically adjust various properties, characteristics and/or parameters of the low-field MRI system to improve the performance of the system. For example, a network of spatially distributed field sensors may be arranged at known locations in space to enable real-time characterization of magnetic fields generated by a low-field MRI system. The network of sensors are capable of measuring local magnetic fields of the low-field MRI system to provide information that facilitates any number of adjustments or modifications to the system, some examples of which are described in further detail below. Any type of sensor that can measure magnetic fields of interest may be utilized. Such sensors can be integrated within one or more laminate panels or may be provided separately, as concepts related to using magnetic field measurements are not limited to the type, number or method of providing the sensors.

According to some embodiments, measurements provided by a network of sensors provides information that facilitates establishment of suitable shimming to provide a $B_0$ field of desired strength and homogeneity. As discussed above, any desired number of shim coils of any geometry and arrangement can be integrated in a laminate panel, either alone or in combination with other magnetic components, such that different combinations of shim coils may be selectively operated and/or operated at desired power levels. As such, when a low-field MRI system is operated in a particular environment, measurements from the network of field sensors may be used to characterize the magnetic field generated by, for example, a $B_0$ magnet and/or gradient coils, to determine what combination of shim coils should be selected for operation and/or at what power levels to operate selected shim coils to affect the magnetic fields such that the low-field MRI system produces a $B_0$ field at the desired strength and homogeneity. This capability facilitates the deployment of generally portable, transportable and/or cartable systems as the $B_0$ field can be calibrated for a given location at which the system is being utilized.

According to some embodiments, measurements from the network of field sensors may be utilized to perform dynamic shimming during operation of the system. For example, the network of sensors may measure magnetic fields generated by a low-field MRI system during operation to provide information that can be used to dynamically adjust (e.g., in real-time, near real-time or otherwise in conjunction with operating the system) one or more shim coils and/or operate a different combination of shim coils (e.g., by operating one or more additional shim coils or ceasing operation of one or more shim coils) so that the magnetic fields generated by the low-field MRI system have or are closer to having desired or expected characteristics (e.g., the resulting $B_0$ field is produced at or closer to desired field strength and homogeneity). Measurements from a network of field sensors may also be utilized to notify an operator that magnetic field quality (e.g., the $B_0$ field, gradient fields, etc.) fails to meet a desired criteria or metric. For example, an operator may be alerted should the $B_0$ field being generated fail to meet certain requirement regarding field strength and/or homogeneity.

According to some embodiments, measurements from a network of sensors may be used to guide and/or correct reconstruction and/or processing of MR data obtained from operating the low-field MRI scanner. In particular, actual spatial-temporal magnetic field patterns obtained by the sensor network may be used as knowledge when reconstructing images from the acquired MR data. As a result, suitable images may be reconstructed even in the presence of field inhomogeneity that would otherwise be unsatisfactory for acquiring data and/or producing images. Accordingly, techniques for using field sensor data to assist in image reconstruction facilitates obtaining improved images in some circumstances and enabling the performance of low-field MRI in environments and/or circumstances where field strength and/or homogeneity is degraded.

According to some embodiments, a network of field sensors may be used to measure and quantify system performance (e.g., eddy currents, system delays, timing, etc.) and/or may be used to facilitate gradient waveform design based on the measured local magnetic fields, etc. It should be appreciated that measurements obtained from a network of field sensors may be utilized in any other manner to facilitate performing low-field MRI, as the aspects are not limited in this respect. In generally portable, transportable or cartable systems, the environment in which the MRI system is deployed may be generally unknown, unshielded and generally uncontrolled. As such, the ability to characterize the magnetic fields generated by a low-field MRI system given a particular environment (magnetic and otherwise) facilitates the ability to deploy such systems in a wide range of environments and circumstances, allowing for the systems to be optimized for a given environment.

Figure 19A:
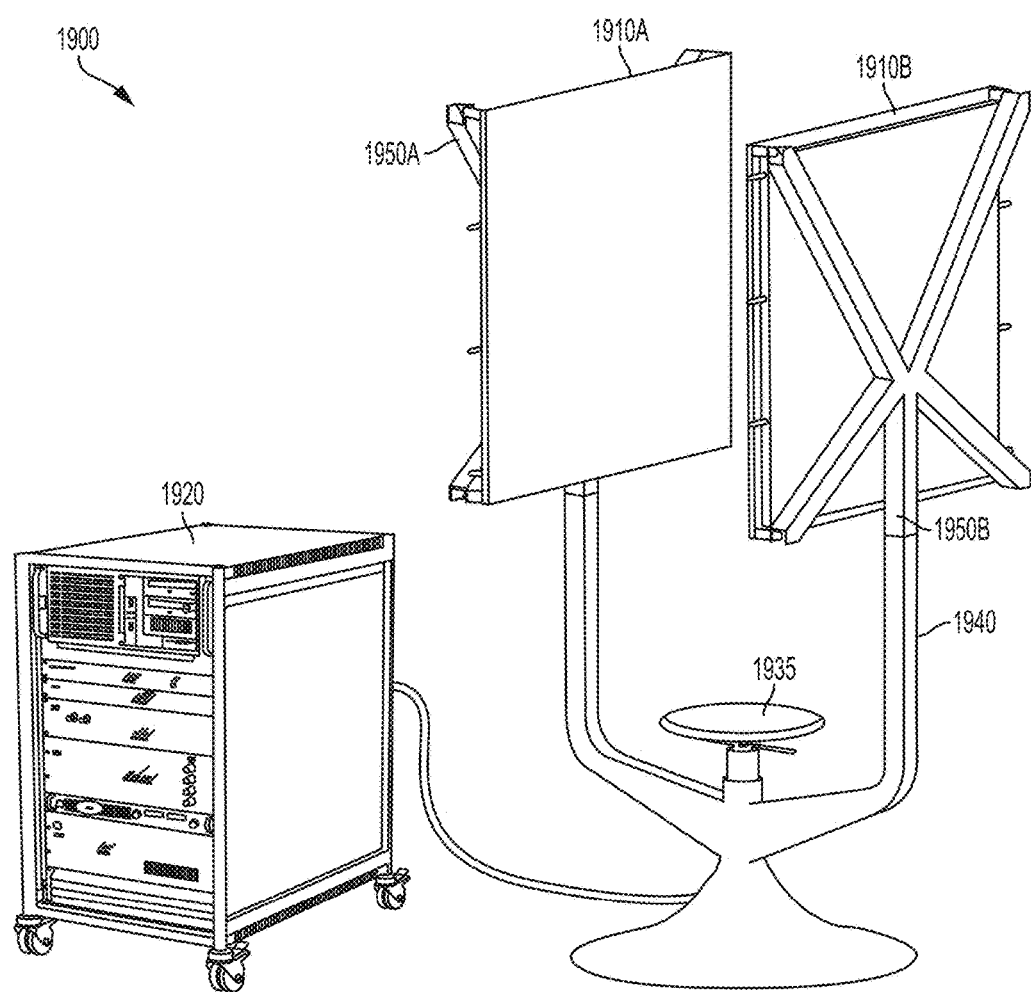
FIGS. 19A and 19B illustrate a seated system configuration of a low-field MRI system using laminate panels, in accordance with some embodiments.

As discussed above, low-field MRI facilitates the design and development of MRI systems that are generally not feasible in the context of high-field MRI, for example, relatively low-cost, reduced footprint and/or generally portable or transportable MRI systems. FIGS. 19-22 illustrate non-limiting examples of system configurations for low-field MRI, in accordance with some embodiments. FIG. 19A illustrates a system 1900 configured such that a seated patient is positioned so that relevant portions of the patient's body are located within the field of view of the $B_0$ magnet. Low-field MRI system 1900 represents an open bi-planar configuration in which a pair of laminate panels 1910A and 1910B are mounted to a generally U-shaped frame 1940 via support structures 1950A and 1950B configured to hold the laminate panels in place.

U-shaped frame 1940 also includes an adjustable seat 1935 to facilitate positioning patients of different stature correctly within the field of view of the laminate panels and/or to position the patient for imaging of desired portions of the patient's body. Additionally or alternatively, the laminate panels may be adjustable to facilitate the proper positioning of the patient relative to the laminate panels. For example, support structures 1950A and 1950B may be raised and lowered into and out of the arms of U-shaped frame 1940. In some embodiments, the laminate panels may be connected to articulated and/or hinged arms that enable the panels to be secured into a more compact position to improve portability of the system. For example, the arms on which the laminate panels are mounted may be folded down during transport, and extended up (as shown) during operation of the MRI system. Furthermore, the base of frame 1940 may include wheels or removable castors (not shown) that allow the structure to be wheeled from one location to another.

Figure 19B:
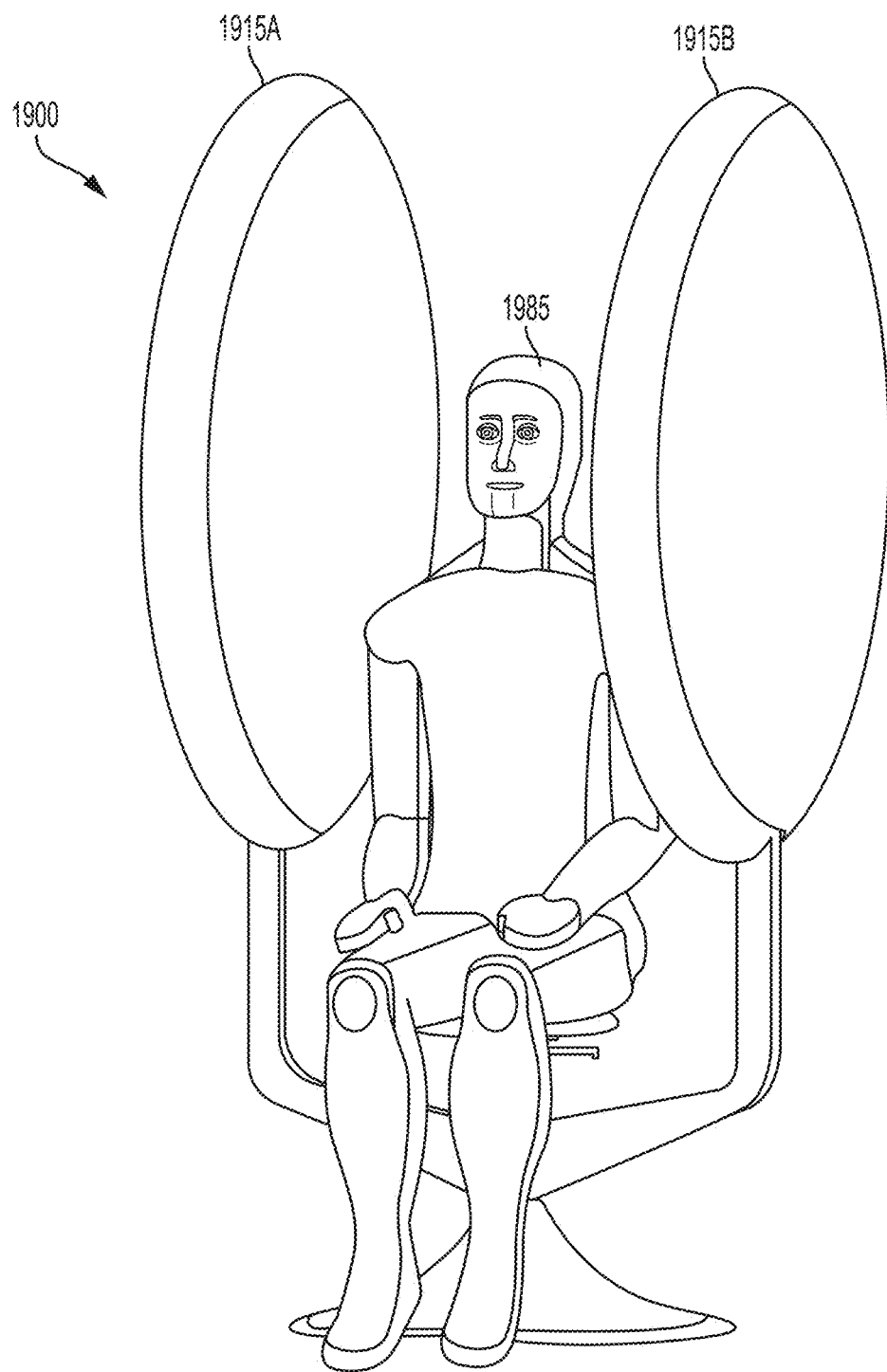

Magnetics components formed on laminate panels 1910A and 1910B may be connected to power electronics 1920 via one or more cables. As shown, power electronics 1910 may be provided on a cart or other transportable structure to facilitate the portability of the low-field MRI system. Separating the power electronics from the magnetics components of the system may reduce the effect of noise generated by the power electronics on the magnetic fields used to image the patient. Connections for the power electronics (and any other needed connections such as for the console, workstation, display, etc.) may be provided at the base of frame 1940 with the appropriate set of the connections wired up through the arms of frame 1940 to the support structures 1950A and 1950B to operate the magnetic components integrated within laminate panels 1910A and 1910B. FIG. 19B illustrates system 1900 showing a patient 1985 seated within the field of view of bi-planar magnets 1915A and 1915B comprising the laminate panels illustrated in FIG. 19A and an outer covering or housing, which may further comprise other components such as internal shielding, electrical connections, power and control electronics, etc, and which may generally provide a measure of environmental protection for the laminate panels.

Figure 20A:
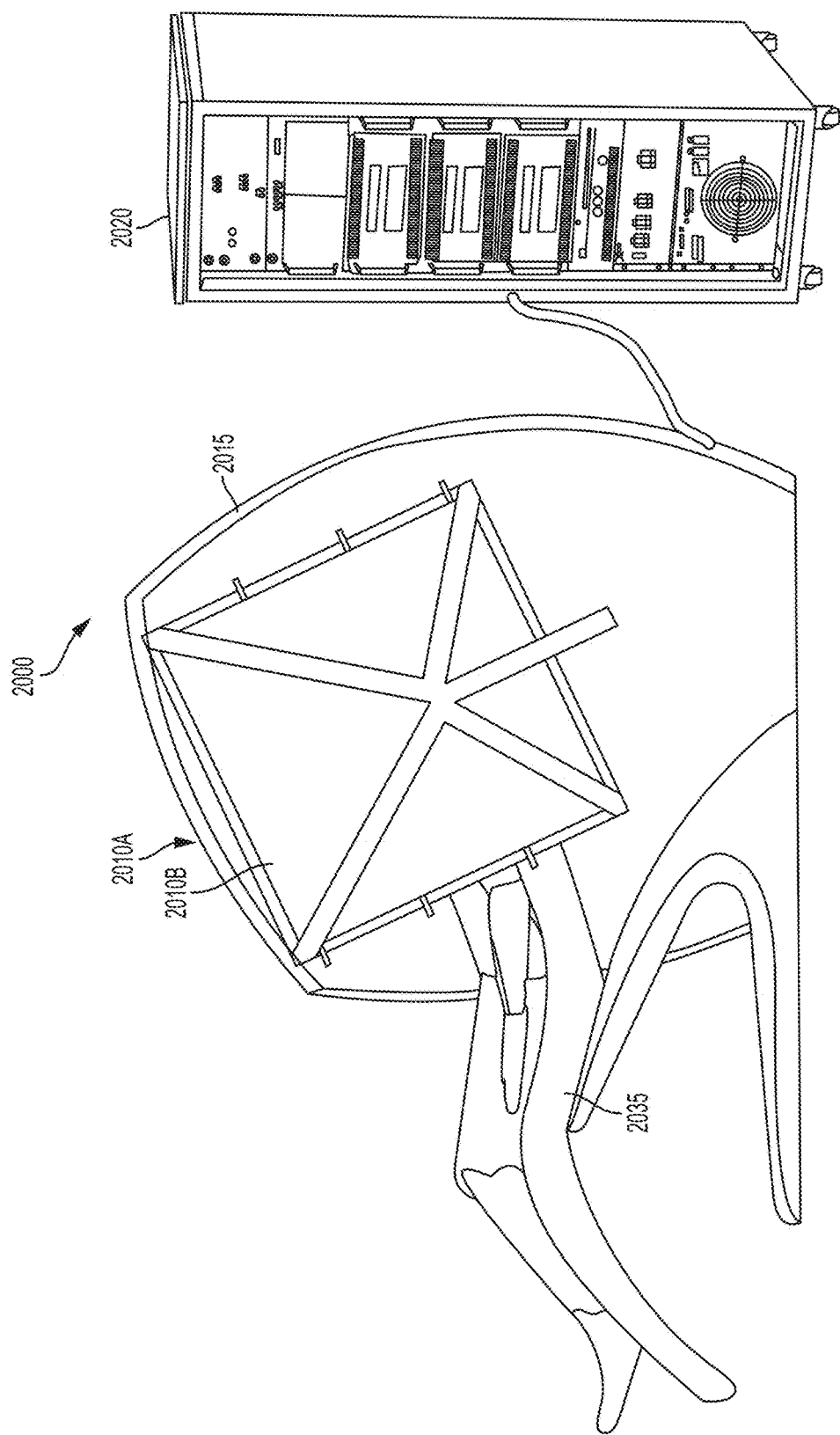
FIGS. 20A-20C illustrate a reclining system configuration of a low-field MRI system using laminate panels, in accordance with some embodiments.
Figure 20B:
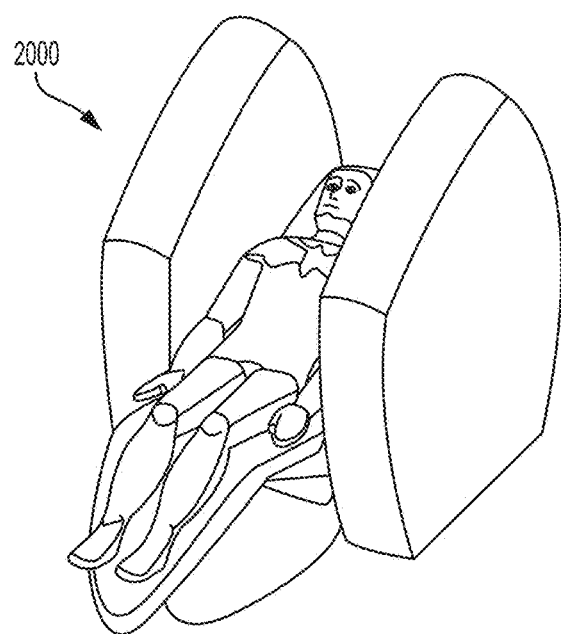
Figure 20C:
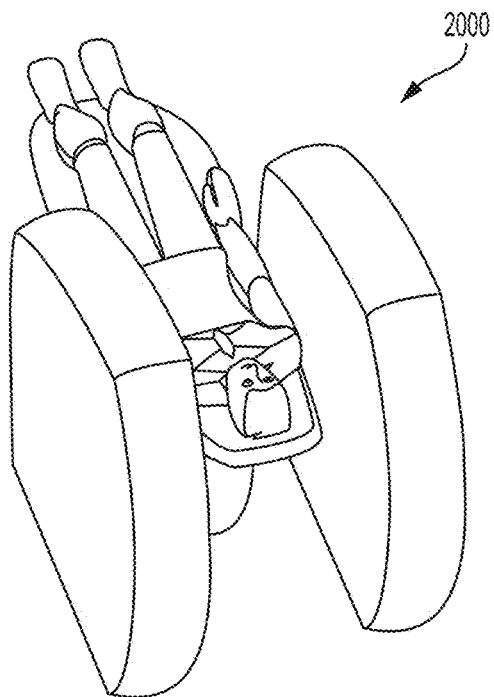

FIG. 20A shows a system 2000 having a reclining configuration in which the magnetic components formed on laminate panels 2010A and 2010B are arranged within an frame comprising a seating portion 2035 adjustably oriented at an angle to accommodate a patient being placed between the laminate panels in a reclined position. The reclining portion of the system may be adjustable to facilitate a desired positioning of the patient between the laminate panels so that the desired portion of the patient is located within the field of view of the magnet. Additionally or alternatively, the laminate panels may be adjustable within enclosure 2015 to provide additional flexibility in positioning the magnetics relative to the patient. Magnetic components formed on laminate panels 2010A and 2010B may be connected via one or more suitable cables to power electronics 2020, which may be mounted on a rack or housed with another suitable transportable structure to facilitate the portability of the MRI system. FIGS. 20B and 20C illustrate reclining MRI system 2000 from different perspectives as well as different reclining positions for the patient.

Figure 21A:
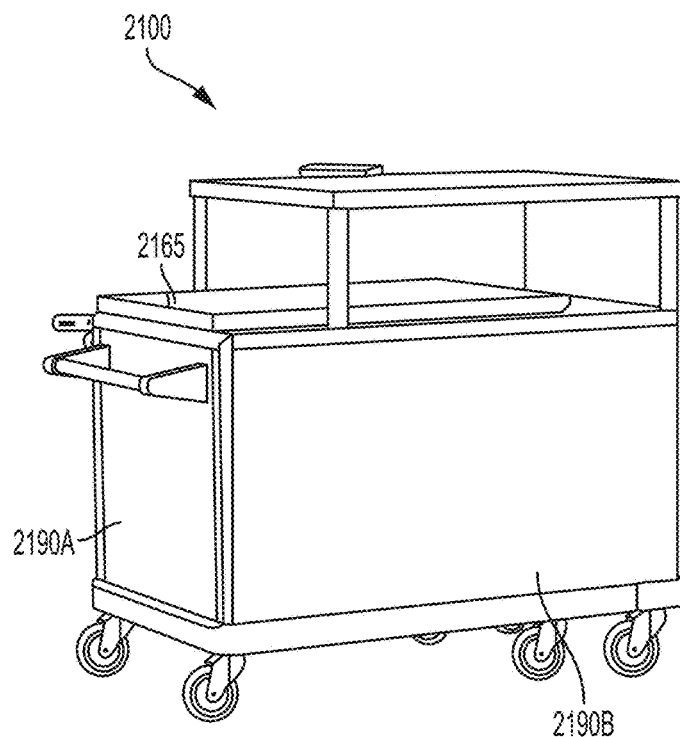
FIGS. 21A-21G illustrates portable transformable system configurations of a low-field MRI system using laminate panels, in accordance with some embodiments.
Figure 21B:
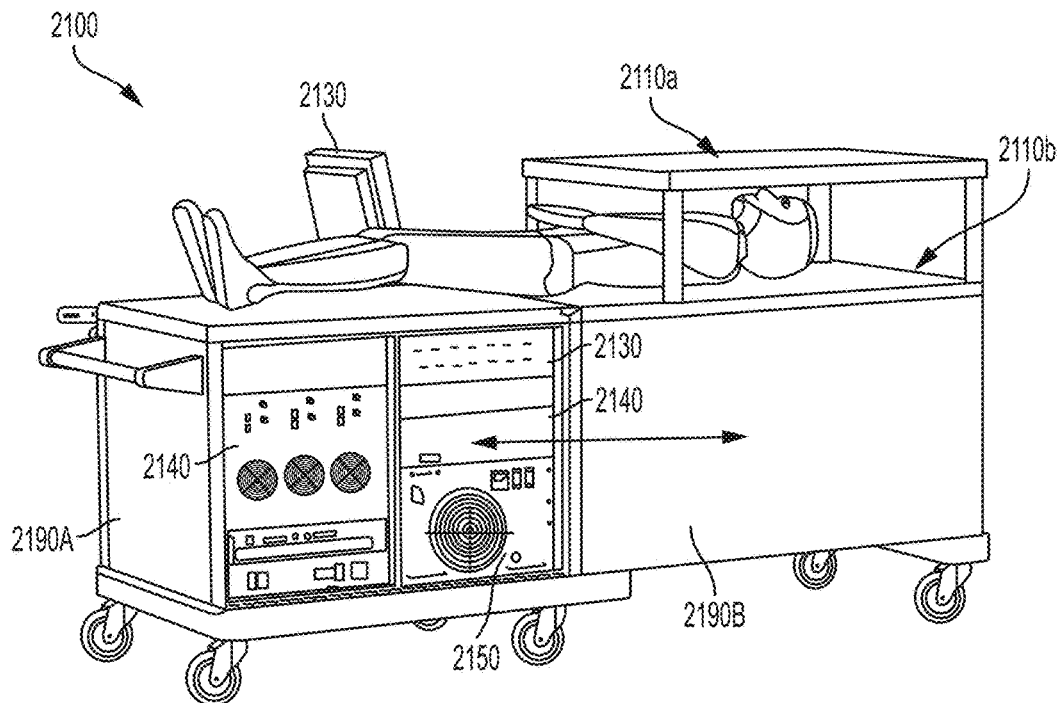

FIGS. 21A and 21B illustrate a portable or cartable low-field MRI system 2100, in accordance with some embodiments. System 2100 may include magnetic and power components, and potentially other components (e.g., thermal management, console, etc.), arranged together on a single generally transportable and transformable structure. System 2100 may be designed to have at least two configurations; a configuration adapted for transport and storage, and a configuration adapted for operation. FIG. 21A shows system 2100 when secured for transport and/or storage and FIG. 21B shows system 2100 when transformed for operation. System 2100 comprises a portion 2190A that can be slid into and retracted from a portion 2190B when transforming the system from its transport configuration to its operation configuration, as indicated by the arrows shown in FIG. 21B. Portion 2190A may house power electronics 2140, console 2130 (which may comprise an interface device such as the touch panel display illustrated in FIGS. 21A and 21B) and thermal management 2150. Portion 2190A may also include other components used to operate system 2100 as needed.

Portion 2190B comprises magnetic components of low-field MRI system 2100, including laminate panels 2110A and 2110B on which magnetic components are integrated in any of the combinations discussed herein. When transformed to the configuration adapted for operating the system to perform MRI (as shown in FIG. 21B), supporting surfaces of portions 2190A and 2190B provide a surface on which the patient can lie. A slideable surface 2165 may be provided to facilitate sliding the patient into position so that a portion of the patient to be imaged is within the field of view of the laminate panels providing corresponding low-field MRI magnets. System 2100 provides for a portable compact configuration of a low-field MRI system that facilitates access to MRI imaging in circumstances where it conventionally is not available (e.g., in an emergency room).

Figure 21C:
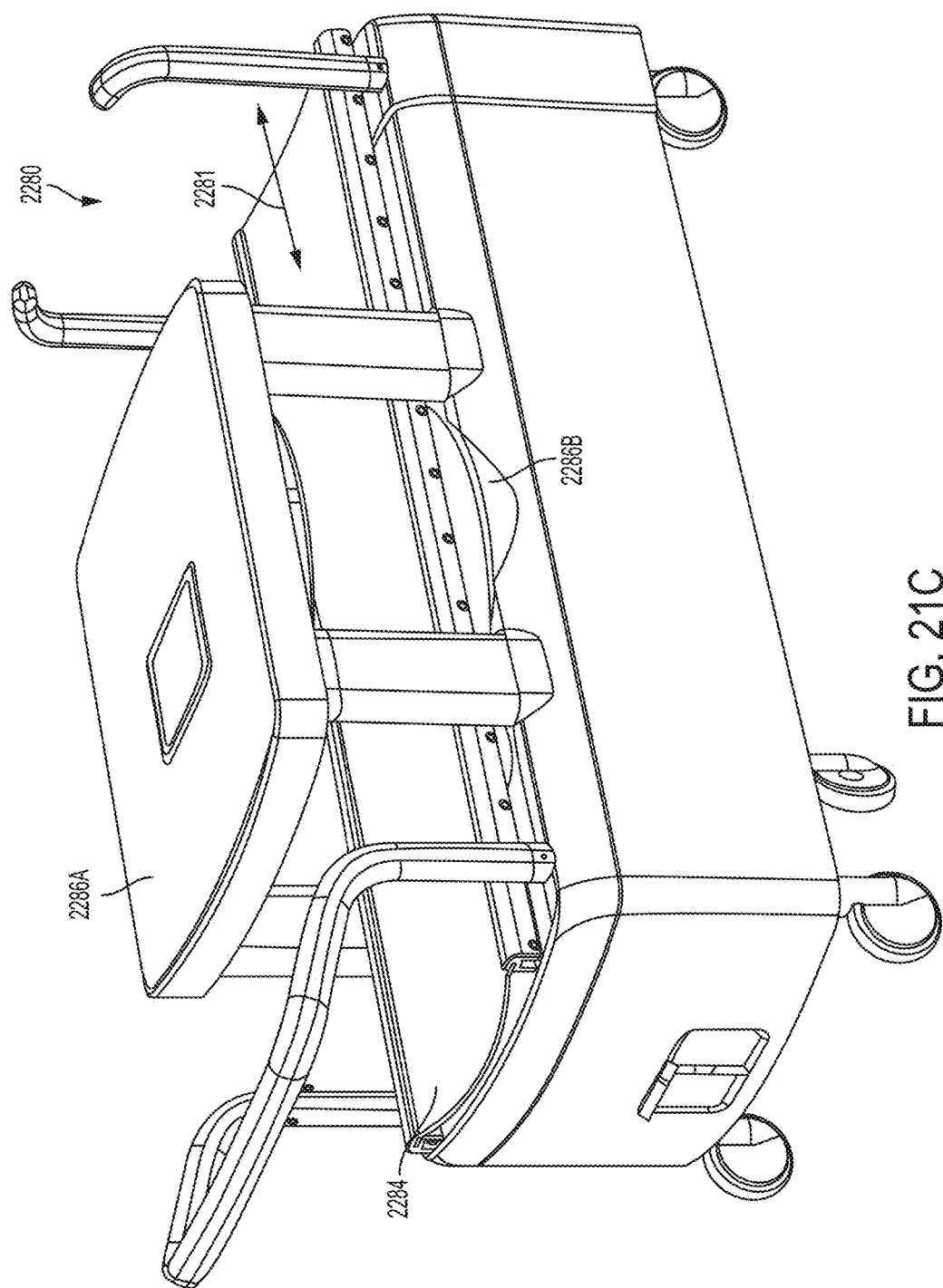

FIG. 21C illustrates an example of a convertible low field MRI system 2280 that utilizes a bi-planar hybrid magnet, in accordance with some embodiments. In FIG. 21C, the convertible system is in a collapsed configuration convenient for transporting the system or storing the system when it is not in use. Convertible system 2280 includes a slideable bed 2284 configured to support a human patient and to allow the patient to be slid into and out from the imaging region between housings 2286A and 2286B in the direction of arrows 2281. Housings 2286A and 2286B house magnetic components for the convertible system 2280, as discussed in further detail below in connection with the several views of the convertible system 2280. According to some embodiments, the magnetic components may be produced, manufactured and arranged using exclusively laminate techniques, exclusively traditional techniques, or using a combination of both (e.g., using hybrid techniques described herein).

Figure 21D:
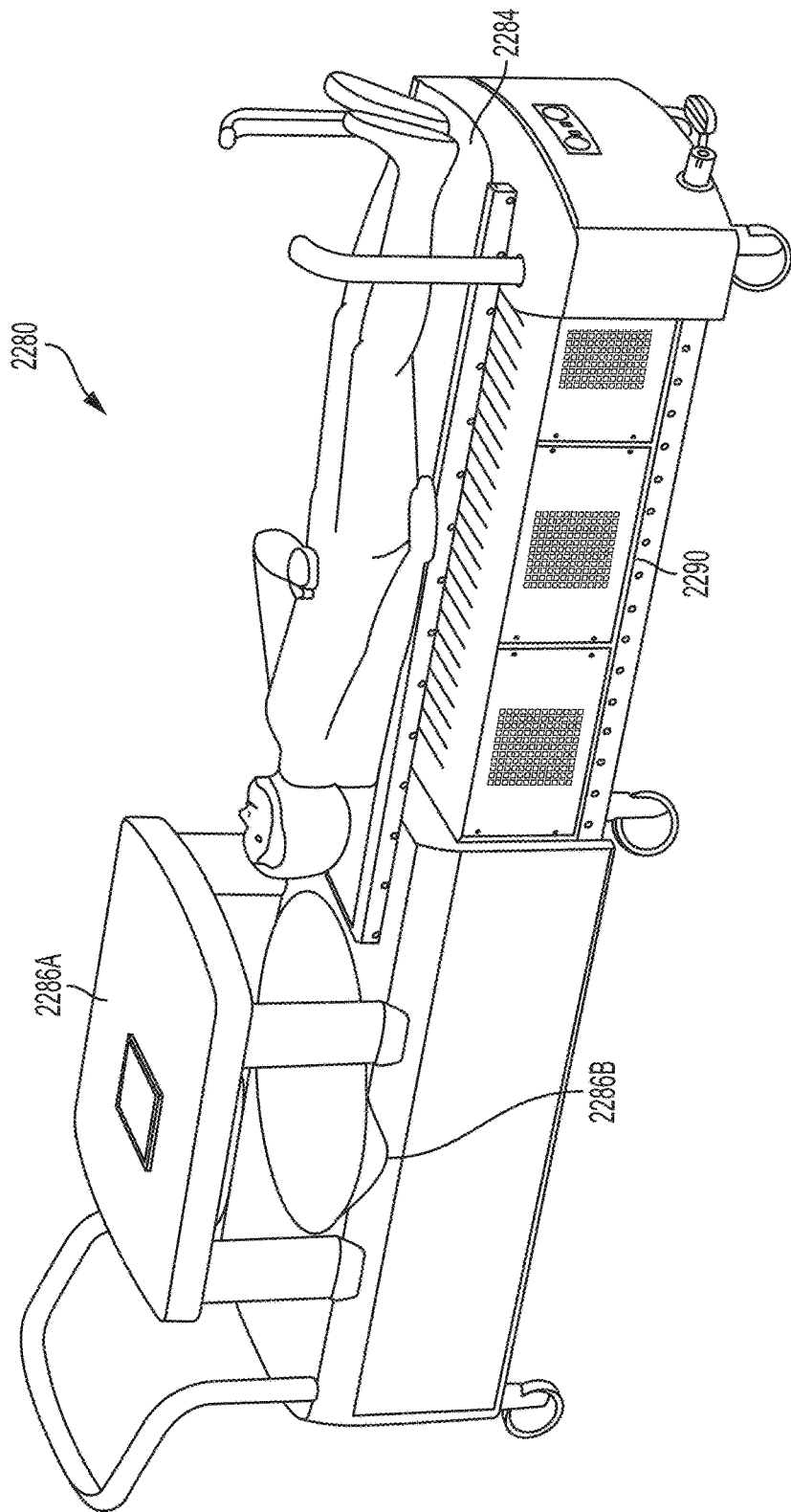
Figure 21E:
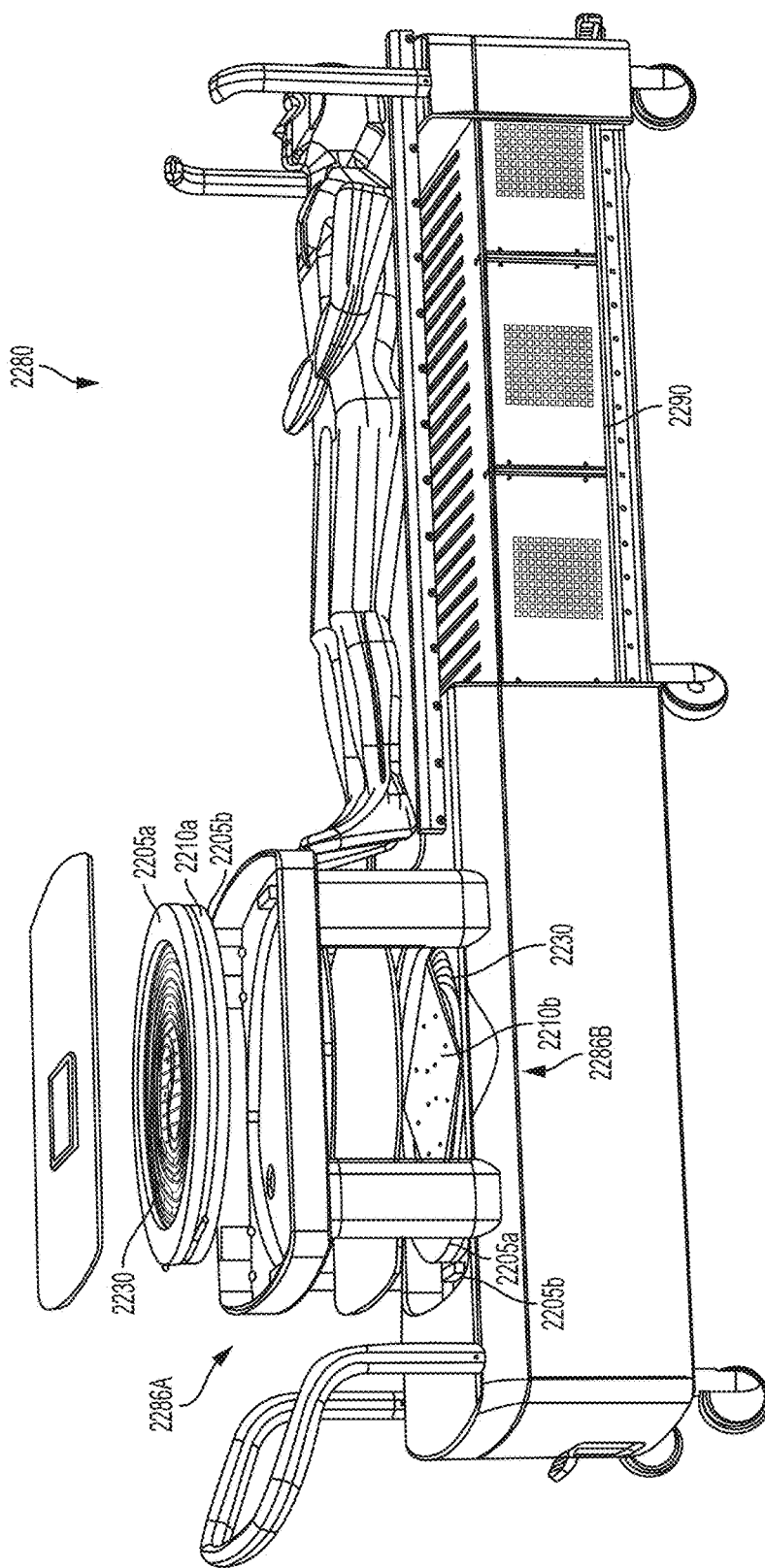

FIG. 21D illustrates convertible system 2280 extended and with a patient positioned on slide-able bed 2284 prior to being inserted between housings 2286A and 2286B to be imaged. FIG. 21E illustrates an exploded view of housings 2286A and 2286B. According to some embodiments, each of housings 2286A and 2286B house a hybrid magnet coupled to a thermal management component to draw heat away from the magnetic components. Specifically, each of housings 2286A and 2286B on opposing sides of the imaging region include therein B0 coils 2205a and 2205b, laminate panel 2210 (2210b of which is visible within housing 2286B in the face-up arrangement) and thermal management component 2230 provided between the B0 coils. The magnetic components housed in 2286A and 2286B may be substantially identical to form a symmetric bi-planar hybrid magnet, or the magnetic components house in 2286A and 2286B may be different to form an asymmetric bi-planar hybrid magnet, as the aspects are not limited for use with any particular design or construction of a hybrid magnet.

Figure 21F:
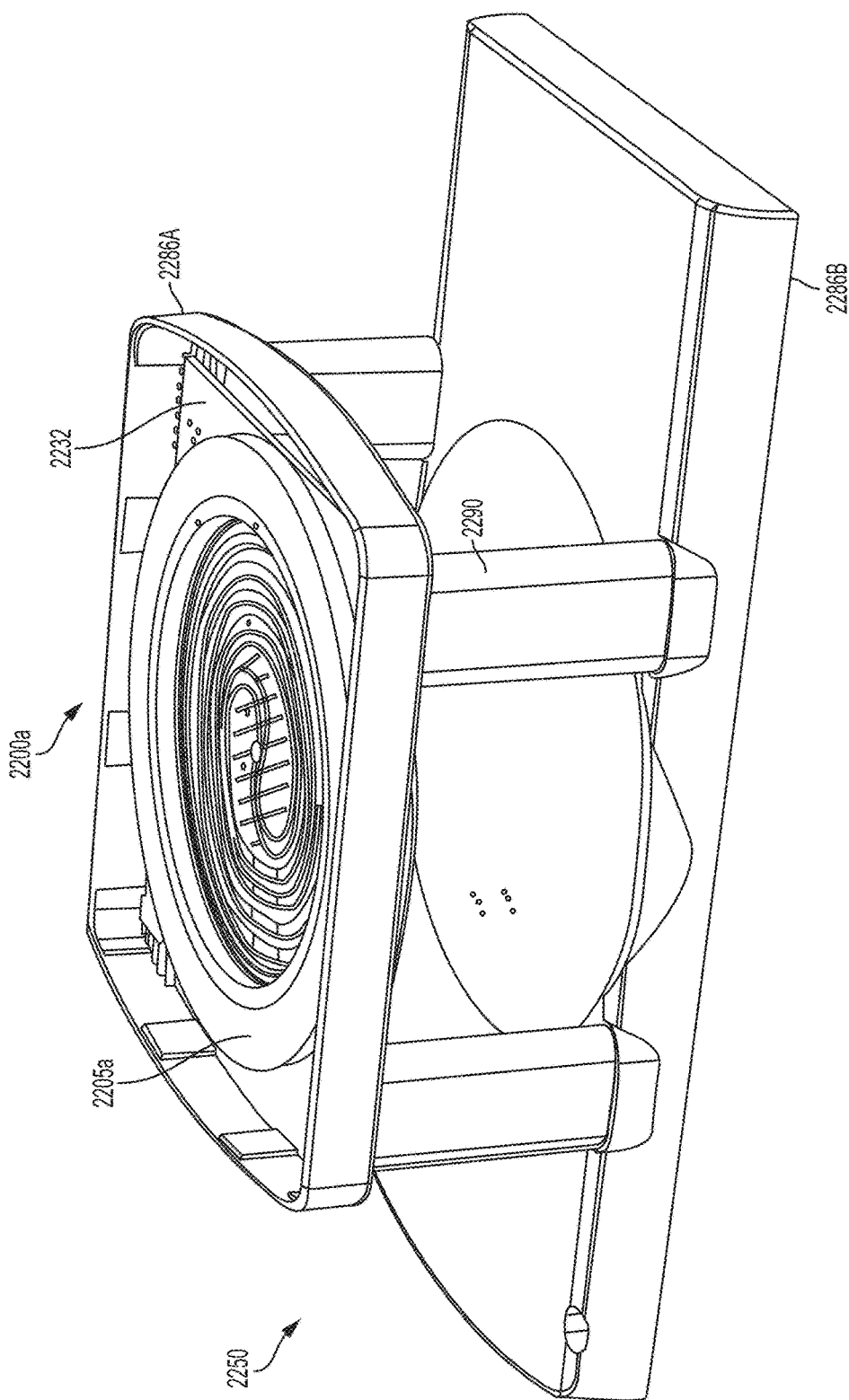

FIG. 21F illustrates a close-up view of a portion of a convertible low-field MRI system and, more particularly, a view showing a magnet assembly 2250 for housing and securing a bi-planar magnet for a low-field MRI system, in accordance with some embodiments. The magnet assembly 2250 comprises an upper housing 2286A and a lower housing 2268B to position and align the upper and lower magnets forming a bi-planar hybrid magnet. Housing 2286A and 2286B are connected using a plurality of pillars or posts 2290 that provide separation between magnetics components housed in the upper and lower housings to provide an imaging region into which a subject may be inserted. Upper magnet 2200a housed in upper housing 2286A comprises a pair of B0 coils and a laminate panel comprising a number of magnetic components, such as one or more gradient coils and/or one or more B0 correction coils (only upper B0 coil 2205a is visible). A thermal management component 2230 is provided in thermal contact with the magnetic components. Thermal management component 2230 includes both a cooling portion adapted to draw heat away from the magnetic components to which it is coupled, and mounting portions 2232, which extend outwardly from the magnetics components to enable the magnet to be secured to the upper housing 2286A using bolts or any other suitable type of fastener.

Figure 21G:
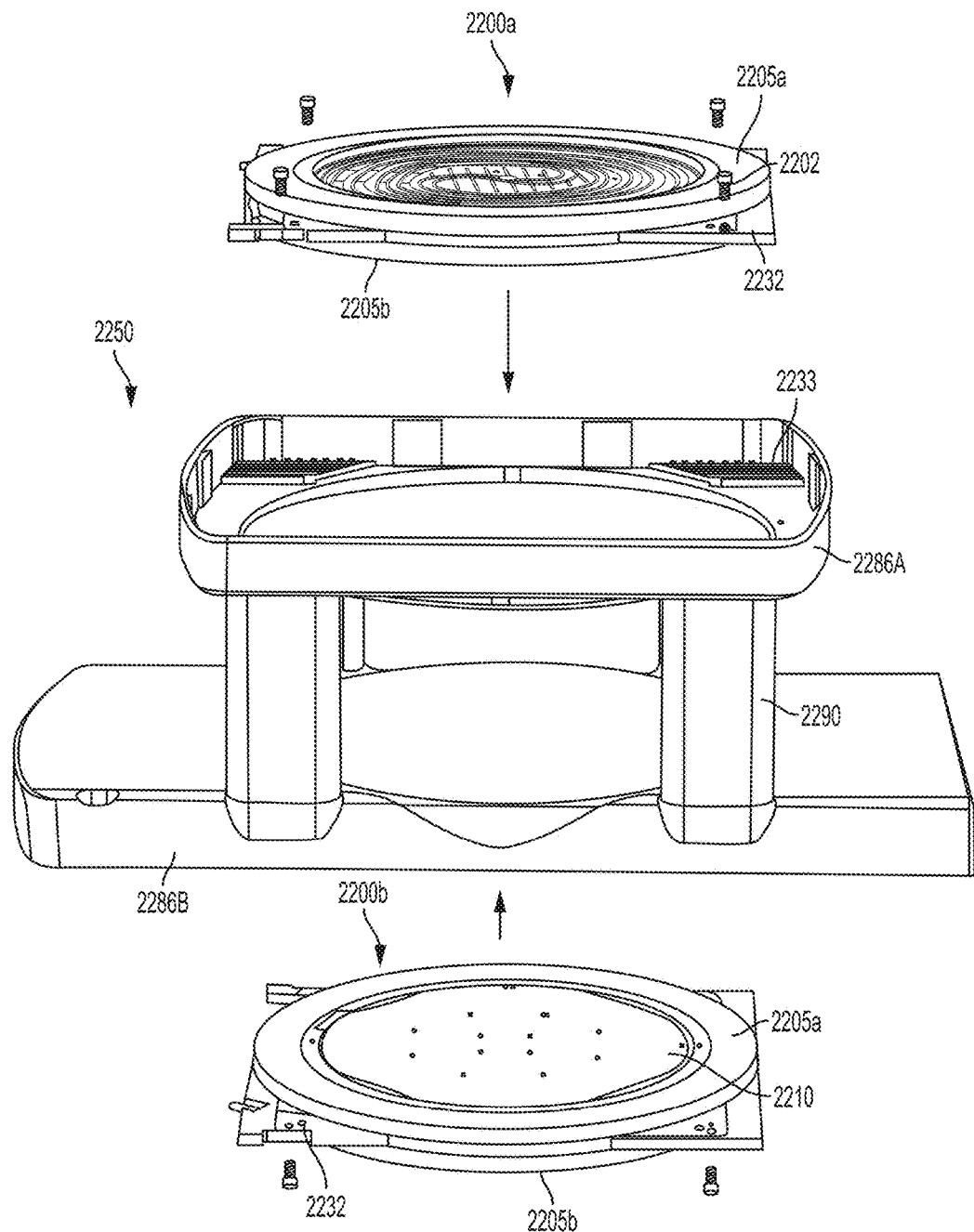

FIG. 21G illustrates an exploded view of the magnet assembly 2250 shown in FIG. 21F. In FIG. 21G, both upper magnet 2200a and lower magnet 2200b are illustrated with arrows indicating the direction in which the magnets are mounted into their respect housings 2286A and 2286B. Upper magnet 2200a and lower magnet 2200b may be constructed using any of the techniques described herein, or using other suitable techniques, and may form a symmetric or asymmetric bi-planar magnet. In the embodiment illustrated in FIG. 21G, each magnet includes a pair of wound B0 coils 2205a and 2205b and a laminate panel 2210 having at least one gradient coil and at least one B0 coil (e.g., a correction or shim coil) patterned thereon. Mounting portions 2232 shown on magnets 2200a and 2200b are arranged and configured to be secured to mounting portions 2233 of the respective housing (see housing 2286A where mounting portions 2233 are visible) with bolts 2202 when the magnetic assembly is assembled. It should be appreciated that the low-field MRI systems illustrated in FIGS. 21A-21G are merely examples of systems in which the techniques described herein may be utilized, as laminate-based and/or hybrid techniques may be used to provide magnetic components for any type of system, as the aspects are not limited in this respect.

Figure 22C:
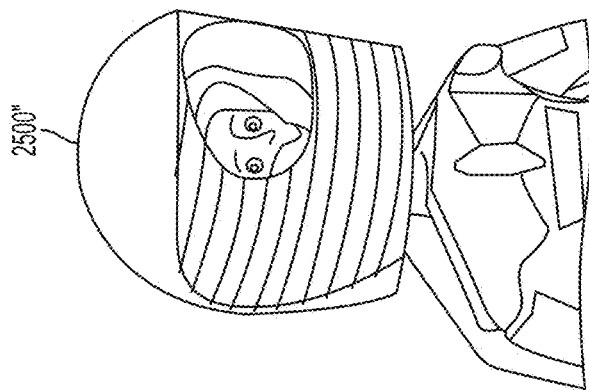
FIGS. 22A-22C illustrate exemplary helmets incorporating low field MRI magnetic components, in accordance with some embodiments.
Figure 22B:
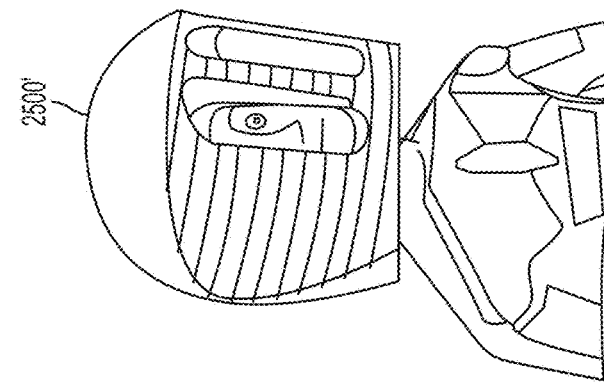
Figure 22A:
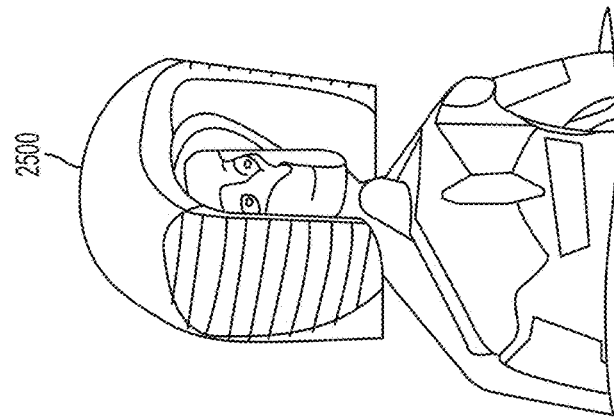

FIGS. 22A-C illustrate helmets for low-field MRI configured to perform brain scans. The helmets may include a B0 magnet in a solenoid geometry about the surface of the helmet to produce a B0 field in an axially direction through the head (i.e., from the top of the head to the bottom or vice versa.) The helmets may further have incorporated therein a gradient system having one or more gradient coils and an Rx/Tx coil array from excitation and detection. In the embodiment illustrated in FIG. 22A, helmet 2500 has magnetic components arranged for generally full clearance of the patient's face and is therefore the most open of the three configurations. In the embodiment illustrated in FIG. 22B, helmet 2500' includes one or more magnetic components arranged so as to provide partial blockage of the face (e.g., multi-channel or single-channel RF coil elements and/or B0 windings may need to be provided in this area to meet particular design requirements). In the embodiment illustrated in FIG. 22C, helmet 2500" comprises magnetic components arranged so that openings remain around the patent's eyes to minimize claustrophobic effects, but one or more magnetic components are housed within helmet 2500" in the front portion over the patient's mouth area.

According to some embodiments, the magnetic components of the helmets illustrated in FIGS. 22A-22C are fabricated using laminate techniques. For example, the magnetic components needed to perform MRI (e.g., B0 coils, gradient coils, Tx/Rx coils, etc.) may be provided via a series of laminate panels connected together and arranged in a geometry about the head within the helmet. According to some embodiments, a helmet is constructed at least in part using techniques for providing magnetic components across a plurality of laminate panels (e.g., as described in connection with FIG. 12) to form a three-dimensional geometry about the head. The plurality of laminate panels may have patterned thereon B0, gradient and Tx/Rx coils to form an integrated MRI helmet for head imaging. It should be appreciated that techniques for fabricating magnetic components over a plurality of connected laminate panels may be used to form other geometries to provide an integrated MRI system for imaging other portions of the anatomy, as the techniques described herein are not limited in this respect.

Having thus described several aspects and embodiments of the technology set forth in the disclosure, it is to be appreciated that various alterations, modifications, and improvements will readily occur to those skilled in the art. Such alterations, modifications, and improvements are intended to be within the spirit and scope of the technology described herein. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein. Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The above-described embodiments can be implemented in any of numerous ways. One or more aspects and embodiments of the present disclosure involving the performance of processes or methods may utilize program instructions executable by a device (e.g., a computer, a processor, or other device) to perform, or control performance of, the processes or methods. In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above. The computer readable medium or media can be transportable, such that the program or programs stored thereon can be loaded onto one or more different computers or other processors to implement various ones of the aspects described above. In some embodiments, computer readable media may be non-transitory media.

The terms "program" or "software" are used herein in a generic sense to refer to any type of computer code or set of computer-executable instructions that can be employed to program a computer or other processor to implement various aspects as described above. Additionally, it should be appreciated that according to one aspect, one or more computer programs that when executed perform methods of the present disclosure need not reside on a single computer or processor, but may be distributed in a modular fashion among a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code can be executed on any suitable processor or collection of processors, whether provided in a single computer or distributed among multiple computers.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a Personal Digital Assistant (PDA), a smartphone or any other suitable portable or fixed electronic device.

Also, a computer may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

What is claimed is:

1. A component for use in magnetic resonance imaging of an object, the component comprising:
    a $B_0$ magnet configured to produce a static $B_0$ magnetic field to align atomic spins of the object in a direction of the $B_0$ magnetic field for performing magnetic resonance imaging, the $B_0$ magnet comprising at least one laminate panel comprising at least one laminate layer including at least one non-conductive layer and at least one conductive layer patterned to form at least one $B_0$ coil configured to produce, when operated, substantially all of the static $B_0$ magnetic field.

2. The component of claim 1, wherein the at least one laminate layer comprises a plurality of laminate layers having formed thereon the at least one $B_0$ coil configured to generate the static $B_0$ magnetic field.

3. The component of claim 2, wherein each of the plurality of laminate layers has at least one $B_0$ coil formed thereon.

4. The component of claim 3, further comprising one or more vias electrically connecting the at least one $B_0$ coil formed on each of the plurality of layers.

5. The component of claim 4, wherein the one or more vias are arranged to reduce parasitic effects on the static $B_0$ magnetic field.

6. The component of claim 3, wherein at least one $B_0$ coil is patterned using a different geometry than at least one other $B_0$ coil.

7. The component of claim 3, wherein each of the at least one $B_0$ coils comprises a plurality of turns of a conductor.

8. The component of claim 7, wherein at least one $B_0$ coil, when operated, conducts current in a direction opposite to at least one other $B_0$ coil.

9. The component of claim 7, wherein at least one of the plurality of laminate layers has a plurality of $B_0$ coils formed thereon.

10. The component of claim 9, wherein at least one of the plurality of $B_0$ coils, when operated, conducts current in a direction opposite to at least one other of the plurality of $B_0$ coils patterned on a respective layer of the plurality of laminate layers.

11. The component of claim 7, wherein the plurality of turns of the conductor of at least one $B_0$ coil are patterned in a circular geometry.

12. The component of claim 7, wherein the plurality of turns of the conductor of at least one $B_0$ coil is patterned in a spiral geometry.

13. The component of claim 1, wherein at least one laminate layer has patterned thereon at least one gradient coil configured to, when operated, generate or contribute to a magnetic field to provide spatial encoding of emitted magnetic resonance (MR) signals.

14. The component of claim 13, wherein the at least one gradient coil comprises at least one x-gradient coil, at least one y-gradient coil, and at least one z-gradient coil to provide spatial encoding in x, y, and z directions, respectively.

15. The component of claim 14, wherein:
    the x-gradient coil is formed, via chemical etching, on a plurality of layers of the at least one laminate panel;
    the y-gradient coil is formed, via chemical etching, on a plurality of layers of the at least one laminate panel; and
    the z-gradient coil is formed, via chemical etching, on a plurality of layers of the at least one laminate panel.

16. The component of claim 13, wherein at least one gradient coil is patterned, at least in part, on at least one laminate layer on which at least one $B_0$ coil is patterned.

17. The component of claim 13, wherein at least one gradient coil is patterned, at least in part, on a laminate layer on which no $B_0$ coil is patterned.

18. The component of claim 1, wherein at least one laminate layer has patterned thereon one or more shim coils configured to, when operated, contribute to the static $B_0$ magnetic field to affect the homogeneity of the static $B_0$ magnetic field.

19. The component of claim 18, wherein at least one $B_0$ coil provides at least one shim coil that can be operated independently of at least one other $B_0$ coil.

20. The component of claim 1, where at least one laminate layer comprises electromagnetic shielding formed thereon.

21. The component of claim 20, wherein the electromagnetic shielding comprises a conductive mesh formed on at least one laminate layer.

22. The component of claim 1, wherein at least one conductive layer comprises copper.

23. The component of claim 22, wherein at least one conductive layer comprises heavy copper.

24. The component of claim 22, wherein at least one conductive layer comprises extreme copper.

25. The component of claim 1, wherein at least one conductive layer comprises aluminum.

26. The component of claim 1, wherein the at least one laminate panel comprises a first laminate panel and a second laminate panel arranged in a bi-planar arrangement.

27. The component of claim 26, wherein when operated, the component produces the static $B_0$ magnetic field at a field strength of less than or equal to approximately 0.2 T and greater than or equal to approximately 0.1 T.

28. The component of claim 27, wherein when operated, the component produces the static $B_0$ magnetic field at a field strength of less than or equal to approximately 0.1 T and greater than or equal to approximately 0.05 T.

29. The component of claim 28, wherein when operated, the component produces the static $B_0$ magnetic field at a field strength of less than or equal to approximately 0.05 T and greater than or equal to approximately 20 mT.

30. The component of claim 29, wherein when operated, the component produces the static $B_0$ magnetic field at a field strength of less than or equal to approximately mT and greater than or equal to approximately 10 mT.

31. The component of claim 26, wherein when operated, the component produces the static $B_0$ magnetic field at a field strength of approximately 20 mT or less.

32. The component of claim 31, wherein when operated, the component produces the static $B_0$ magnetic field at a field strength of approximately 10 mT or less.

33. The component of claim 26, wherein when operated, the component produces the static $B_0$ magnetic field at a field strength of less than or equal to approximately mT and greater than or equal to approximately 5 mT.

34. The component of claim 26, wherein the first laminate panel and the second laminate panel each have dimensions of approximately 8"×8" or more.

35. The component of claim 34, wherein the first laminate panel and the second laminate panel each have dimensions of approximately 16"×16" or more.

36. The component of claim 35, wherein the first laminate panel and the second laminate panel each have dimensions of approximately 22"×22" or more.

37. The component of claim 1, wherein the at least one $B_0$ coil is configured to produce, when operated, the static $B_0$ magnetic field having a field strength of greater than or equal to approximately 5 mT.

38. The component of claim 1, wherein the at least one $B_0$ coil is formed on at least five separate laminate layers of the at least one laminate panel.

39. The component of claim 1, wherein the at least one $B_0$ coil is formed on at least ten separate laminate layers of the at least one laminate panel.

40. The component of claim 1, wherein the at least one $B_0$ coil is formed on at least twenty separate laminate layers of the at least one laminate panel.

* * * * *